United States Patent
Hayashi et al.

(10) Patent No.: US 12,512,377 B2
(45) Date of Patent: Dec. 30, 2025

(54) ELECTRONIC MODULE

(71) Applicant: Murata Manufacturing Co., Ltd., Nagaokakyo (JP)

(72) Inventors: Shota Hayashi, Nagaokakyo (JP); Nobuaki Ogawa, Nagaokakyo (JP); Yuki Asano, Nagaokakyo (JP); Akihiro Muranaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 356 days.

(21) Appl. No.: 18/351,733

(22) Filed: Jul. 13, 2023

(65) Prior Publication Data
US 2023/0360983 A1 Nov. 9, 2023

Related U.S. Application Data

(63) Continuation of application No. PCT/JP2021/048344, filed on Dec. 24, 2021.

(30) Foreign Application Priority Data

Jan. 15, 2021 (JP) .................... 2021-005115

(51) Int. Cl.
*H01L 23/13* (2006.01)
*H01L 25/065* (2023.01)

(52) U.S. Cl.
CPC .......... *H01L 23/13* (2013.01); *H01L 25/0655* (2013.01); *H01L 2223/66* (2013.01)

(58) Field of Classification Search
CPC . H01L 23/13; H01L 25/0655; H01L 2223/66; H01L 23/552

USPC ......................................................... 257/724
See application file for complete search history.

(56) References Cited

U.S. PATENT DOCUMENTS

2006/0258050 A1* 11/2006 Fujiwara ................. H01L 23/29
257/E23.117
2007/0246825 A1 10/2007 Oh et al.
2022/0007499 A1 1/2022 Okamoto et al.

FOREIGN PATENT DOCUMENTS

| JP | S58-166095 U | 11/1983 |
| JP | S58-180696 U | 12/1983 |
| JP | 2004-253505 A | 9/2004 |
| JP | 2007-294965 A | 11/2007 |

(Continued)

OTHER PUBLICATIONS

International Search Report for PCT/JP2021/048344 dated Mar. 8, 2022.

*Primary Examiner* — Quoc D Hoang
(74) *Attorney, Agent, or Firm* — McDonald Hopkins LLC

(57) ABSTRACT

In a module, a metal member includes a right support portion, the right support portion has a right support foremost portion located at a foremost in the right support portion and located in front of the plate-shaped portion, the right support portion bends in a forward direction from a right boundary when the right support portion has the right support foremost portion, the right support portion bends in a backward direction and a right direction from the right support foremost portion when the right support portion has the right support foremost portion, and the right support portion is provided with a first lower notch extending in an (Continued)

upward direction from a lower side and overlapping the right support foremost portion when viewed in the up-down direction.

11 Claims, 34 Drawing Sheets

(56) References Cited

FOREIGN PATENT DOCUMENTS

WO 2020/202841 A1 10/2020

\* cited by examiner

ELECTRONIC MODULE

CROSS REFERENCE TO RELATED APPLICATION

This is a continuation of International Application No. PCT/JP2021/048344 filed on Dec. 24, 2021 which claims priority from Japanese Patent Application No. 2021-005115 filed on Jan. 15, 2021. The contents of these applications are incorporated herein by reference in their entireties.

BACKGROUND OF THE DISCLOSURE

Field of the Disclosure

The present disclosure relates to a module including a substrate on which an electronic component is mounted.

Description of the Related Art

As a disclosure related to the module according to the related art, for example, a high frequency module described in Patent Literature 1 is known. The high frequency module includes a substrate, a surface mount element, a metal wall, a resin molding portion, and a metal thin film. The surface mount element is mounted on the upper surface of the substrate. The metal wall extends upward from the upper surface of the substrate. The resin molding portion seals the metal wall and the surface mount element. The metal thin film covers the upper surface of the resin molding portion. The metal wall is provided so as to be located between a first surface mount element and a second surface mount element. In such a module described in Patent Literature 1, electromagnetic interference between some of the first surface mount elements and some of the second surface mount elements is suppressed (blocked) by the metal wall.

Patent Literature 1

Japanese Patent Unexamined Publication No. 2007-294965 bulletin

BRIEF SUMMARY OF THE DISCLOSURE

Meanwhile, in the high frequency module described in Patent Literature 1, a module having a metal wall with high self-standing ability is desired.

It is a possible benefit of the present disclosure to provide a module including a metal wall having high self-standing ability.

A module of the present disclosure includes: a substrate having an upper main surface and a lower main surface arranged in an up-down direction; a metal member including a plate-shaped portion provided on the upper main surface of the substrate, the plate-shaped portion having a front main surface and a back main surface arranged in a front-back direction when viewed in the up-down direction; a first electronic component mounted on the upper main surface of the substrate and disposed in front of the metal member; a second electronic component mounted on the upper main surface of the substrate and disposed behind the metal member; and a sealing resin layer provided on the upper main surface of the substrate and covering the first electronic component, the second electronic component, and the metal member. The metal member includes a right support portion. A boundary between the plate-shaped portion and the right support portion is defined as a right boundary. The right boundary is located at a right part of the metal member. The right support portion includes a right support foremost portion located at a forefront of the right support portion and located in front of the plate-shaped portion, or a right support rearmost portion located at a rearmost of the right support portion and located behind the plate-shaped portion. When the right support portion has the right support foremost portion, the right support portion bends in a forward direction from the right boundary. When the right support portion has the right support foremost portion, the right support portion bends in a backward direction and a right direction from the right support foremost portion. When the right support portion has the right support rearmost portion, the right support portion bends in a backward direction from the right boundary. When the right support portion has the right support rearmost portion, the right support portion bends in a forward direction and a right direction from the right support rearmost portion. When viewed in the up-down direction, a line connecting a lower end of the right support portion in a left-right direction is defined as a lower side. The right support portion is provided with a first lower notch extending in an upward direction from the lower side, the first lower notch overlapping the right support foremost portion or the right support rearmost portion when viewed in the up-down direction.

According to the present disclosure, it is possible to provide a module including a metal member having high self-standing ability.

DETAILED DESCRIPTION OF THE DISCLOSURE

Embodiments

[Structure of Module 10]

Figure 1:
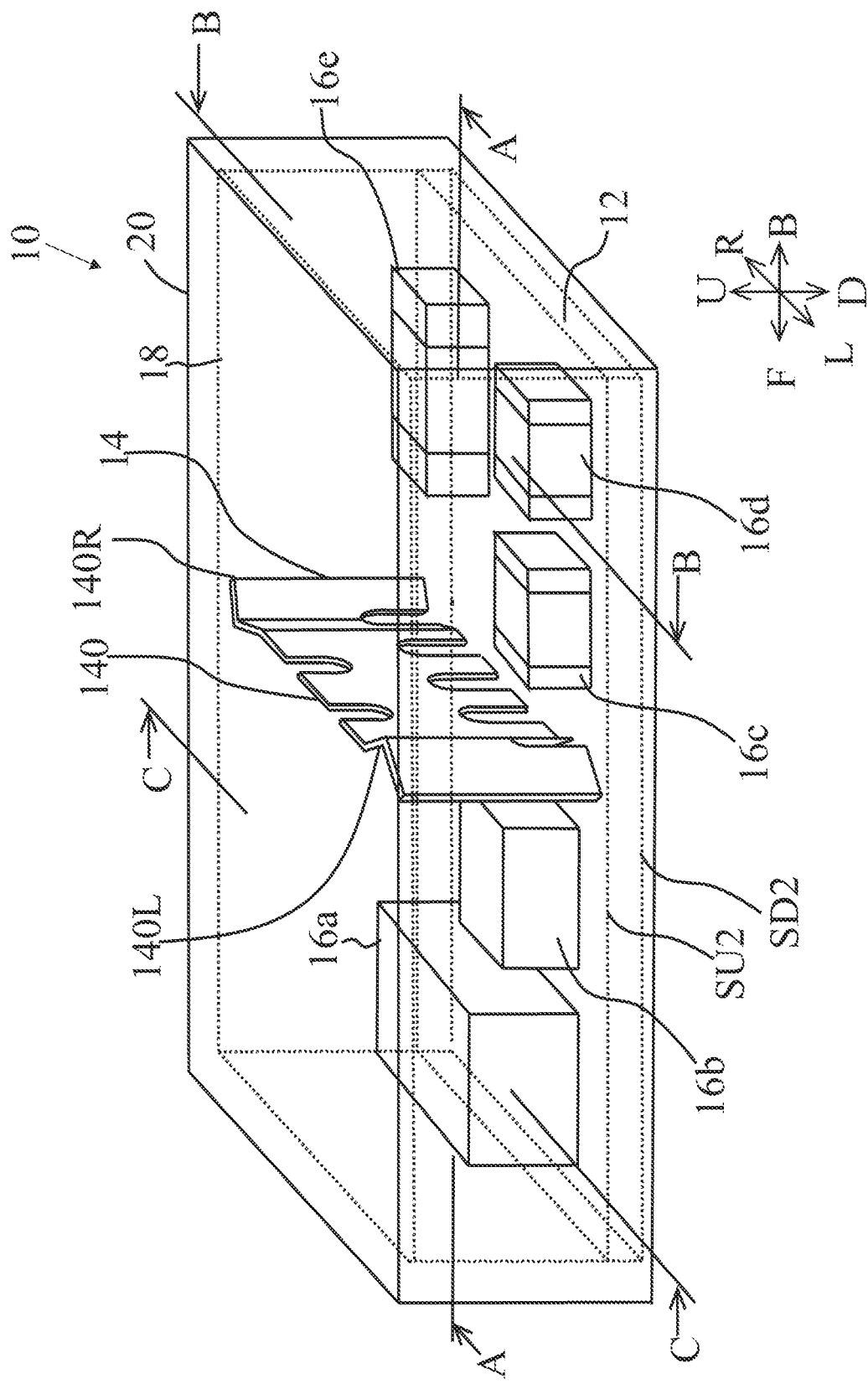
FIG. 1 is a perspective view of a module 10.
Figure 2:
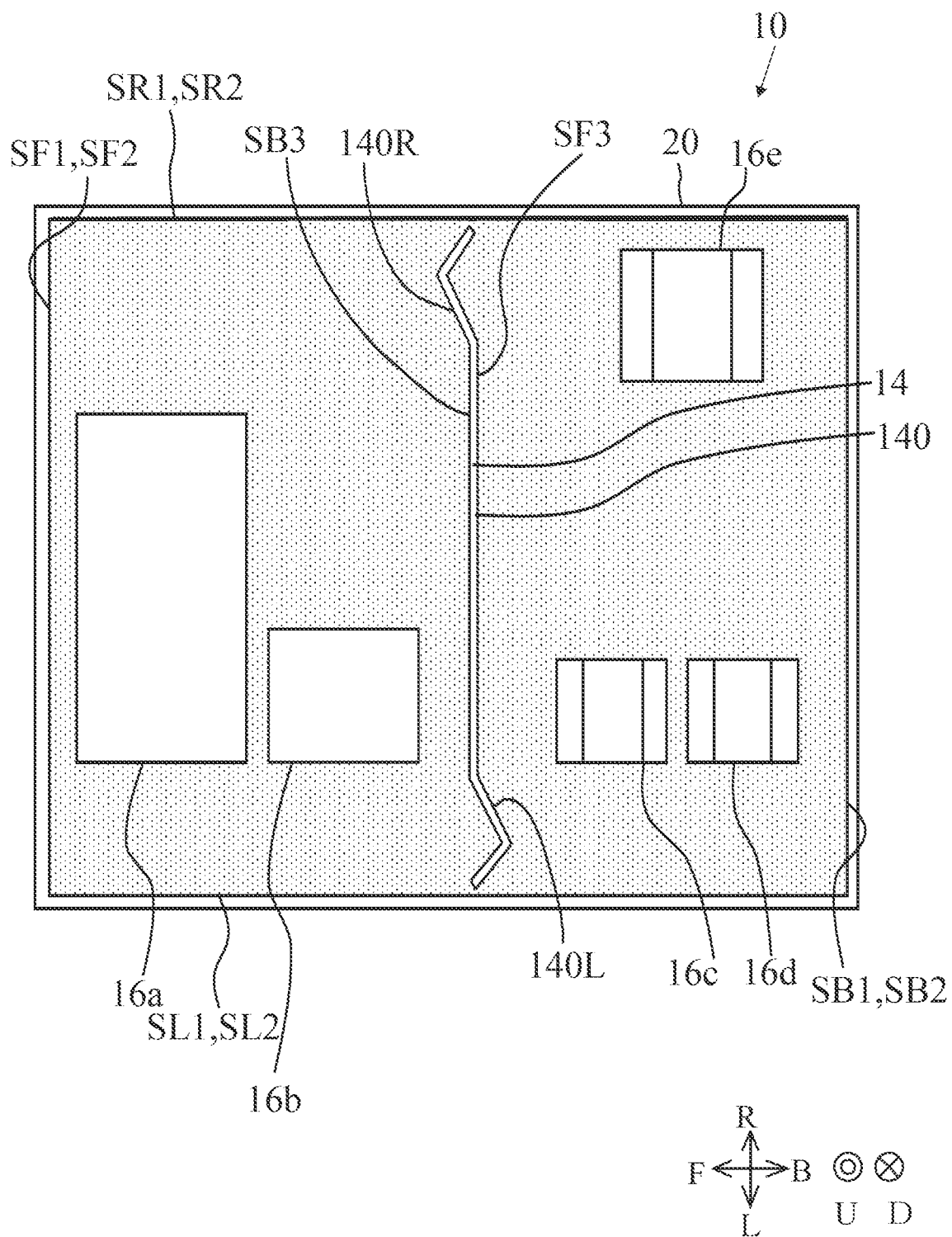
FIG. 2 is a top view of the module 10.
Figure 3:
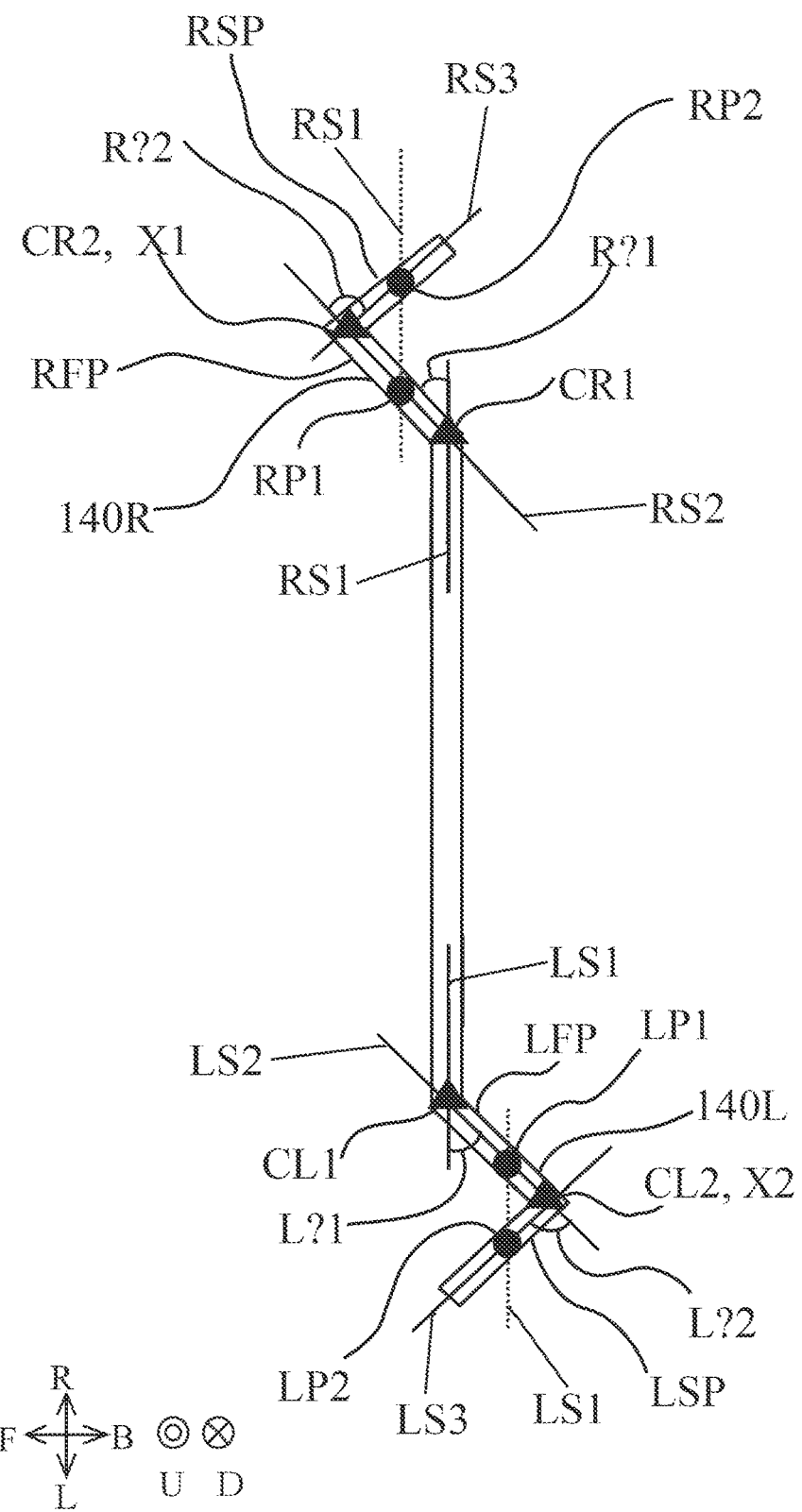
FIG. 3 is a top view of a metal member 14.
Figure 4:
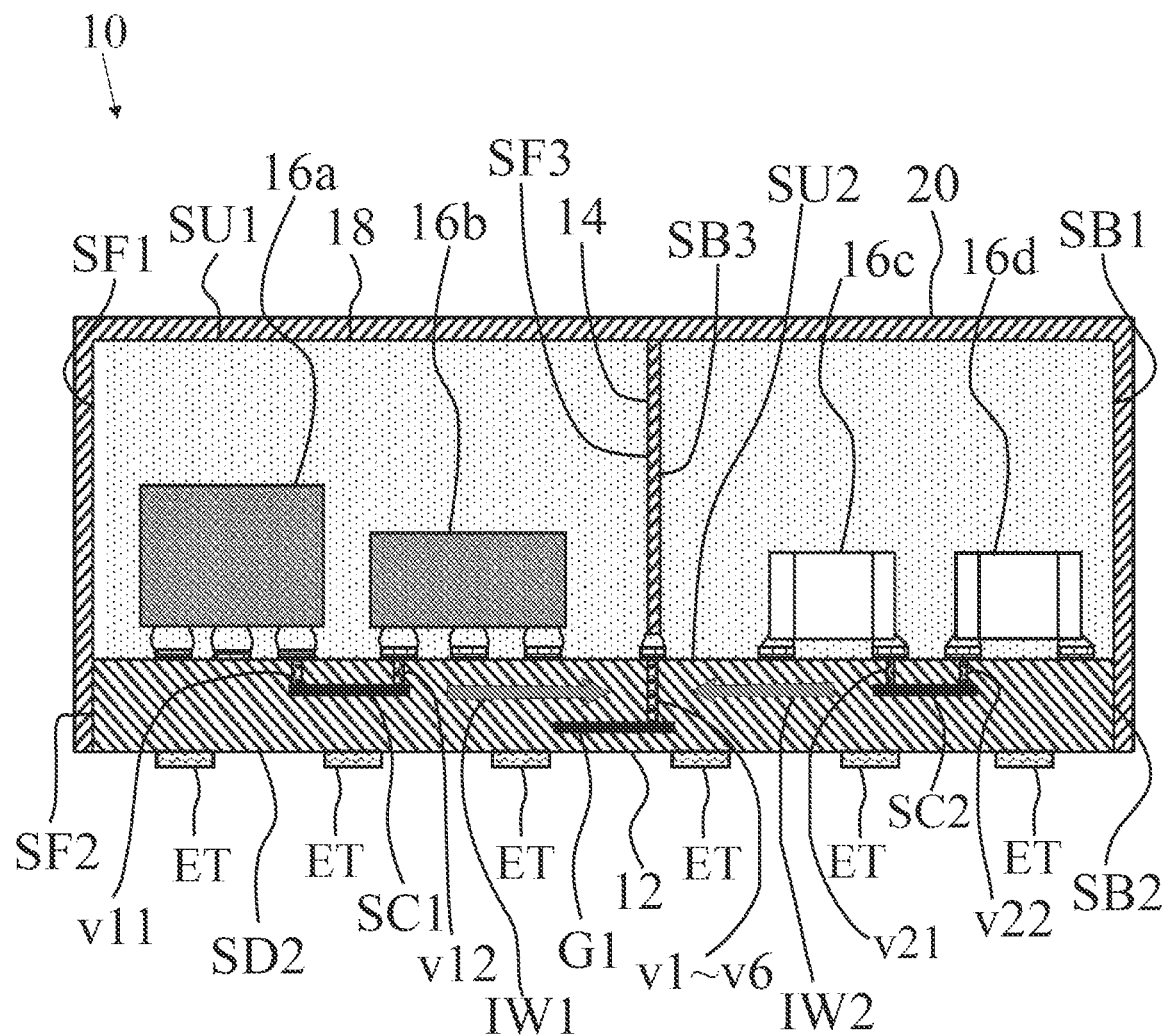
FIG. 4 is a cross-sectional view of the module 10 taken along line A-A.
Figure 4:
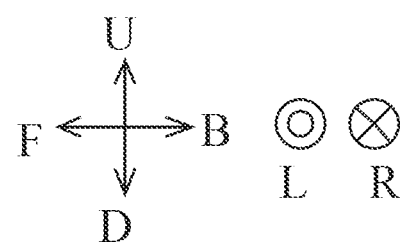
Figure 5:
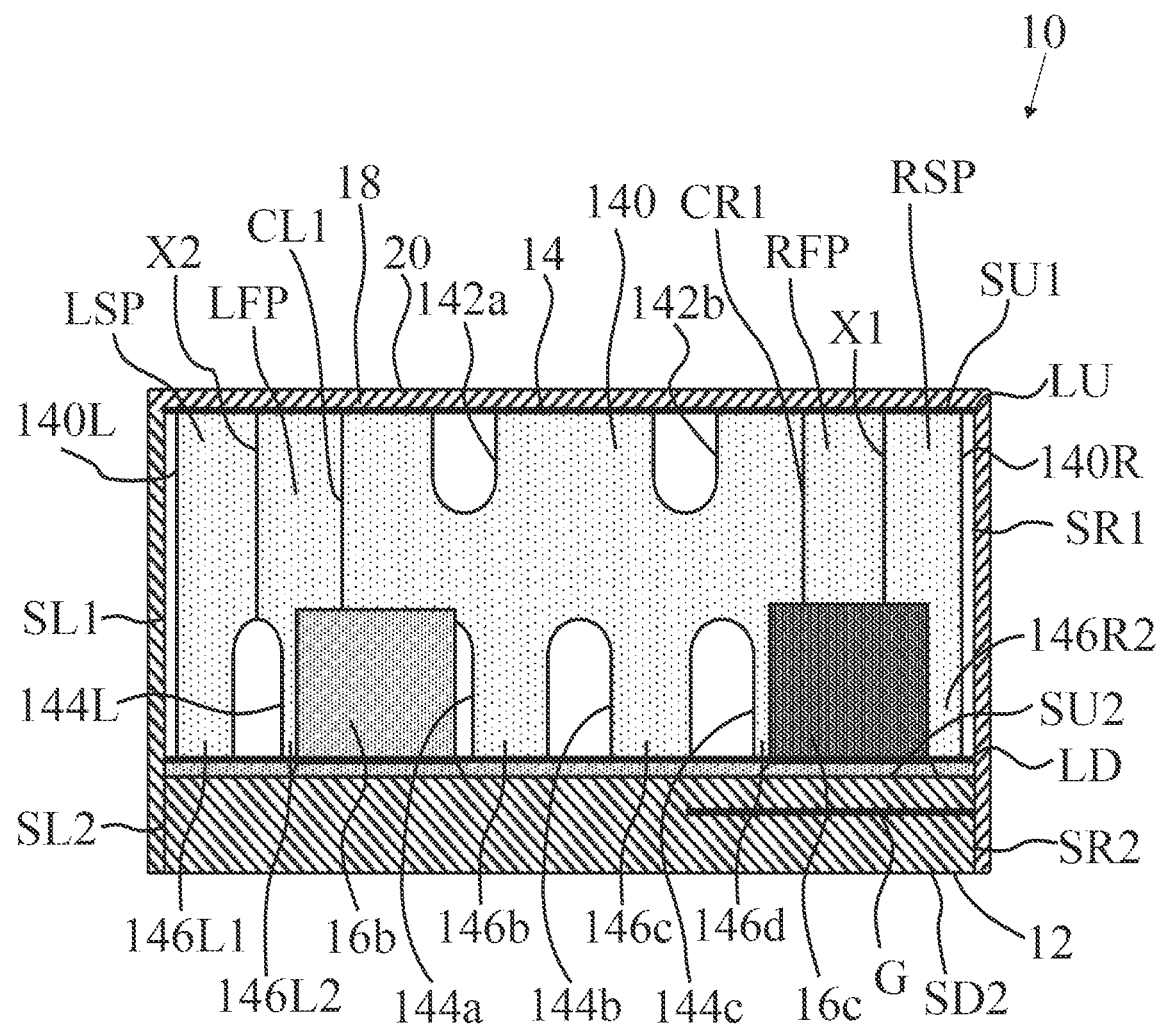
FIG. 5 is a cross-sectional view of the module 10 taken along line B-B.
Figure 5:
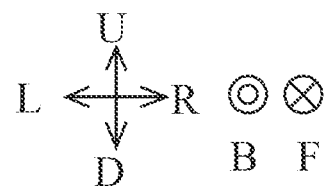
Figure 6:
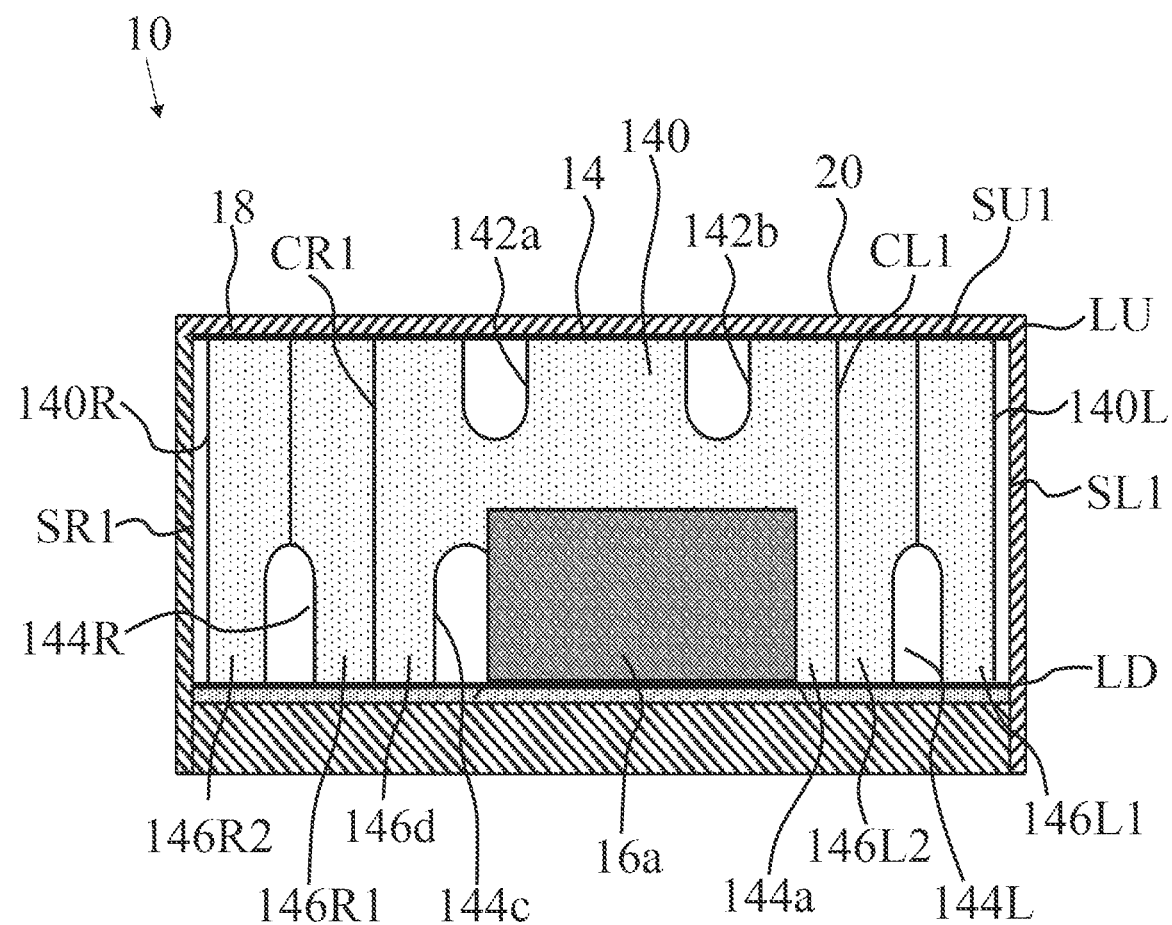
FIG. 6 is a cross-sectional view of the module 10 taken along line C-C.
Figure 6:
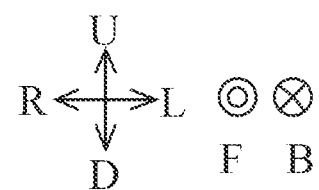
Figure 7:
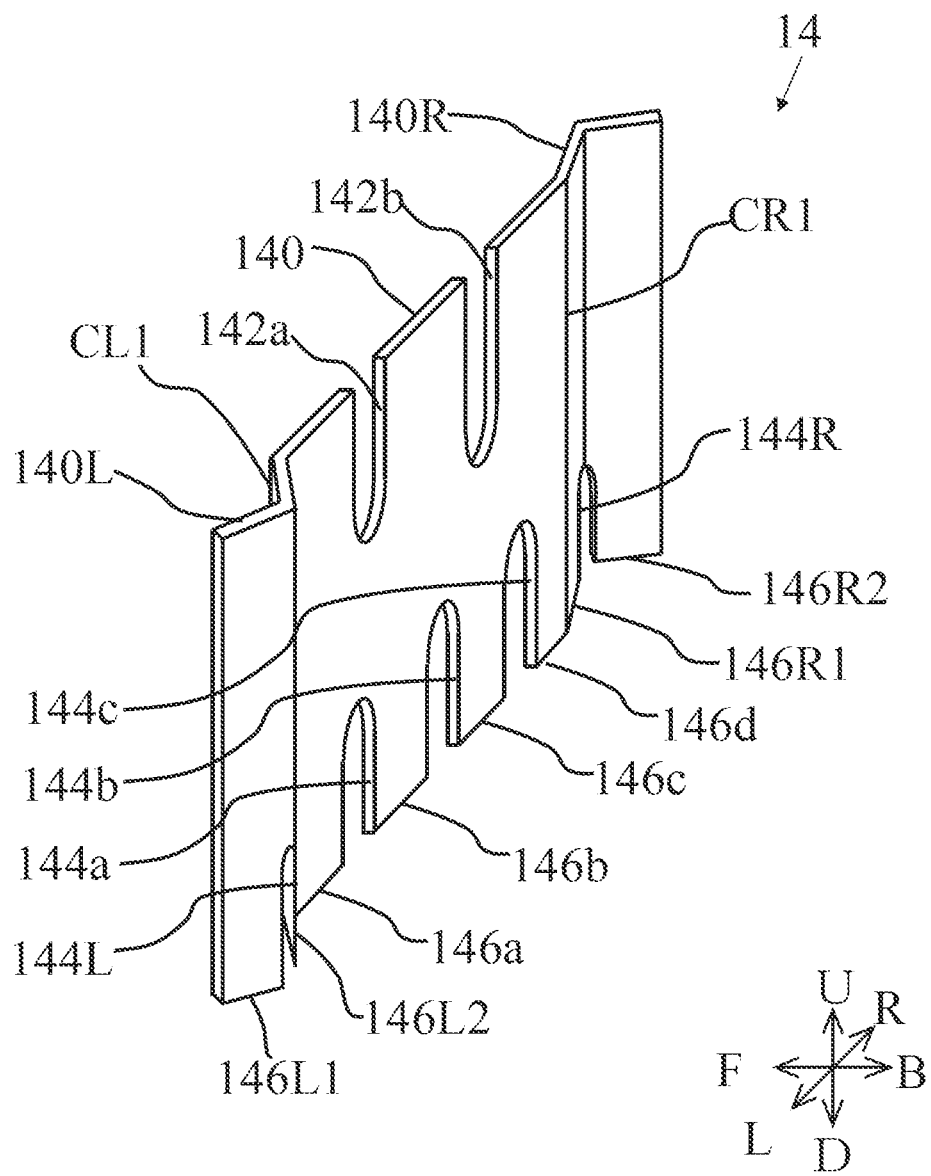
FIG. 7 is a perspective view of the metal member 14.
Figure 8:
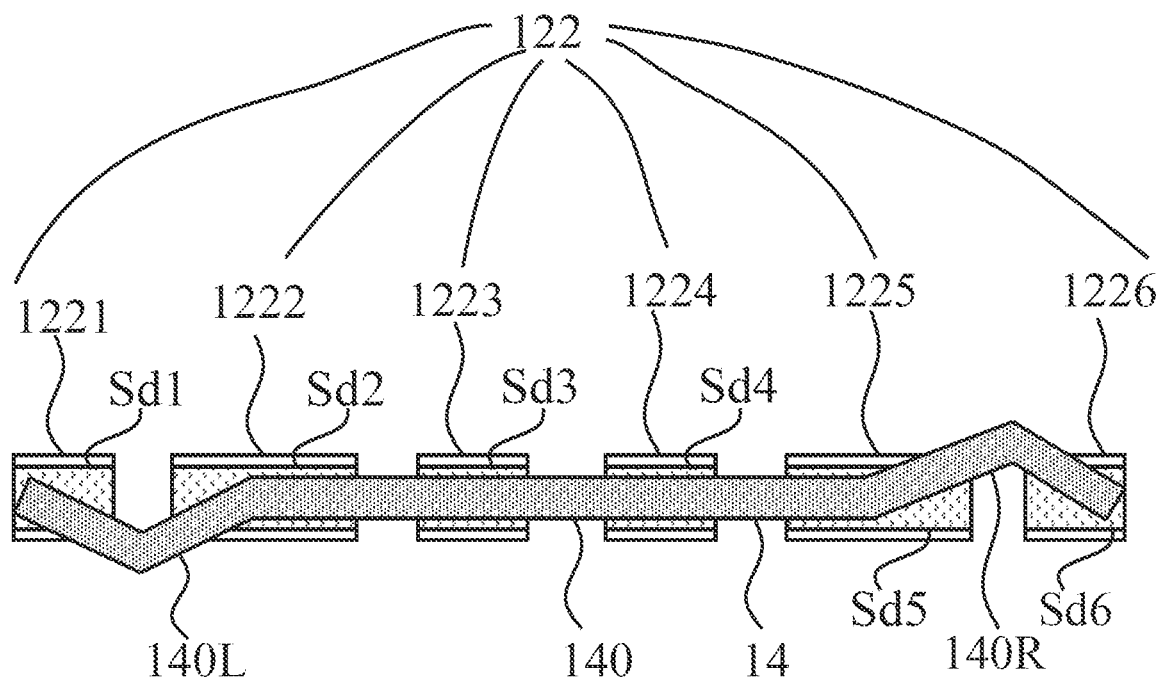
FIG. 8 is a top view of the metal member 14, solders Sd1 to Sd6, and a mounting electrode 122.
Figure 8:
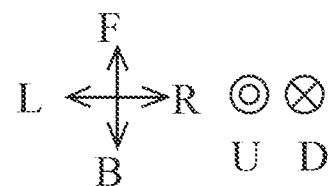
Figure 9:
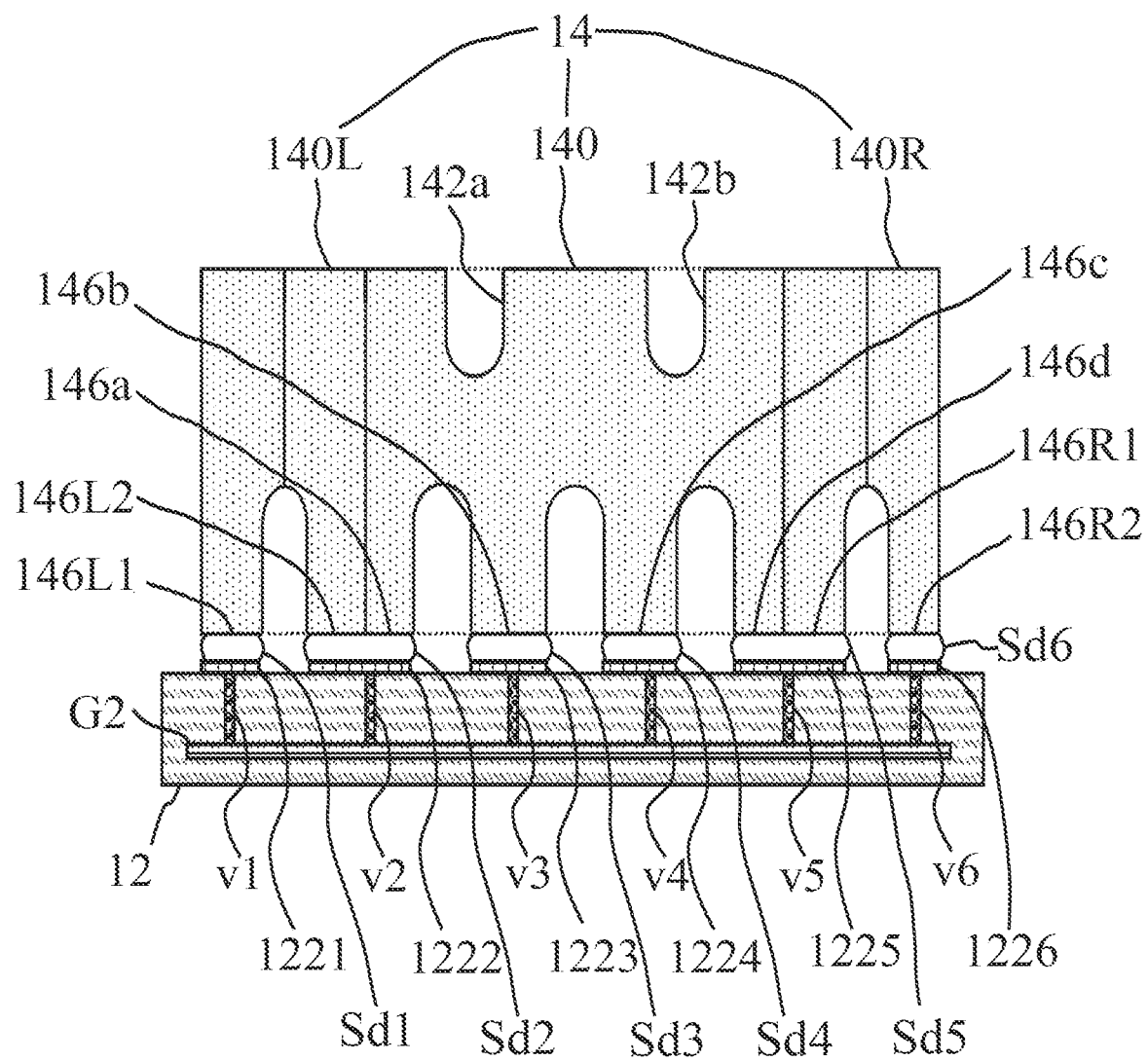
FIG. 9 is a diagram when the metal member 14 and the substrate 12 are seen through from a front-back direction.

Hereinafter, a structure of a module 10 according to an embodiment of the present disclosure will be described with reference to the drawings. FIG. 1 is a perspective view of the module 10. In FIG. 1, the inside of the module 10 is seen through. FIG. 2 is a top view of the module 10. In FIG. 2, the inside of the module 10 is seen through. FIG. 3 is a top view of a metal member 14. FIG. 4 is a cross-sectional view of the module 10 taken along line A-A. FIG. 5 is a cross-sectional view of the module 10 taken along line B-B. FIG. 6 is a cross-sectional view of the module 10 taken along line C-C. FIG. 7 is a perspective view of the metal member 14. FIG. 8 is a top view of the metal member 14 and a mounting electrode 122. FIG. 9 is a diagram when the metal member 14 and the substrate 12 are seen through from the front-back direction.

Hereinafter, the direction in the module 10 will be described. As illustrated in FIG. 1, a substrate 12 of the module 10 has a plate shape. Therefore, as illustrated in FIGS. 1 and 4, the direction in which an upper main surface SU2 and a lower main surface SD2 of the substrate 12 are arranged is defined as an up-down direction. As illustrated in FIG. 2, when viewed in the up-down direction, a direction in which a front main surface SF3 and a back main surface SB3 of the metal member 14 are arranged is defined as a front-back direction. In addition, a direction orthogonal to the front-back direction and the up-down direction is defined as a left-right direction. The up-down direction, the left-right direction, and the front-back direction are orthogonal to each other. However, the up-down direction, the left-right direction, and the front-back direction may not coincide with the up-down direction, the left-right direction, and the front-back direction in actual use of the module 10. In each drawing, the upward direction and the downward direction may be exchanged, the left direction and the right direction may be exchanged, or the forward direction and the backward direction may be exchanged.

Hereinafter, definitions of terms in the present specification will be described. First, a positional relationship of members in the present specification will be defined. X to Z are members or parts constituting the module 10. In the present specification, X and Y arranged in the front-back direction indicate the following states. When X and Y are viewed in a direction perpendicular to the front-back direction, both X and Y are arranged on an arbitrary straight line indicating the front-back direction. In the present specification, X and Y arranged in the front-back direction when viewed in the up-down direction indicate the following states. When X and Y are viewed in the up-down direction, both X and Y are arranged on an arbitrary straight line indicating the front-back direction. In this case, when X and Y are viewed from the left-right direction different from the up-down direction, one of X and Y may not be arranged on arbitrary straight line indicating the front-back direction. X and Y may be in contact with each other. X and Y may be separated from each other. Z may be present between X and Y. This definition also applies to directions other than the front-back direction.

In the present specification, arranging X before Y refers to the following state. At least a part of X is disposed in a region through which Y passes when Y translates in the forward direction. Therefore, X may be within the region through which Y passes when Y translates in the forward direction, or may protrude from the region through which Y passes when Y translates in the forward direction. In this case, X and Y are aligned in the front-back direction. This definition also applies to directions other than the front-back direction.

In the present specification, arranging X before Y when viewed in the left-right direction refers to the following state. When viewed in the left-right direction, X and Y are arranged in the front-back direction, and when viewed in the left-right direction, a portion of X facing Y is disposed in front of Y. In this definition, X and Y may not be arranged in the front-back direction in three dimensions. This definition also applies to directions other than the front-back direction.

In the present specification, arranging X in front of Y refers to the following state. X is disposed in front of a plane passing through the front end of Y and orthogonal to the front-back direction. In this case, X and Y may be arranged in the front-back direction or may not be arranged in the front-back direction. This definition also applies to directions other than the front-back direction.

In the present specification, each part of X is defined as follows unless otherwise specified. The front part of X means the front half of X. The rear part of X means the rear half of X. The left part of X means the left half of X. The right part of X means the right half of X. The upper part of X means the upper half of X. The lower part of X means the lower half of X. The front end of X means an end of X in the forward direction. The back end of X means an end of X in the backward direction. The left end of X means an end of X in the left direction. The right end of X means an end of X in the right direction. The upper end of X means an end of X in the upward direction. The lower end of X means an end of X in the downward direction. The front end portion of X means the front end of X and the vicinity thereof. The back end portion of X means the back end of X and the vicinity thereof. The left end portion of X means the left end of X and the vicinity thereof. The right end portion of X means the right end of X and the vicinity thereof. The upper end portion of X means the upper end of X and the vicinity thereof. The lower end portion of X means the lower end of X and the vicinity thereof.

When any two members in the present specification are defined as X and Y, the relationship between any two members has the following meaning. In the present specification, "X is supported by Y" includes a case where X is attached to Y so as not to be movable with respect to Y (that is, it is fixed) and a case where X is attached to Y so as to be movable with respect to Y. Further, "X is supported by Y" includes both a case where X is directly attached to Y and a case where X is attached to Y via Z.

In the present specification, "X and Y are electrically connected" means that electricity is conducted between X and Y. Therefore, X and Y may be in contact with each other, or X and Y may not be in contact with each other. When X and Y are not in contact with each other, Z having conductivity is disposed between X and Y.

In the present specification, bending in the right direction means bending so as to include a vector component in the right direction. Therefore, bending in the right direction may include a vector component (for example, a vector component in the forward direction) in a direction other than the right direction. Similarly, bending in the left direction means bending so as to include a vector component in the left direction. Bending in the forward direction means bending so as to include a forward vector component. Bending in the backward direction means bending so as to include a vector component in the backward direction. Bending in the upward direction means bending so as to include a vector component in the upward direction. Bending in the downward direction means bending so as to include a vector component in the downward direction.

[Structure of Module 10]

The module 10 is, for example, a high frequency module. The high frequency module is, for example, an analog front end module of a portable wireless communication device. However, the module 10 is not limited to the high frequency module.

As illustrated in FIGS. 1 to 4, the module 10 includes a substrate 12, a metal member 14, electronic components 16a to 16e, a sealing resin layer 18, and a shield 20.

The substrate 12 is, for example, a multilayer wiring substrate having a structure in which a plurality of insulator layers made of a low-temperature co-fired ceramic, a high-temperature co-fired ceramic, glass epoxy, or the like is stacked.

The substrate 12 has a plate shape. Therefore, as illustrated in FIGS. 1 and 4, the substrate 12 has an upper main surface SU2, a lower main surface SD2, a left surface SL2, a right surface SR2, a front surface SF2, and a back surface SB2. The substrate 12 has a rectangular shape when viewed in the up-down direction.

An electric circuit is provided by a conductor layer in the inside, the upper main surface SU2, and the lower main surface SD2 of the substrate 12. In the present embodiment, the substrate 12 includes ground conductor layers G and G1 as illustrated in FIGS. 4 and 5. The ground conductor layers G and G1 is provided inside the substrate 12. A ground potential is connected to the ground conductor layers G and G1.

The metal member 14 is provided on the upper main surface SU2 of the substrate 12. Specifically, the metal member 14 extends upward from the upper main surface SU2 of the substrate 12.

The metal member 14 has a structure in which one metal plate is subjected to bending. The metal member 14 is made of, for example, tough pitch copper. Note that brass, phosphor bronze, SUS, aluminum, or the like may be used instead of the tough pitch copper. The thickness of the metal member 14 is, for example, 50 µm.

As illustrated in FIGS. 1, 2, and 4, electronic components 16a and 16b (first electronic component) are mounted on the upper main surface SU2 of the substrate 12. A method for mounting the electronic components 16a and 16b is, for example, mounting by soldering. The electronic components 16a and 16b are semiconductor elements such as an IC or a power amplifier (PA), or a chip component such as a chip inductor, a chip capacitor, or a chip resistor. As illustrated in FIGS. 1, 2, and 4, the electronic components 16a and 16b are disposed in front of the metal member 14.

In the present embodiment, the electronic components 16a and 16b are disposed in front of the metal member 14. Therefore, the electronic components 16a and 16b overlap the metal member 14 when viewed in the front-back direction. The left end of the electronic components 16a and 16b is located to the right of the left end of the metal member 14. The right end of the electronic components 16a and 16b is located to the left of the right end of the metal member 14. The upper end of the electronic components 16a and 16b is located below the upper end of the metal member 14.

In the example illustrated in FIG. 4, the electronic component 16a is electrically connected to a via v11. Further, the electronic component 16b is electrically connected to a via v12. A via v1 and a via v2 are electrically connected via a signal conductor layer SC1. That is, in the example illustrated in FIG. 4, the electronic component 16a and the electronic component 16b are electrically connected via the signal conductor layer SC1.

Electronic components 16c, 16d, and 16e (second electronic components) are mounted on the upper main surface SU2 of the substrate 12. The method for mounting the electronic components 16c, 16d, and 16e is, for example, mounting by soldering. The electronic components 16c, 16d, and 16e are semiconductor elements such as ICs and power amplifiers (PAs), chip components such as chip inductors, chip capacitors, and chip resistors. As illustrated in FIGS. 1, 2, and 4, the electronic components 16c, 16d, and 16e are disposed behind the metal member 14.

In the present embodiment, the electronic components 16c, 16d, and 16e are disposed behind the metal member 14. Therefore, the electronic components 16c, 16d, and 16e overlap the metal member 14 when viewed in the front-back direction. The left end of each of the electronic components 16c, 16d, and 16e is located to the right of the left end of the metal member 14. The right end of each of the electronic components 16c, 16d, and 16e is located to the left of the right end of the metal member 14. The upper end of each of the electronic components 16c, 16d, and 16e is located below the upper end of the metal member 14.

In the example illustrated in FIG. 4, the electronic component 16c is electrically connected to the via v21. Further, the electronic component 16d is electrically connected to a via v22. A via v21 and the via v22 are electrically connected via a signal conductor layer SC2. That is, in the example illustrated in FIG. 4, the electronic component 16c and the electronic component 16d are electrically connected via the signal conductor layer SC2.

The electronic components 16a to 16e may generate a magnetic flux like a coil, for example. When the electronic components 16a to 16e generate a magnetic flux, for example, two cases of a first case and a second case described below are assumed as applications of shielding by the metal member 14.

The first case is a case in which the magnetic flux generated by an electronic component is shielded by the metal member 14 in order to suppress an influence of the magnetic flux on surrounding electronic components. The electronic component corresponding to the first case is, for example, a surface acoustic wave (SAW) filter, a low noise amplifier (LNA), a switch, or the like.

In the case of an electronic component corresponding to the first case, it is easy to shield the magnetic flux generated from the electronic component by disposing the electronic component close to the metal member 14. For example, as in the electronic components 16b and 16c illustrated in FIGS. 1 and 2, the electronic component is disposed close to the metal member 14.

The second case is a case in which the magnetic flux generated by the electronic component is not shielded so that the characteristics of the electronic component are not deteriorated. The electronic component corresponding to the second case is, for example, a chip inductor.

In the case of an electronic component corresponding to the second case, disposing the electronic component away from the metal member 14 reduces the possibility that the magnetic flux shielded by the metal member 14 deteriorates the characteristics of the electronic component. For example, as in the electronic components 16a, 16d, and 16e illustrated in FIGS. 1 and 2, the electronic components are disposed away from the metal member 14.

In addition, the electronic components corresponding to the second case include a vertical inductor and a horizontal inductor.

The vertical inductor is an inductor whose winding axis extends in the up-down direction. The horizontal inductor is an inductor whose winding axis extends in the up-down direction.

Here, the metal member 14 will be described in detail. As illustrated in FIGS. 1, 2, and 3, the metal member 14 has a shape in which one plate-shaped body is bent in a forward direction or a backward direction. At this time, the metal member 14 has a bent portion which is a portion bent in the forward direction or the backward direction. In the example illustrated in FIGS. 2 and 3, the metal member 14 has a bent portion (hereinafter, referred to as a first bent portion) that bends in a forward direction at the right end portion of the metal member 14. The metal member 14 has a bent portion (hereinafter, referred to as a second bent portion) that bends in a backward direction at the left end portion of the metal member 14. At this time, as illustrated in FIGS. 1, 2, and 3, the metal member 14 includes a plate-shaped portion 140, a right support portion 140R, and a left support portion 140L. The plate-shaped portion 140 has a plate shape. That is, the plate-shaped portion 140 has a rectangular shape when viewed in the front-back direction. The right support portion 140R is a portion located between the first bent portion and the right end of the metal member 14. That is, the right support portion 140R is connected to the right end (first bent portion) of the plate-shaped portion 140. The right support portion 140R extends in a forward direction from the first bent portion. Similarly, the left support portion 140L is a portion located between the second bent portion and the left end of the metal member 14. That is, the left support portion 140L is connected to the left end (second bent portion) of the plate-shaped portion 140. The left support portion 140L extends in a backward direction from the second bent portion.

In the case of the configuration described above, the first bent portion is a boundary between the plate-shaped portion 140 and the right support portion 140R. Here, as illustrated in FIG. 3, a boundary between the plate-shaped portion 140 and the right support portion 140R is defined as a right boundary CR1. In this case, the right boundary CR1 includes the first bent portion. At this time, the right boundary CR1 is located at the right part of the plate-shaped portion 140. More precisely, the right boundary CR1 is located at the right end of the plate-shaped portion 140. As illustrated in FIGS. 5, 6, and 7, the right support portion 140R extends in the right direction from the right boundary CR1 when viewed in the front-back direction. As illustrated in FIG. 3, the right support portion 140R extends in the forward direction from the right boundary CR1. Similarly, the second bent portion is a boundary between the plate-shaped portion 140 and the left support portion 140L. Here, as illustrated in FIG. 3, the boundary between the plate-shaped portion 140 and the left support portion 140L is defined as a left boundary CL1. In this case, the left boundary CL1 includes the second bent portion. At this time, the left boundary CL1 is located on the left part of the plate-shaped portion 140. More precisely, the left boundary CL1 is located at the left end of the plate-shaped portion 140. As illustrated in FIGS. 5, 6, and 7, the left support portion 140L extends in the left direction from the left boundary CL1 when viewed in the front-back direction. As illustrated in FIG. 3, the left support portion 140L extends in the backward direction from the left boundary CL1.

As illustrated in FIGS. 2 and 4, the plate-shaped portion 140 has the front main surface SF3 and the back main surface SB3.

As illustrated in FIGS. 5, 6, and 7, the plate-shaped portion 140 is provided with upper notches 142a and 142b and lower notches 144a to 144c. Therefore, strictly speaking, the plate-shaped portion 140 has a shape different from the rectangular shape when viewed in the front-back direction.

Therefore, as illustrated in FIGS. 5 and 6, when viewed in the front-back direction, a line connecting the upper end of the metal member 14 in the left-right direction is defined as an upper side LU. When viewed in the front-back direction, a line connecting the lower end of the metal member 14 in the left-right direction is defined as a lower side LD. The upper side LU is present at a position farther upward from the substrate 12 than the lower side LD.

In addition, in the present specification, the notch is a recess formed in the outer edge of the metal member 14 by partially missing the metal member 14. The notch in the present specification includes, for example, a U-shaped defect extending from a side of a rectangular plate in a direction orthogonal to the side, and an L-shaped defect formed by removing a rectangular corner. In addition, the notch may be an angular U-shaped defect.

As illustrated in FIGS. 5 and 6, the upper notches 142*a* and 142*b* extend in the downward direction from the upper side LU. The upper notches 142*a* and 142*b* have a U-shape when viewed in the front-back direction. That is, the upper notches 142*a* and 142*b* have a shape in which a rectangle having an upper side, a lower side, a left side, and a right side and a semicircle protruding in the downward direction from the lower side of the rectangle are combined. The lower ends of the upper notches 142*a* and 142*b* are located above the center of the plate-shaped portion 140 in the up-down direction when viewed in the front-back direction. The upper notch 142*a* is located on the left of the upper notch 142*b*. The lengths in the up-down direction of the upper notches 142*a* and 142*b* are, for example, half or less of the length in the up-down direction of the plate-shaped portion 140. The widths of the upper notches 142*a* and 142*b* in the left-right direction are, for example, 150 μm.

As illustrated in FIGS. 5 and 6, the lower notches 144*a* to 144*c* extend in the upward direction from the lower side LD. The lower notches 144*a* to 144*c* have a vertically inverted U-shape when viewed in the front-back direction. That is, the lower notches 144*a* to 144*c* have a shape in which a rectangle and a semicircle protruding in the upward direction from the upper side of the rectangle are combined. The upper ends of the lower notches 144*a* to 144*c* are located below the center of the plate-shaped portion 140 in the up-down direction when viewed in the front-back direction. The lower notches 144*a* to 144*c* are arranged in a line in this order from left to right. The lower notches 144*a* to 144*c* are arranged at equal intervals in the left-right direction when viewed in the front-back direction. The lengths in the up-down direction of the lower notches 144*a* to 144*c* are, for example, half or less of the length in the up-down direction of the plate-shaped portion 140. The widths of the lower notches 144*a* to 144*c* in the left-right direction are, for example, 150 μm.

Here, a positional relationship between the upper notches 142*a* and 142*b* and the lower notches 144*a* to 144*c* will be described. As illustrated in FIGS. 5, 6, and 7, the upper notches 142*a* and 142*b* are displaced in the left-right direction from the lower notches 144*a* to 144*c* when viewed in the up-down direction. The upper notch 142*a* is located between the lower notch 144*a* and the lower notch 144*b* in the left-right direction when viewed in the up-down direction. The upper notch 142*b* is located between the lower notch 144*b* and the lower notch 144*c* in the left-right direction when viewed in the up-down direction. This prevents the upper notches 142*a* and 142*b* and the lower notches 144*a* to 144*c* from being too close to each other. The shortest distance between the upper notches 142*a* and 142*b* and the lower notches 144*a* to 144*c* is 1.5 times or more the plate thickness of the plate-shaped portion 140. The shortest distance between the upper notches 142*a* and 142*b* and the lower notches 144*a* to 144*c* is more preferably twice or more the plate thickness of the plate-shaped portion 140.

As illustrated in FIGS. 5, 6, and 7, the plate-shaped portion 140 provided with the lower notches 144*a* to 144*c* includes foot portions 146*a* to 146*d*. The foot portions 146*a* to 146*d* are located in the lower part of the plate-shaped portion 140. As illustrated in FIG. 7, the foot portion 146*a* is a portion located between the left boundary CL1 and the lower notch 144*a*. In this case, the foot portion 146*a* is located at the left end portion of the plate-shaped portion 140. As illustrated in FIG. 7, the foot portion 146*d* is a portion located between the right boundary CR1 and the lower notch 144*c*. In this case, the foot portion 146*d* is located at the right end portion of the plate-shaped portion 140. The foot portions 146*b* and 146*c* are portions located between two adjacent lower notches in the plate-shaped portion 140. Specifically, the foot portion 146*b* is located between the lower notch 144*a* and the lower notch 144*b*. The foot portion 146*c* is located between the lower notch 144*b* and the lower notch 144*c*. That is, in the present specification, the foot portion of the plate-shaped portion 140 is a portion located between two adjacent lower notches, a portion located at the right end portion of the plate-shaped portion 140, or a portion located at the left end portion of the plate-shaped portion 140.

As illustrated in FIGS. 5, 6, and 7, the foot portion 146*a* is located on the left of the lower notch 144*a* in the left-right direction. That is, the foot portion 146*a* is located at the left end portion of the plate-shaped portion 140.

As illustrated in FIGS. 5, 6, and 7, the foot portion 146*b* is located between the lower notch 144*a* and the lower notch 144*b* in the left-right direction.

As illustrated in FIGS. 5, 6, and 7, the foot portion 146*c* is located between the lower notch 144*b* and the lower notch 144*c* in the left-right direction.

As illustrated in FIGS. 5, 6, and 7, the foot portion 146*d* is located to the right of the lower notch 144*c* in the left-right direction. That is, the foot portion 146*d* is located at the right end portion of the plate-shaped portion 140.

Here, a positional relationship between the foot portions 146*a* to 146*d* and the lower notches 144*a* to 144*c* will be described. As illustrated in FIGS. 5, 6, and 7, the foot portion 146*a*, the lower notch 144*a*, the foot portion 146*b*, the lower notch 144*b*, the foot portion 146*c*, the lower notch 144*c*, and the foot portion 146*d* are arranged in this order from left to right when viewed in the front-back direction. The lower notches 144*a* to 144*c* have the same shape. Therefore, the foot portions 146*a* to 146*d* are arranged at equal intervals in the left-right direction when viewed in the front-back direction.

Outer edges of the foot portions 146*a* to 146*d* are connected to outer edges of the lower notches 144*a* to 144*c*. Therefore, the lower notches 144*a* to 144*c* are located on at least one of the left and right of the foot portions 146*a* to 146*d*. Therefore, the foot portions 146*a* to 146*d* include the foot portions 146*b* and 146*c* (first foot portions) located between the lower notches 144*a* to 144*c* in the left-right direction when viewed in the front-back direction. The lower notches 144*a* to 144*c* are located on both the left and right of the foot portions 146*b* and 146*c*.

As illustrated in FIGS. 5, 6, and 7, the right support portion 140R is provided with a lower notch 144R.

As illustrated in FIGS. 5 and 6, the lower notch 144R extends in the upward direction from the lower side LD. The lower notches 144R has a vertically inverted U-shape when viewed in the front-back direction. The upper end of the lower notch 144R is located below the center of the plate-shaped portion 140 in the up-down direction when viewed in the front-back direction.

As illustrated in FIGS. 5, 6, and 7, the right support portion 140R provided with the lower notch 144R includes foot portions 146R1 and 146R2. The foot portions 146R1 and 146R2 are located at the lower end portion of the right support portion 140R. The foot portion 146R1 is a portion located between the right boundary CR1 and the lower notch 144R. In this case, the foot portion 146R1 is located on the left of the lower notch 144R in the right support portion 140R. The foot portion 146R2 is a portion located at the right end portion of the right support portion 140R. In this case, the foot portion 146R2 is a portion located on the right of the lower notch 144R in the right support portion 140R. That is, in the present specification, the foot portion of the right support portion 140R is a portion located between the right boundary CR1 and the lower notch or a portion located at the right end portion of the right support portion 140R. When a plurality of lower notches are provided in the right support portion 140R, a portion located between two adjacent lower notches in the right support portion 140R also serves as a foot portion.

The foot portion 146R1 is located on the left of the lower notch 144R. That is, the foot portion 146R1 is located at the left end portion of the right support portion 140R.

The foot portion 146R2 is located on the right of the lower notch 144R. That is, the foot portion 146R2 is located at the right end portion of the right support portion 140R.

As illustrated in FIGS. 1, 5, and 6, the left support portion 140L is provided with a lower notch 144L extending in the upward direction from the lower side LD.

Since the shape of the lower notch 144L is the same as that of the lower notch 144R, the description thereof will be omitted.

The left support portion 140L provided with the lower notch 144L includes foot portions 146L1 and 146L2. The foot portions 146L1 and 146L2 are located at the lower end portion of the left support portion 140L. The foot portion 146L2 is a portion located between the left boundary CL1 and the lower notch 144L in the left support portion 140L. In this case, the foot portion 146L2 is located on the right of the lower notch 144L in the left support portion 140L. The foot portion 146L1 is a portion located at the left end portion of the left support portion 140L. In this case, the foot portion 146L1 is located on the left of the lower notch 144L in the left support portion 140L. That is, in the present specification, the foot portion of the left support portion 140L is a portion located between the left boundary CL1 and the lower notch or a portion located at the left end portion of the left support portion 140L. When a plurality of lower notches are provided in the left support portion 140L, a portion located between two adjacent lower notches in the left support portion 140L also serves as a foot portion.

The foot portion 146L1 is located on the left of the lower notch 144L. That is, the foot portion 146L1 is located at the left end portion of the left support portion 140L.

The foot portion 146L2 is located on the right of the lower notch 144L. That is, the foot portion 146L2 is located at the right end portion of the left support portion 140L.

The foot portions 146L1, 146L2, 146a to 146d, 146R1, and 146R2 are fixed to the upper main surface SU2 of the substrate 12. Specifically, the foot portions 146L1, 146L2, 146a to 146d, 146R1, and 146R2 are fixed to the mounting electrode 122 included in the substrate 12 as illustrated in FIG. 8. That is, the mounting electrode 122 is a part of the upper main surface SU2 of the substrate 12.

As illustrated in FIGS. 8 and 9, the mounting electrode 122 has a rectangular shape having long sides extending in the left-right direction when viewed in the up-down direction. As illustrated in FIG. 8, the mounting electrode 122 includes mounting electrodes 1221 to 1226.

The mounting electrode 122 and the metal member 14 are fixed by the solders Sd1 to Sd6. More specifically, as illustrated in FIGS. 8 and 9, the foot portion 146L1 is fixed to the mounting electrode 1221 by the solder Sd1. The foot portions 146L2 and 146a are fixed to the mounting electrode 1222 by the solder Sd2. In this case, the left support portion 140L is fixed by the solders Sd1 and Sd2 (left conductive member). The foot portion 146b is fixed to a mounting electrode 1223 by the solder Sd3. The foot portion 146c is fixed to a mounting electrode 1224 by the solder Sd4. The foot portions 146d and 146R1 are fixed to a mounting electrode 1225 by the solder Sd5. The foot portion 146R2 is fixed to a mounting electrode 1226 by the solder Sd6. In this case, the right support portion 140R is fixed by the solders Sd5 and Sd6 (right conductive members).

As illustrated in FIGS. 8 and 9, the mounting electrode 1221 fixed to the foot portion 146L1 of the left support portion 140L and the mounting electrode 1222 fixed to the foot portion 146L2 of the left support portion 140L are the left mounting electrodes in the present embodiment. Similarly, the mounting electrode 1225 fixed to the foot portion 146R1 of the right support portion 140R and the mounting electrode 1226 fixed to the foot portion 146L2 of the right support portion 140R are the right mounting electrodes in the present embodiment.

The metal member 14 is electrically connected to a ground conductor layer G2 via the mounting electrode 122. More specifically, the lower end portion of the metal member 14 is connected to the mounting electrodes 1221 to 1226 by the solders Sd1 to Sd6. As illustrated in FIG. 9, each of the mounting electrodes 1221 to 1226 is connected to the vias v1 to v6. The vias v1 to v6 are connected to the ground conductor layer G2. Therefore, the metal member 14 is electrically connected to the ground conductor layer G2 via the solders Sd1 to Sd6, the mounting electrodes 1221 to 1226, and the vias v1 to v6.

The foot portions 146L1, 146L2, 146a to 146d, 146R1, and 146R2 and the mounting electrode 122 may be connected in direct contact with each other without the solders Sd1 to Sd6 interposed therebetween, or the foot portions 146L1, 146L2, 146a to 146d, 146R1, and 146R2 may be mounted in direct contact with the upper surface SU1.

In the case of the above configuration, as illustrated in FIG. 9, the vias v1 to v6 are arranged at equal intervals in the left-right direction in the substrate 12. The interval between the adjacent vias v1 to v6 is, for example, ½ or ¼ of the wavelength of a signal transmitted through a signal conductor layer (not illustrated) of the substrate 12. In this case, the vias v1 to v6 can shield a signal propagating in the substrate 12. Specifically, in a case where the vias v1 to v6 are installed at an interval of ½ or ¼ of the wavelength of the signal, the vias v1 to v6 are located in a portion to be a node in a composite wave (that is, a stationary wave) of the incident wave of the signal and the reflected wave of the signal. Thus, a stationary wave with respect to the input signal is less likely to be generated in the substrate 12. As a result, signals propagating in the substrate 12 can be shielded by the vias v1 to v6.

Hereinafter, the shielding property of the metal member 14 provided with the vias v1 to v6 will be described in detail. For example, as illustrated in FIG. 4, there is a possibility that an interference wave IW1 is generated from the signal conductor layer SC1. At this time, as illustrated in FIG. 4, there is a possibility that the interference wave IW1 generated from the signal conductor layer SC1 travels in the backward direction. In the case of the metal member in which the vias v1 to v6 are not provided, there is a possibility that the interference wave generated from the signal conductor layer SC1 passes under the metal member. On the other hand, in the case of the metal member 14 provided with the vias v1 to v6, the interference wave generated from the signal conductor layer SC1 is shielded by the vias v1 to v6. Therefore, there is a low possibility that the interference wave generated from the signal conductor layer SC1 passes under the metal member 14.

Similarly, as illustrated in FIG. 4, there is a possibility that an interference wave IW2 is generated from the signal conductor layer SC2. At this time, as illustrated in FIG. 4, in a case where the vias v1 to v6 are provided under the metal member 14, the interference wave IW2 is shielded by the vias v1 to v6. Therefore, there is a low possibility that the interference wave IW2 passes under the metal member 14.

As illustrated in FIGS. 1 and 4, the sealing resin layer 18 is provided on the upper main surface SU2 of the substrate 12. The sealing resin layer 18 covers the metal member 14 and the electronic components 16a to 16e. Thus, the sealing resin layer 18 protects the metal member 14 and the electronic components 16a to 16e. At this time, the metal member 14 is fixed by the sealing resin layer 18. The material of the sealing resin layer 18 is, for example, an epoxy resin. The sealing resin layer 18 has a rectangular parallelepiped shape. Therefore, the sealing resin layer 18 has an upper surface SU1, a lower surface SD1, a left surface SL1, a right surface SR1, a front surface SF1, and a back surface SB1.

In the present embodiment, the upper end of the metal member 14 is exposed from the sealing resin layer 18 on the upper surface SU1 of the sealing resin layer 18.

The left end of the left support portion 140L is located to the right of the left surface SL1 of the sealing resin layer 18. In the present embodiment, the left end of the left support portion 140L is not exposed from the sealing resin layer 18 on the left surface SL1 of the sealing resin layer 18.

The right end of the right support portion 140R is located to the left of the right surface SR1 of the sealing resin layer 18. In the present embodiment, the right end of the right support portion 140R is not exposed from the sealing resin layer 18 on the right surface SR1 of the sealing resin layer 18.

The shield 20 covers the upper surface SU1 of the sealing resin layer 18. In the present embodiment, the shield 20 covers the upper surface SU1, the left surface SL1, the right surface SR1, the front surface SF1, and the back surface SB1 of the sealing resin layer 18, and the left surface SL2, the right surface SR2, the front surface SF2, and the back surface SB2 of the substrate 12. The shield 20 is electrically connected to the metal member 14. Specifically, the shield 20 is in contact with a portion where the metal member 14 is exposed from the sealing resin layer 18. Therefore, as illustrated in FIGS. 2, 5, and 6, the shield 20 and the right end of the metal member 14 are not in contact with each other. As illustrated in FIGS. 2, 5, and 6, the shield 20 and the left end of the metal member 14 are not in contact with each other.

Further, the shield 20 is connected to the ground conductor layer G exposed from the back surface SB2 of the substrate 12. Thus, the shield 20 is connected to the ground potential.

The shield 20 has a multilayer structure. Specifically, the shield 20 includes an adhesion layer, a conductive layer, and a protective layer. The adhesion layer, the conductive layer, and the protective layer are stacked in this order from the lower layer to the upper layer. The adhesion layer serves to increase adhesion strength between the conductive layer and the sealing resin layer 18. The material of the adhesion layer is, for example, stainless steel (SUS). The conductive layer serves a shielding function. The material of the conductive layer is, for example, a metal such as Cu, Ag, or Al. The protective layer serves to prevent corrosion of the conductive layer. The material of the protective layer is, for example, SUS.

The surface roughness of the surface of the metal member 14 in contact with the shield 20 is rougher than the surface roughness of the front main surface SF3 and the back main surface SB3 of the metal member 14. As a result, the possibility that the shield 20 is peeled off from the metal member 14 can be reduced. More specifically, the surface roughness of the surface of the metal member 14 in contact with the shield 20 is rough. In this case, the contact area between the surface of the metal member 14 in contact with the shield 20 and the shield 20 increases. Therefore, as compared with the case where the surface of the metal member 14 in contact with the shield 20 is flat, the adhesion between the metal member 14 and the shield 20 is improved (for example, an anchor effect). As a result, it is possible to reduce the possibility that the metal member 14 is peeled off from the shield 20 in the module 10.

An external terminal ET is provided on the lower main surface SD2 of the substrate 12. The module 10 is connected to a circuit outside the module 10 by the external terminal ET.

The metal member 14 of the present embodiment has a structure with high self-standing ability. This structure will be described in more detail below.

As illustrated in FIGS. 3 and 5, the right support portion 140R includes a first portion RFP and a second portion RSP.

As illustrated in FIGS. 3 and 5, the first portion RFP is connected to the right boundary CR1. As illustrated in FIG. 3, the first portion RFP is a portion extending in the forward direction from the right boundary CR1 when viewed in the up-down direction. In this case, the right support portion 140R is bent in the forward direction from the right boundary CR1. In other words, the metal member 14 is curved in the vicinity of the right boundary CR1. At this time, the first portion RFP is located in front of the plate-shaped portion 140 in the front-back direction.

As illustrated in FIGS. 3 and 5, the second portion RSP is connected to the right end CR2 of the first portion RFP. As illustrated in FIG. 3, the second portion RSP extends in the backward direction and in the right direction from the right end CR2 of the first portion RFP when viewed in the up-down direction. In this case, the right support portion 140R is bent in the backward direction and in the right direction from the right end CR2 of the first portion RFP. At this time, as illustrated in FIGS. 3 and 5, the second portion RSP extends from the right end CR2 of the first portion RFP to the right end of the right support portion 140R.

With the above configuration, the right support portion 140R has a shape in which the vicinity of the center in the left-right direction protrudes in the forward direction. In this case, the right end CR2 of the first portion RFP is a right support foremost portion X1 located at a foremost in the right support portion 140R when viewed in the up-down direction. At this time, the right support foremost portion X1 is located in front of the plate-shaped portion 140 when viewed in the up-down direction.

In the case of the configuration described above, the right support portion 140R is in the following state. As illustrated in FIG. 3, when a first straight line RS1 parallel to the left-right direction is defined, the first straight line RS1 overlaps at least two points (a first point RP1 and a second point RP2 illustrated in FIG. 3) of the right support portion 140R. When the right support portion 140R has the right support foremost portion X1, the first straight line RS1 is located in front of the plate-shaped portion 140.

An angle Rθ2 at the corner formed by the first portion RFP and the second portion RSP is larger than an angle Rθ1 of the corner formed by the plate-shaped portion 140 and the first portion RFP. Specifically, as illustrated in FIG. 3, a second straight line RS2 parallel to the first portion RFP and a third straight line RS3 parallel to the second portion RSP when viewed in the up-down direction are defined. At this time, the angle Rθ2 at the corner formed by the second straight line RS2 and the third straight line RS3 is larger than the angle Rθ1 at the corner formed by the first straight line RS1 and the second straight line RS2 as illustrated in FIG. 3.

As illustrated in FIGS. 6 and 7, the lower notch 144R is provided in a portion where the first portion RFP and the second portion RSP are connected (a portion protruding in the forward direction in the right support portion 140R). In this case, in the right support portion 140R, the lower notch 144R overlaps the right support foremost portion X1 when viewed in the up-down direction.

Hereinafter, the left support portion 140L will be described. The left support portion 140L has a structure rotationally symmetric with the right support portion 140R.

As illustrated in FIGS. 3 and 5, the left support portion 140L includes a first portion LFP and a second portion LSP.

As illustrated in FIGS. 3 and 5, the first portion LFP is connected to the left boundary CL1 of the plate-shaped portion 140. As illustrated in FIG. 3, the first portion LFP is a portion extending in the backward direction from the left boundary CL1 when viewed in the up-down direction. In this case, the left support portion 140L is bent in the backward direction from the left boundary CL1. In other words, the metal member 14 is curved in the vicinity of the left boundary CL1. At this time, the first portion LFP is located behind the plate-shaped portion 140 in the front-back direction.

As illustrated in FIGS. 3 and 5, the second portion LSP is connected to a left end CL2 of the first portion LFP. As illustrated in FIG. 3, the second portion LSP extends in the forward direction and in the left direction from the left end CL2 of the first portion LFP when viewed in the up-down direction. In this case, the left support portion 140L bends in the forward direction and in the left direction from the left end CL2 of the first portion LFP. At this time, as illustrated in FIGS. 3 and 5, the second portion LSP extends from the left end CL2 of the first portion LFP to the left end of the left support portion 140L.

As a result, the left support portion 140L has a shape in which the vicinity of the center in the left-right direction protrudes in the backward direction. In this case, the left end CL2 of the first portion LFP is a left support rearmost portion X2 located at the rearmost position in the left support portion 140L when viewed in the up-down direction. At this time, the left support rearmost portion X2 is located behind the plate-shaped portion 140 when viewed in the up-down direction.

In the case of the configuration described above, the left support portion 140L is in the following state. As illustrated in FIG. 3, when a first straight line LS1 parallel to the left-right direction is defined, the first straight line LS1 overlaps at least two points (a first point LP1 and a second point LP2) of the left support portion 140L. When the left support portion 140L has the left support rearmost portion X2, the first straight line LS1 is located behind the plate-shaped portion 140.

In addition, an angle Lθ2 at the corner formed by the first portion LFP and the second portion LSP is larger than an angle Lθ1 of the corner formed by the plate-shaped portion 140 and the first portion LFP. Specifically, as illustrated in FIG. 3, a second straight line LS2 parallel to the first portion LFP and a third straight line LS3 parallel to the second portion LSP are defined when viewed in the up-down direction. The angle Lθ2 at the corner formed by the second straight line LS2 and the third straight line LS3 is larger than the angle Lθ1 at the corner formed by the first straight line LS1 and the second straight line LS2.

As illustrated in FIGS. 6 and 7, the lower notch 144L is provided in a portion where the first portion LFP and the second portion LSP are connected (a portion protruding in the backward direction in the left support portion 140L). In this case, in the left support portion 140L, the lower notch 144L overlaps the left support rearmost portion X2 when viewed in the up-down direction.

Note that the metal member 14 may have a structure including the right support portion 140R having a shape in which the vicinity of the center in the left-right direction protrudes in the backward direction instead of the right support portion 140R having a shape in which the vicinity of the center in the left-right direction protrudes in the backward direction. In this case, the right support portion 140R has a right support rearmost portion located at the rearmost position in the right support portion 140R and located behind the plate-shaped portion 140. At this time, the right support portion 140R is bent in the backward direction from the right boundary CR1. Further, the right support portion 140R bends in the forward direction and in the right direction from the right support rearmost portion.

Note that the metal member 14 may have a structure including the left support portion 140L having a shape in which the vicinity of the center in the left-right direction protrudes in the forward direction instead of the left support portion 140L having a shape in which the vicinity of the center in the left-right direction protrudes in the backward direction. In this case, the left support portion 140L has a left support foremost portion located at a foremost in the left support portion 140L and located in front of the plate-shaped portion 140. At this time, the left support portion 140L is bent in the forward direction from the left boundary CL1. Further, the left support portion 140L is bent in the backward direction and in the left direction from the left support foremost portion.

[Method for Manufacturing Module]

Figure 10:
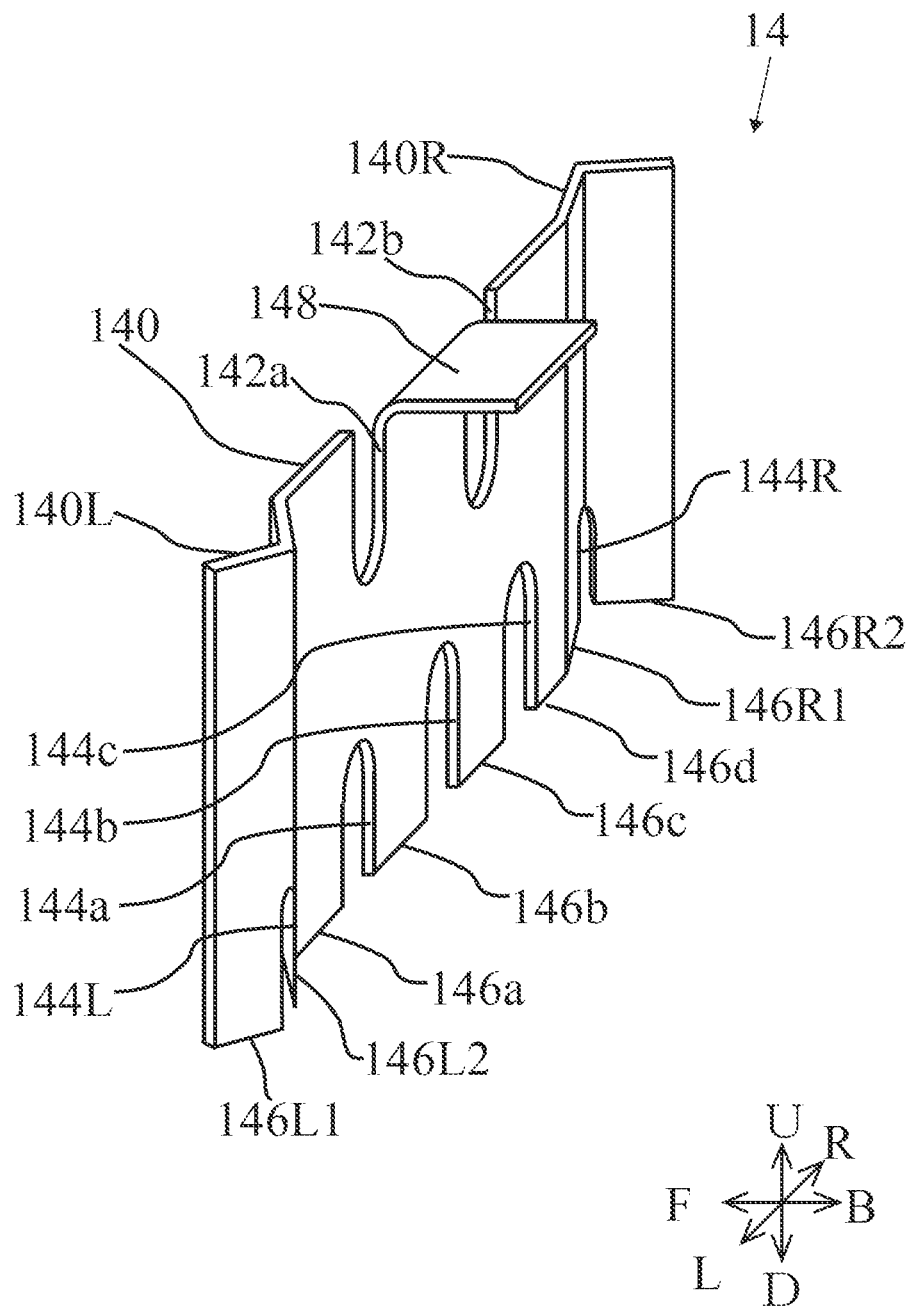
FIG. 10 is a perspective view at the time of manufacturing the metal member 14.
Figure 11:
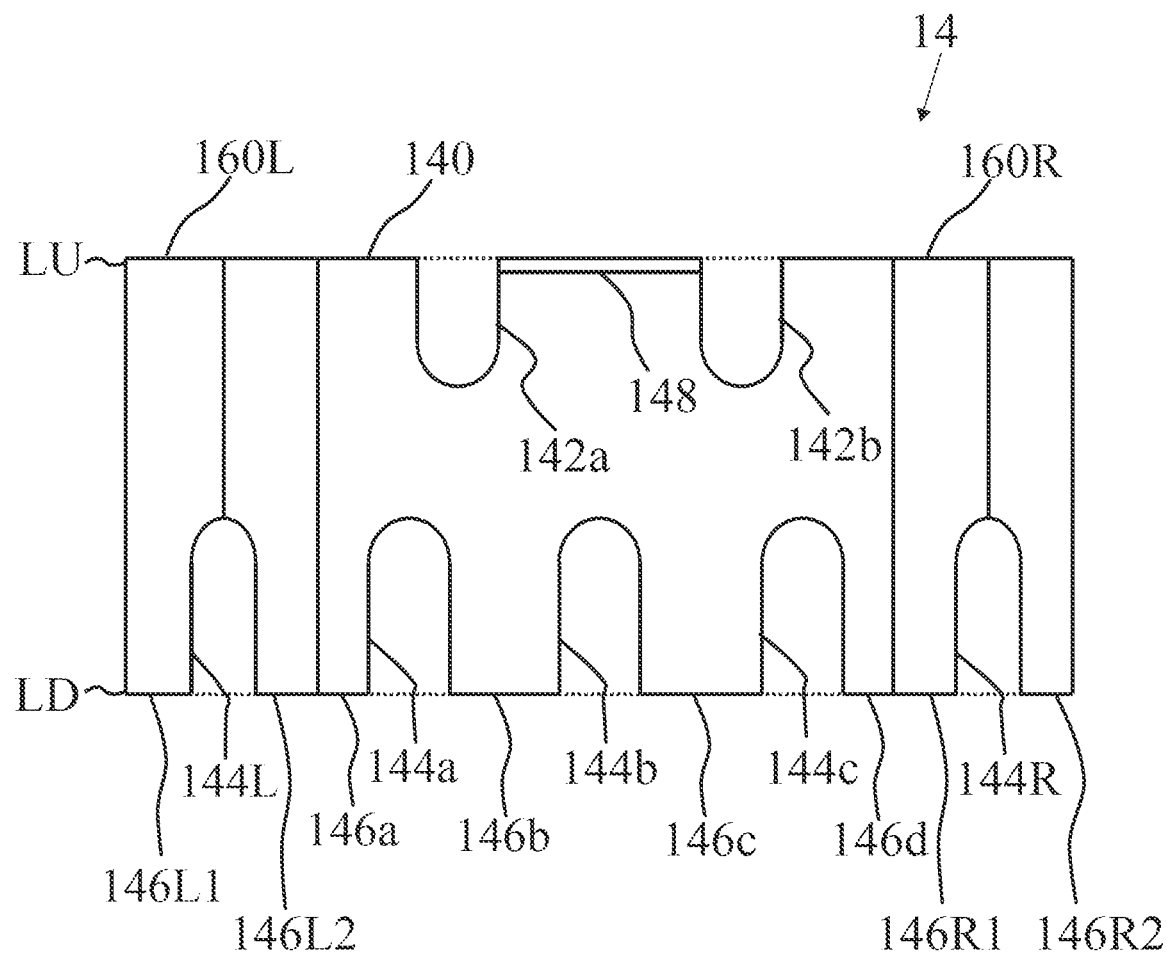
FIG. 11 is a view of the metal member 14 at the time of manufacturing when viewed from a forward direction.
Figure 12:
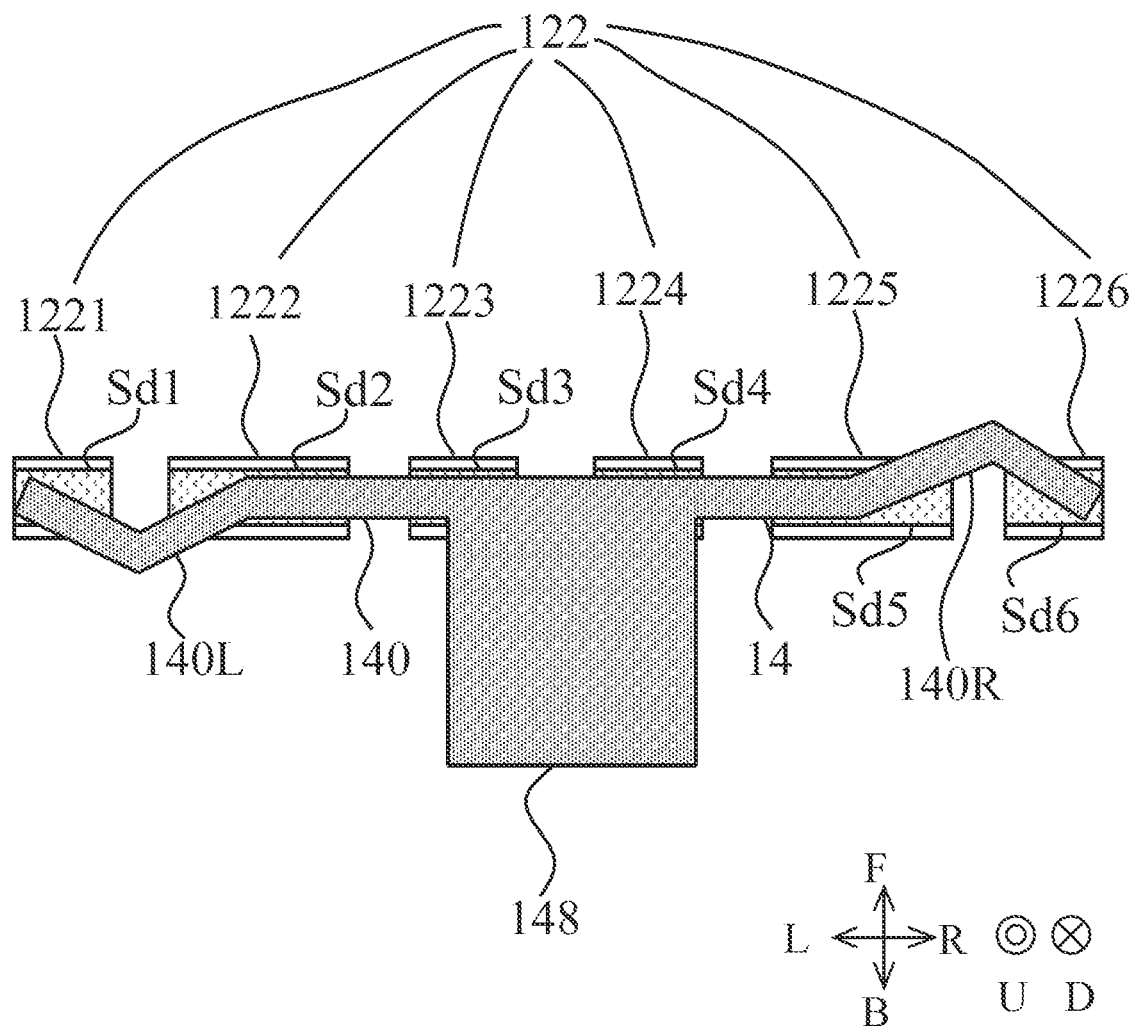
FIG. 12 is a top view of the metal member 14, the solders Sd1 to Sd6, and the mounting electrode 122 at the time of manufacturing.

Next, a method for manufacturing the module 10 will be described with reference to the drawings. FIG. 10 is a perspective view at the time of manufacturing the metal member 14. FIG. 11 is a view of the metal member 14 at the time of manufacturing when viewed from the forward direction. FIG. 12 is a top view of the metal member 14 and the mounting electrode 122 at the time of manufacturing.

First, in a first step, the substrate 12 is prepared. The electronic components 16a to 16e are mounted on the upper main surface SU2 of the substrate 12. A plurality of external terminals ET are provided on the lower main surface SD2 of the substrate 12. The vias v1 to v6, v11, v12, v21, and v22 and the signal conductor layers SC1 and SC2 are provided in the substrate 12.

In the next step, as illustrated in FIG. 9, the metal member 14 provided to extend in the up-down direction on the upper main surface SU2 of the substrate 12 and provided between the electronic components 16a and 16b and the electronic components 16c, 16d, and 16e is mounted on the substrate 12.

Here, the metal member 14 at the time of manufacturing the module 10 will be described. At the time of manufacturing the module 10, the metal member 14 further includes a top surface portion 148 (see FIGS. 10 and 11). As illustrated in FIGS. 10 and 11, a top surface portion 148 is located between the upper notch 142*a* and the upper notch 142*b* when viewed in the front-back direction. The top surface portion 148 extends in the backward direction from the upper side LU (see FIG. 11). The top surface portion 148 is formed by bending a part of the metal member 14 in the backward direction.

The top surface portion 148 is used for mounting the metal member 14. Specifically, the top surface portion 148 is sucked using a mounting machine. Then, the metal member 14 is moved by the mounting machine, and the foot portions 146L1, 146L2, 146*a* to 146*d*, 146R1, and 146R2 are set on the mounting electrode 122.

Thereafter, each of the foot portions 146L1, 146L2, 146*a* to 146*d*, 146R1, and 146R2 is fixed to the mounting electrode 122 by the solders Sd1 to Sd6. At this time, solder is applied to each of the foot portions 146L1, 146L2, 146*a* to 146*d*, 146R1, and 146R2, and solder is also applied to the mounting electrode 122.

At this time, as illustrated in FIG. 12, the mounting electrodes 1222 to 1225 and the solders Sd2 to Sd5 overlapping the plate-shaped portion 140 when viewed in the up-down direction are located near the center of the plate-shaped portion 140 in the front-back direction. As a result, the force in the forward direction of pulling the metal member 14 by the solders Sd2 to Sd5 and the force in the backward direction of pulling the metal member 14 by the solders Sd2 to Sd5 tend to be equal. As a result, self-standing ability of the metal member 14 is improved.

Note that the top surface portion 148 may extend in the backward direction from the plate-shaped portion 140.

Next, in a second step, the sealing resin layer 18 is formed on the upper main surface SU2 of the substrate 12. At this time, the sealing resin layer 18 is formed so that the sealing resin layer 18 covers the entire upper main surface SU2 of the substrate 12. Specifically, the substrate 12 is set in a mold. Then, a resin (molten resin) which is melted is injected into the mold. At this time, the molten resin passes through the upper notches 142*a* and 142*b* and the lower notches 144*a* to 144*c*, 144L, and 144R and spreads over the entire upper main surface SU2 of the substrate 12. Then, the electronic components 16*a* to 16*e* and the metal member 14 are located in the sealing resin layer 18. That is, the electronic components 16*a* to 16*e* and the metal member 14 are not exposed from the sealing resin layer 18.

Next, in a third step, the upper main surface SU of the sealing resin layer 18 is ground with a grindstone. For example, the grindstone grinds the upper surface SU1 of the sealing resin layer 18 while moving in the forward direction with respect to the upper surface SU1 of the sealing resin layer 18. Thus, the upper end of the metal member 14 is exposed from the upper surface SU1 of the sealing resin layer 18. When the upper surface SU1 of the sealing resin layer 18 is ground, the top surface portion 148 of the metal member 14 is ground. Specifically, the sealing resin layer 18 is ground while moving the grindstone in the forward direction with respect to the sealing resin layer 18.

The upper end of the metal member 14 is scraped by a grindstone. Therefore, the surface roughness of the upper end of the plate-shaped portion 140 is larger than the surface roughness of the front main surface SF3 and the back main surface SB3 of the plate-shaped portion 140.

Further, in a fourth step, by cutting the substrate 12 and the sealing resin layer 18 in the up-down direction using a dicer, the substrate 12 and the sealing resin layer 18 are divided. At this time, the left surface SL1, the right surface SR1, the front surface SF1, and the back surface SB1 of the sealing resin layer 18 are formed. The left end of the left support portion 140L and the right end of the right support portion 140R are exposed from the left surface SL1 and the right surface SR1 of the sealing resin layer 18, respectively.

Next, in a fifth step, the shield 20 is formed on the upper surface SU1, the left surface SL1, the right surface SR1, the front surface SF1, and the back surface SB1 of the sealing resin layer 18. Specifically, the adhesion layer, the conductive layer, and the protective layer are formed by performing sputtering three times. As described above, the surface roughness of the upper end of the metal member 14, the left end of the left support portion 140L, and the right end of the right support portion 140R is larger than the surface roughness of the front main surface SF3 and the back main surface SB3 of the metal member 14. Therefore, the adhesion layer adheres to the upper end of the metal member 14, the left end of the left support portion 140L, and the right end of the right support portion 140R with high adhesion strength.

Through the above steps, the module 10 is completed.

[Effects]

According to the metal member 14, self-standing ability of the metal member 14 is enhanced. More specifically, the right support portion 140R of the metal member 14 includes the first portion RFP extending in the forward direction and in the right direction from the right boundary CR1. As a result, when the metal member 14 is pushed in the forward direction, the first portion RFP supports the metal member 14. Therefore, the metal member 14 is less likely to rotate in the forward direction around the upper side LU. Therefore, the possibility that the metal member 14 falls down toward the forward direction is reduced. For the same reason, the first portion LFP prevents the metal member 14 from falling in the backward direction. As a result, the self-standing ability of the metal member 14 is improved by the right support portion 140R or the left support portion 140L of the present embodiment.

According to the metal member 14, self-standing ability of the metal member 14 is enhanced. More specifically, the right support portion 140R includes the second portion RSP. As a result, the weight of the metal member 14 increases. In this case, the downward force applied to the metal member 14 becomes strong. Therefore, the metal member 14 is less likely to be affected by the force in the front-back direction applied to the metal member 14. For the same reason, the metal member 14 is less likely to be affected by the force in the front-back direction applied to the metal member 14 by the second portion LSP, and as a result, the self-standing ability of the metal member 14 is improved by the right support portion 140R or the left support portion 140L of the present embodiment.

According to the metal member 14, self-standing ability of the metal member 14 is enhanced. More specifically, the right support portion 140R includes the second portion RSP. Since the right support portion 140R has the second portion RSP, the area of the solder in contact with the metal member 14 increases. This increases the force of the solder supporting the metal member 14. Accordingly, self-standing ability of the metal member 14 is enhanced.

According to the module 10 provided with the metal member 14, the degree of freedom in the layout of the electronic components in the module 10 is increased. More specifically, the metal member 14 includes the right support portion 140R having the first portion RFP and the second portion RSP. Hereinafter, the metal member (hereinafter, it is referred to as Comparative Example 1) not including the right support portion 140R and the metal member 14 will be described in comparison. In the case of Comparative Example 1, it is necessary to fold the lower end portions of all the foot portions in the forward direction or the backward direction in order to enhance the self-standing ability of Comparative Example 1. In this case, in order to enhance the self-standing ability of the comparative example, it is necessary to greatly protrude the foot portion in the forward direction or the backward direction. Therefore, in the case of the module including Comparative Example 1, there is a possibility that the area in which the electronic component can be mounted on the substrate is reduced.

On the other hand, in the metal member 14, the right support portion 140R has the first portion RFP and the second portion RSP, thereby securing self-standing ability. Therefore, the lower end portions of the foot portions 146L1, 146L2, 146a to 146d, 146R1, and 146R2 of the metal member 14 need not be bent in the forward direction or backward direction. Thus, the metal member 14 does not greatly protrude in the forward direction or the backward direction. Therefore, in the case of the module 10 including the metal member 14, the area where the electronic component can be mounted on the substrate 12 is not narrowed. As a result, the degree of freedom in the layout of the electronic components in the module 10 is increased. For the same reason, since the metal member 14 includes the left support portion 140L having the first portion LFP and the second portion LSP, self-standing ability is secured. As a result, in order to secure the self-standing ability of the metal member 14, it is not necessary to greatly protrude the foot portions 146L1, 146L2, 146a to 146d, 146R1, and 146R2 of the metal member 14 in the forward direction or the backward direction. In the case of the module 10 including the metal member 14, the area where the electronic component can be mounted on the substrate is not narrowed. As a result, the degree of freedom in the layout of the electronic components in the module 10 is increased.

Further, when the right support portion 140R includes the right support foremost portion X1 located at a foremost in the right support portion 140R and located in front of the plate-shaped portion 140 when viewed in the up-down direction, self-standing ability of the metal member 14 is enhanced. Therefore, the self-standing ability of the metal member 14 can be secured without greatly protruding the right support portion 140R in the forward direction. Therefore, as compared with Comparative Example 1, the amount of protrusion of the metal member 14 in the forward direction or the backward direction can be minimized.

In addition, by increasing the area of the right support portion 140R, the pressing pressure of the metal member 14 into the solder can be dispersed. In other words, since the right support portion 140R has the first portion RFP extending in the forward direction and the second portion RSP extending in the backward direction, the area of the lower end of the metal member 14 increases. This makes it possible to disperse the pressing pressure of the metal member 14 into the solder. Similarly, since the left support portion 140L has the first portion LFP extending in the backward direction and the second portion LSP extending in the forward direction, it is possible to disperse the pressing pressure of the metal member 14 to the solder.

According to the metal member 14, self-standing ability of the metal member 14 is enhanced. More specifically, the right support portion 140R has the first portion RFP and the second portion RSP extending in the backward direction. Further, at the time of forming the sealing resin layer 18, the molten resin passes through the lower notches 144R and 144L and spreads over the entire upper main surface SU2 of the substrate 12. At this time, the molten resin flows along the shape of the right support portion 140R. That is, a part of the molten resin flowing from the forward direction to the backward direction flows in the left direction by the first portion RFP. Then, a part of the molten resin flowing from the forward direction to the backward direction flows in the right direction by the second portion RSP. Therefore, the pressure by the molten resin can be dispersed in two directions (the right direction and the left direction). As a result, the pressure due to the molten resin is not concentrated in the vicinity of the lower side LD of the right support portion 140R and the left support portion 140L. Therefore, the metal member 14 is suppressed from falling so as to rotate about the upper side LU. As a result, self-standing ability of the metal member 14 is improved.

According to the module 10 provided with the metal member 14, the degree of freedom in the layout of the electronic components in the module 10 is increased. Generally, the electronic component needs to be disposed at a predetermined distance from the end portion of the substrate 12. On the other hand, the right support portion 140R can be disposed at an end portion of the substrate 12. Therefore, by disposing the right support portion 140R at the end portion of the substrate 12 where the electronic component cannot be disposed, it is possible to prevent the area of the region where the electronic component can be disposed from being narrowed. As a result, the degree of freedom in the layout of the electronic components in the module 10 is increased. In other words, by disposing the right support portion 140R for enhancing the self-standing ability of the metal member 14 at the end portion of the substrate 12, the degree of freedom in the layout of the electronic components in the module 10 is increased. For the same reason, by disposing the left support portion 140L for enhancing the self-standing ability of the metal member 14 at the end portion of the substrate 12, the degree of freedom in the layout of the electronic components in the module 10 is increased.

According to the module 10 provided with the metal member 14, the degree of freedom in the layout of the electronic components in the module 10 is increased. The right support portion 140R has the first portion RFP extending in the forward direction and the second portion RSP extending in the backward direction. With this shape, the right support portion 140R can have high self-standing ability even if it does not greatly protrude only in the forward direction or the backward direction. Since the right support portion 140R does not greatly protrude only in the forward direction or the backward direction, a region (area) where the electronic component can be mounted increases on the upper main surface SU2 of the substrate 12. As a result, the metal member 14 of the present embodiment can increase the degree of freedom in the layout of the electronic component. For the same reason, since the left support portion 140L has the first portion LFP extending in the backward direction and the second portion LSP extending in the forward direction, a region (area) in which the electronic component can be mounted in the module 10 increases.

According to the module 10 provided with the metal member 14, the degree of freedom in the layout of the electronic components in the module 10 is increased. More specifically, when the right support portion 140R forms an angle at the right end CR2 of the first portion RFP when viewed in the up-down direction, the angle $R\theta2$ at the corner formed by the second straight line RS2 and the third straight line RS3 in the right support portion 140R is larger than the angle $R\theta1$ at the corner formed by the first straight line RS1 and the second straight line RS2 in the right support portion 140R. In this case, a part of the right support portion 140R is not formed before the right end CR2 of the first portion RFP (the second portion RSP is not located before the right end CR2 of the first portion RFP). Hereinafter, the metal member (hereinafter, it is referred to as Comparative Example 2) in which a part of the right support portion 140R is located before the right end CR2 of the first portion RFP and the metal member 14 will be described in comparison. In the case of Comparative Example 2, the second portion is located before the first portion. In other words, in Comparative Example 2, the first portion and the second portion greatly protrude in the forward direction. In this case, it is necessary to move the electronic component away from Comparative Example 2 by the length of the electronic component protruding in the forward direction. Therefore, there is a possibility that the degree of freedom in arrangement of the electronic component is limited. On the other hand, in the case of the metal member 14, the second portion RSP is not located ahead of the first portion RFP. Specifically, the second portion RSP bends in the backward direction at the right end CR2 of the first portion RFP. That is, the metal member 14 does not greatly protrude in the forward direction. Therefore, in the upper main surface SU2 of the substrate 12, a region (area) where the electronic component can be mounted increases. As a result, the metal member 14 of the present embodiment can increase the degree of freedom in the layout of the electronic component.

When the left support portion 140L forms a corner at the left end CL2 of the first portion LFP when viewed in the up-down direction, the angle L$\theta$2 of the corner formed by the second straight line LS2 and the third straight line LS3 in the left support portion 140L is larger than the angle L$\theta$1 of the corner formed by the first straight line LS1 and the second straight line LS2 in the left support portion 140L. In this case, the left support portion 140L is not formed behind the left end CL2 of the first portion LFP (the second portion LSP is not located behind the left end CL2 of the first portion LFP). Hereinafter, a metal member (hereinafter, it is referred to as Comparative Example 3) in which a part of the left support portion 140L is located behind the left end CL2 of the first portion LFP and the metal member 14 will be described in comparison. In the case of Comparative Example 3, the second portion is located behind the first portion. In other words, Comparative Example 3 greatly protrudes in the backward direction by the first portion and the second portion. In this case, it is necessary to move the electronic component away from Comparative Example 3 by the length of the electronic component protruding in the backward direction. Therefore, there is a possibility that the degree of freedom in arrangement of the electronic components is limited. On the other hand, in the case of the metal member 14, the second portion LSP is not located behind the first portion LFP. Specifically, the second portion LSP bends in the forward direction at the left end CL2 of the first portion LFP. That is, the metal member 14 does not greatly protrude in the backward direction. Therefore, in the upper main surface SU2 of the substrate 12, a region (area) where the electronic component can be mounted increases. As a result, the metal member 14 of the present embodiment can increase the degree of freedom in the layout of the electronic component.

According to the module 10, it is possible to suppress the metal member 14 from falling at the time of forming the sealing resin layer 18. More specifically, the plate-shaped portion 140 is provided with the upper notches 142a and 142b extending in the downward direction from the upper side LU. The plate-shaped portion 140 is provided with one or more lower notches 144a to 144c extending in the upward direction from the lower side LD. Thus, at the time of forming the sealing resin layer 18, the molten resin passes through the upper notches 142a and 142b and the lower notches 144a to 144c and spreads over the entire upper main surface SU2 of the substrate 12. Therefore, the vicinity of the upper side LU and the vicinity of the lower side LD of the plate-shaped portion 140 are less likely to receive the pressure due to the molten resin. This prevents the plate-shaped portion 140 from falling so as to rotate about the upper side LU or the plate-shaped portion 140 from falling so as to rotate about the lower side LD. As a result, according to the module 10, it is possible to suppress the metal member 14 from falling at the time of forming the sealing resin layer 18.

According to the module 10, the potential of the metal member 14 tends to be uniform. More specifically, the foot portions 146a to 146c are arranged at equal intervals in the left-right direction when viewed in the front-back direction. The foot portions 146a to 146c are connected to the ground potential via the mounting electrode 122. Thus, the metal member 14 is connected to the ground potential at portions arranged at equal intervals in the left-right direction when viewed in the front-back direction. As a result, according to the module 10, the potential of the metal member 14 tends to be uniform.

According to the metal member 14, the self-alignment property of the foot portions 146a to 146d is improved. More specifically, the foot portions 146a to 146d are arranged at equal intervals in the left-right direction when viewed in the front-back direction. Thus, when the solder melts in the mounting of the metal member 14, the solder attached to the lower end portions of the foot portions 146a to 146d has a symmetrical structure. In this case, a difference in force pulled by the solder hardly occurs between the left part of the plate-shaped portion 140 and the right part of the plate-shaped portion 140 (the pulling force is not concentrated on either the right part or the left part of the plate-shaped portion 140). That is, when solder is melted in mounting of the metal member 14, self-standing ability of the metal member 14 is secured. As a result, according to the metal member 14, the self-alignment property of the foot portions 146a to 146d is improved. The self-alignment property means that when solder is melted in mounting of the metal member 14, the foot portions 146a to 146d are maintained in an appropriate posture by surface tension of the solder.

According to the module 10, it is possible to suppress the metal member 14 from falling at the time of forming the sealing resin layer 18. More specifically, in the module 10, the lower notches 144a to 144c are arranged at equal intervals in the left-right direction when viewed in the front-back direction. Thus, the vicinity of the lower side LD of the plate-shaped portion 140 receives equal pressure from the molten resin. As a result, the plate-shaped portion 140 is suppressed from falling due to application of a large pressure to a specific portion in the vicinity of the lower side LD of the plate-shaped portion 140.

According to the module 10, the metal member 14 can be easily processed. More specifically, the shortest distance between the upper notches 142a and 142b and the lower notches 144a to 144c is 1.5 times or more the plate thickness of the plate-shaped portion 140. Thus, the upper notches 142a and 142b and the lower notches 144a to 144c are not too close to each other. As a result, punching of the metal member 14 is facilitated.

In addition, since the upper notches 142a and 142b are provided in the plate-shaped portion 140, the total length of the upper ends of the metal member 14b in the left-right direction is short. Therefore, when the upper surface SU1 of the sealing resin layer 18 is ground, the amount of grinding the metal member 14 is reduced. As a result, deterioration of the grindstone is suppressed.

In the module 10, since the area of the mounting electrode 122 is large, the solder on the mounting electrode 122 is located on the front, back, left, and right of the foot portions 146L1, 146L2, 146a to 146d, 146R1, and 146R2. As a result, the solder easily wets upward on the side surfaces of the foot portions 146L1, 146L2, 146a to 146d, 146R1, and 146R2.

In the module 10, the washing property of the flux is improved. More specifically, after the metal member 14 is mounted on the mounting electrode 122, the substrate 12 and the metal member 14 are immersed in a tank containing a flux cleaning solution. Thus, the flux is washed. At this time, in order to improve the washing property of the flux, it is preferable that the fluidity of the flux cleaning solution is high. Therefore, the upper notches 142a and 142b and the lower notches 144L, 144R, and 144a to 144c are provided in the metal member 14. Thus, the flux cleaning solution can pass through the upper notches 142a and 142b and the lower notches 144L, 144R, and 144a to 144c. Therefore, the fluidity of the flux cleaning solution is improved. As a result, in the module 10, the flux washing property is improved. Further, the flux cleaning solution remaining at the bent portion of the top surface portion 148 flows out from the bent portion of the top surface portion 148 through the upper notches 142a and 142b.

In the right support portion 140R illustrated in FIGS. 2 and 3, the position of the right end of the right support portion 140R in the front-back direction is substantially the same as the position of the plate-shaped portion 140 in the front-back direction. In other words, the second portion RSP extends from the first portion RFP such that the position of the right end of the second portion RSP in the front-back direction is the same as the position of the plate-shaped portion 140 in the front-back direction. The length of the second portion RSP extending from the first portion RFP may be short. Specifically, the second portion RSP may be located in front of the plate-shaped portion 140. In this case, the length of the mounting electrode 122b in the left-right direction can be shortened as the second portion RSP is short. Therefore, the degree of freedom in the arrangement of the metal member 14 can be increased.

Embodiment of Example 2

Figure 13:
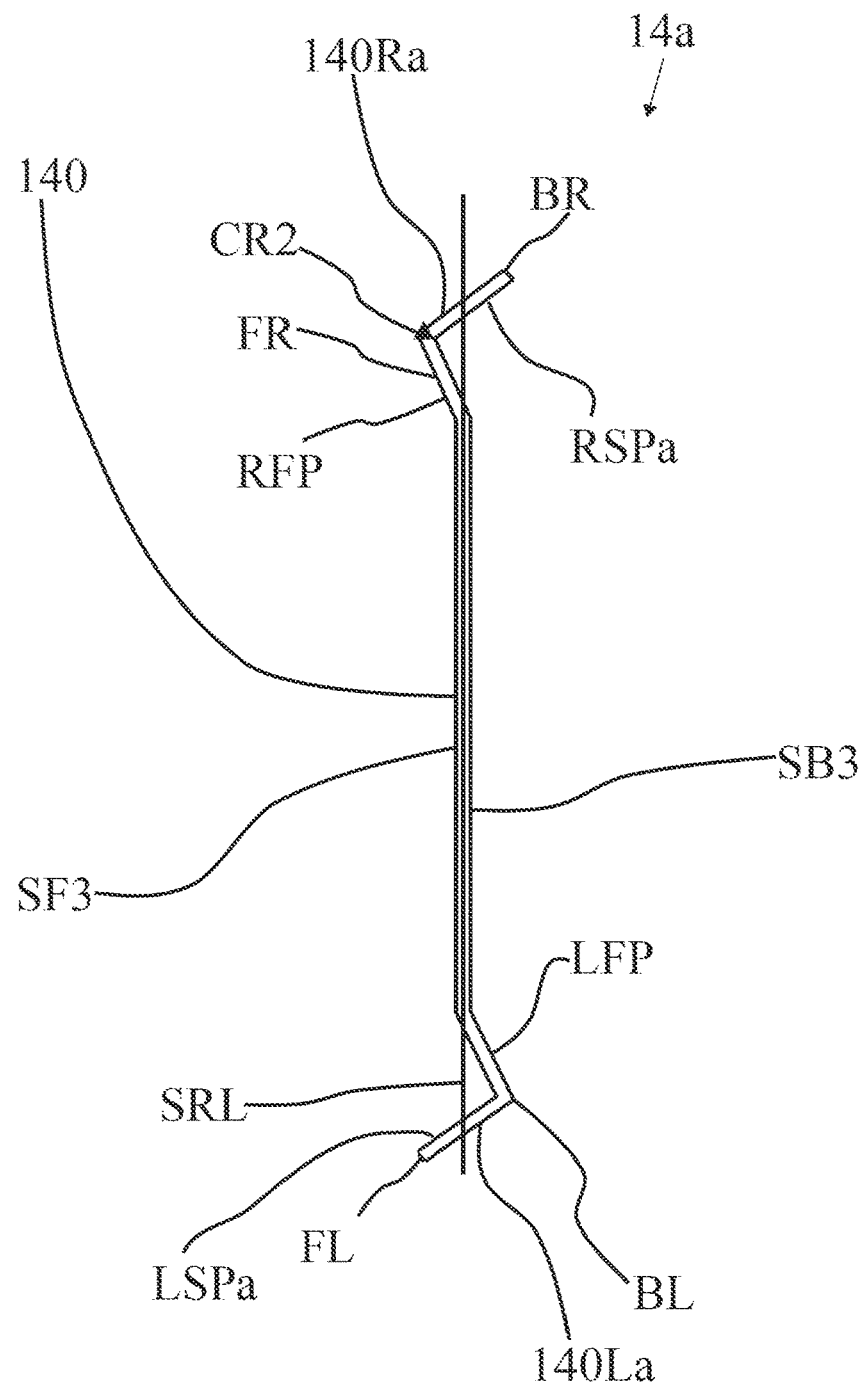
FIG. 13 is a top view of a metal member 14a according to an embodiment of Example 2.
Figure 13:
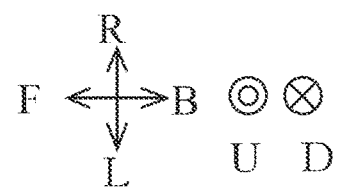

Hereinafter, a metal member 14a according to an embodiment of Example 2 will be described with reference to the drawings. FIG. 13 is a top view of the metal member 14a according to the embodiment of Example 2.

The metal member 14a is different from the metal member 14 in including a right support portion 140Ra having a different shape from the right support portion 140R. Similarly, the metal member 14a is different from the metal member 14 in including a left support portion 140La having a different shape from the left support portion 140L. Note that portions of the metal member 14a having the same configurations as those of the metal member 14 are denoted by the same reference numerals as those of the metal member 14, and description thereof is omitted.

The right support portion 140Ra includes a second portion RSPa having a different shape from the second portion RSP. More specifically, the right end of the second portion RSPa is located behind the plate-shaped portion 140. As a result, the right support portion 140Ra includes a right support front portion FR and a right support rear portion BR as illustrated in FIG. 13. As illustrated in FIG. 13, the right support front portion FR is located in front of the plate-shaped portion 140.

Specifically, when a straight line SRL including a line passing over the plate-shaped portion 140 when viewed in the up-down direction is defined, the right support front portion FR is located before the straight line SRL. In this case, the right support front portion FR includes a part of the second portion RSPa and the first portion RFP as illustrated in FIG. 13.

As illustrated in FIG. 13, the right support rear portion BR is located behind the straight line SRL. In this case, the right support rear portion BR includes a part of the second portion RSPa as illustrated in FIG. 13.

Similarly to the right support portion 140Ra, the left support portion 140La includes a second portion LSPa having a shape different from that of the second portion LSP. More specifically, the left end of the second portion LSPa is located in front of the plate-shaped portion 140. As a result, the left support portion 140La includes a left support front portion FL and a left support rear portion BL as illustrated in FIG. 13. As illustrated in FIG. 13, the left support rear portion BL is located behind the straight line SRL. In this case, the left support rear portion BL includes a part of the second portion LSPa and the first portion LFP as illustrated in FIG. 13.

As illustrated in FIG. 13, the left support front portion FL is located in front of the straight line SRL. In this case, as illustrated in FIG. 13, the left support front portion FL includes a part of the second portion LSPa.

The metal member 14a may not necessarily include both the right support portion 140Ra and the left support portion 140La. The metal member 14a may include at least one of the right support portion 140Ra and the left support portion 140La.

Effects of Embodiment of Example 2

According to the metal member 14a, self-standing ability of the metal member 14a is improved. More specifically, the right support portion 140Ra includes the right support front portion FR and the right support rear portion BR. As a result, it is possible to prevent the upper side of the metal member 14 from falling so as to rotate in the backward direction. Alternatively, the left support portion 140La includes the left support front portion FL and the left support rear portion BL. As a result, it is possible to prevent the upper side of the metal member 14 from falling so as to rotate in the forward direction. As described above, the self-standing ability of the metal member 14a is enhanced.

Embodiment of Example 3

Figure 14:
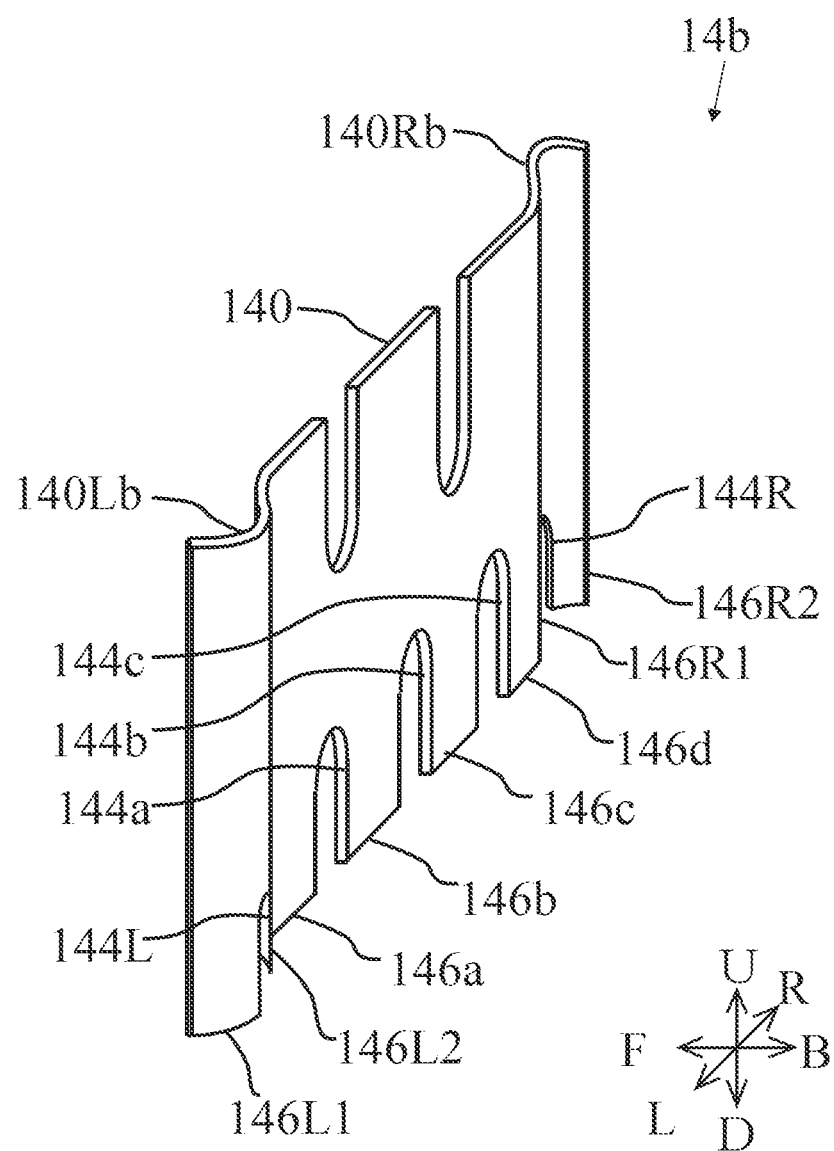
FIG. 14 is a perspective view of a metal member 14b according to an embodiment of Example 3.
Figure 15:
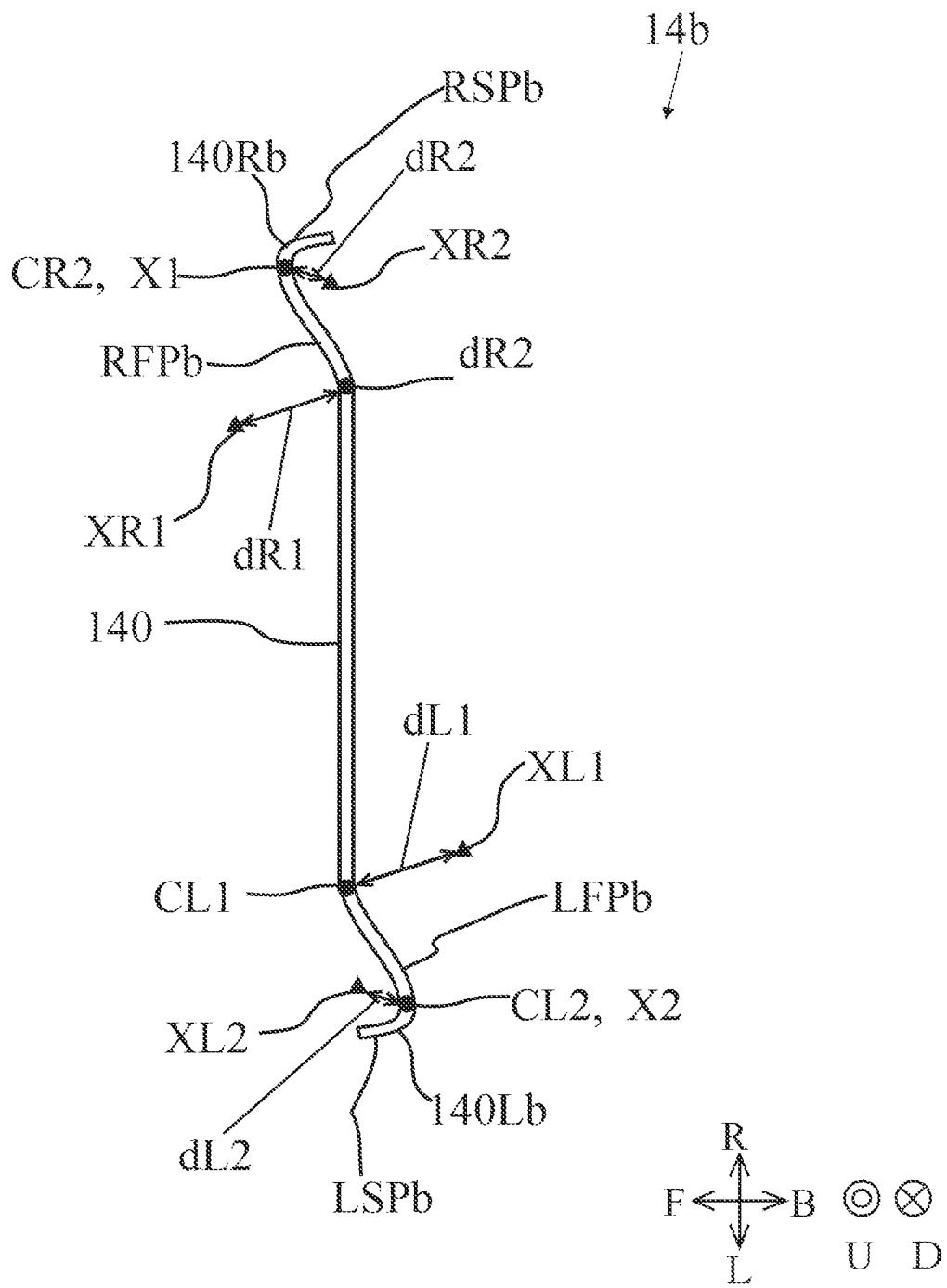
FIG. 15 is a top view of a metal member 14b according to an embodiment of Example 3.

Hereinafter, a metal member 14b according to an embodiment of Example 3 will be described with reference to the drawings. FIG. 14 is a perspective view of the metal member 14b according to an embodiment of Example 3. FIG. 15 is a top view of the metal member 14b according to the embodiment of Example 3.

As illustrated in FIGS. 14 and 15, the metal member 14b is different from the metal member 14 in including a right support portion 140Rb having a different shape from the right support portion 140R. Similarly, the metal member 14b is different from the metal member 14 in including a left support portion 140Lb having a shape different from that of the left support portion 140L.

As illustrated in FIGS. 14 and 15, the shape of a first portion RFPb of the right support portion 140Rb is different from the shape of the first portion RFP of the right support portion 140R. The shape of a second portion RSPb of the right support portion 140Rb is different from the shape of the second portion RSP of the right support portion 140R.

As illustrated in FIG. 15, the shapes of the first portion RFPb and the second portion RSPb are arc shapes when viewed in the up-down direction. Specifically, as illustrated in FIG. 15, a part of the first portion RFPb draws an arc around a first point XR1 when viewed in the up-down direction at the right boundary CR1.

As illustrated in FIG. 15, a part of the second portion RSPb draws an arc around a second point XR2 when viewed in the up-down direction at the right end CR2 (right support foremost portion X1) of the first portion RFPb.

At this time, the degree of bending of the right support portion 140Rb in the vicinity of the right end CR2 of the first portion RFPb is larger than the degree of bending of the right support portion 140Rb in the vicinity of the right boundary CR1.

Specifically, as illustrated in FIG. 15, a part of the first portion RFPb becomes an arc (first arc in the right support portion 140Rb) around the first point XR1 at the right boundary CR1 when viewed in the up-down direction. In this case, as illustrated in FIG. 15, a curvature radius dR1 of the arc around the first point XR1 when viewed in the up-down direction can be defined.

Similarly, as illustrated in FIG. 15, a part of the second portion RSPb becomes an arc (second arc in the right support portion 140Rb) around the second point XR2 at the right end CR2 (right support foremost portion X1) of the first portion RFPb when viewed in the up-down direction. In this case, as illustrated in FIG. 15, a curvature radius dR2 of the arc around the second point XR2 when viewed in the up-down direction can be defined.

The curvature radius dR2 is smaller than the curvature radius dR1.

Similarly to the right support portion 140Rb, a first portion LFPb and a second portion LSPb of the left support portion 140Lb have arc shapes when viewed in the up-down direction as illustrated in FIG. 15.

As illustrated in FIG. 15, the first portion LFPb of the left support portion 140Lb draws an arc (first arc in the left support portion 140Lb) around a first point XL1 at the left boundary CL1 when viewed in the up-down direction.

As illustrated in FIG. 15, a part of the second portion LSPb draws an arc (second arc in the left support portion 140Lb) around a second point XL2 at the left end CL2 (left support rearmost portion X2) of the first portion LFPb when viewed in the up-down direction.

At this time, the degree of bending of the left support portion 140Lb in the vicinity of the left end CL2 of the first portion LFPb is larger than the degree of bending of the left support portion 140Lb in the vicinity of the left boundary CL1.

Specifically, a part of the first portion LFPb becomes an arc around the first point XL1 at the left boundary CL1. In this case, a curvature radius dL1 of the arc around the first point XL1 when viewed in the up-down direction can be defined.

Similarly, a part of the second portion LSPb becomes an arc around the second point XL2 in the vicinity of the left end CL2 of the first portion LFPb. In this case, a curvature radius dL2 of the arc around the second point XL2 when viewed in the up-down direction can be defined. The curvature radius dL2 is smaller than the curvature radius dL1.

Effects of Embodiment of Example 3

According to the metal member 14b, the strength of the metal member 14b is increased. More specifically, the right support portion 140Rb is bent in an arc shape in the vicinity of the right boundary CR1 and in the vicinity of the right end CR2 of the first portion RFPb. As a result, no corner is formed at the right boundary CR1 and the right end CR2 of the first portion RFPb when viewed in the up-down direction. As a result, it is possible to reduce the possibility that breakage occurs at the right boundary CR1 and the right end CR2 of the first portion RFPb. Therefore, the strength of the metal member 14b is increased.

The left support portion 140Lb is bent in an arc shape in the vicinity of the left boundary CL1 and in the vicinity of the left end CL2 of the first portion LFPb. As a result, no corner is formed at the left boundary CL1 and the left end CL2 of the first portion LFPb when viewed in the up-down direction. As a result, it is possible to reduce the possibility that breakage occurs at the left boundary CL1 and the left end CL2 of the first portion LFPb. Therefore, the strength of the metal member 14b is increased.

According to the module 10 provided with the metal member 14b, the degree of freedom in the layout of the electronic components in the module 10 is increased. More specifically, the curvature radius dR2 of the arc of the right support portion 140Rb drawn around the second point XR2 is smaller than the curvature radius dR1 of the arc of the right support portion 140Rb drawn around the first point XR1. In this case, the right support portion 140Rb is not formed before the right end CR2 of the first portion RFPb (the second portion RSPb is not located before the right end CR2 of the first portion RFPb). Hereinafter, the metal member (hereinafter, it is referred to as Comparative Example 4) in which a part of the right support portion 140Rb is located before the right end CR2 of the first portion RFPb and the metal member 14b will be described in comparison. In the case of Comparative Example 4, the second portion is located before the first portion. In other words, in Comparative Example 4, the first portion and the second portion greatly protrude in the forward direction. In this case, it is necessary to move the electronic component provided in the module away from Comparative Example 4 by the length protruding in the forward direction. Therefore, there is a possibility that restriction is applied to the arrangement of the electronic components. On the other hand, in the case of the metal member 14b, the second portion RSPb is not located before the first portion RFPb. Specifically, the second portion RSPb bends in the backward direction at the right end CR2 of the first portion RFPb. That is, the metal member 14 does not greatly protrude in the forward direction. Therefore, in the upper main surface SU2 of the substrate 12, a region (area) where the electronic component can be installed increases. As a result, the metal member 14b of the present embodiment can increase the degree of freedom in the layout of the electronic component.

The curvature radius dL2 of the arc of the left support portion 140Lb drawn around the second point XL2 is smaller than the curvature radius dL1 of the arc of the left support portion 140Lb drawn around the first point XL1. In this case, the left support portion 140L is not formed behind the left end CL2 of the first portion LFPb. For example, when the curvature radius dL2 is larger than the curvature radius dL1, the second portion LSPb is located behind the left end CL2 of the first portion LFPb (the second portion LSP is not located behind the left end CL2 of the first portion LFP). Hereinafter, a metal member (hereinafter, it is referred to as Comparative Example 5) in which a part of the left support portion 140L is located behind the left end CL2 of the first portion LFP and the metal member 14b will be described in comparison. In the case of Comparative Example 5, the second portion is located behind the first portion. In other words, Comparative Example 5 greatly protrudes in the backward direction by the first portion and the second portion. In this case, it is necessary to move the electronic component away from Comparative Example 5 by the length of the electronic component protruding in the backward direction. Therefore, there is a possibility that restriction is applied to the arrangement of the electronic components. On the other hand, in the case of the metal member 14b, the second portion LSPb is not located behind the first portion LFPb. Specifically, the second portion LSPb bends in the forward direction at the left end CL2 of the first portion LFPb. That is, the metal member 14b does not greatly protrude in the backward direction. Therefore, in the upper main surface SU2 of the substrate 12, a region (area) where the electronic component can be disposed increases. As a result, the metal member 14 of the present embodiment can increase the degree of freedom in the layout of the electronic component.

Embodiment of Example 4

Figure 16:
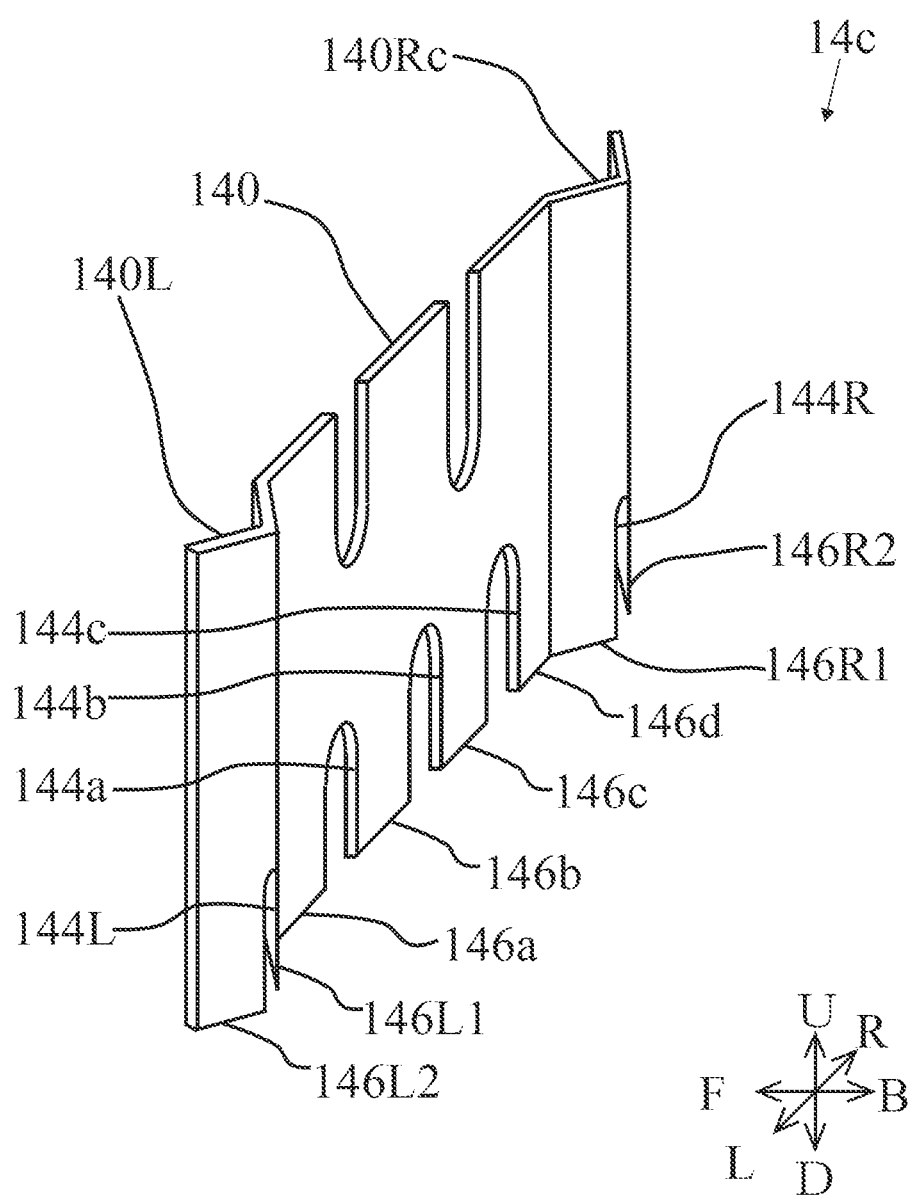
FIG. 16 is a perspective view of a metal member 14c according to an embodiment of Example 4.
Figure 17:
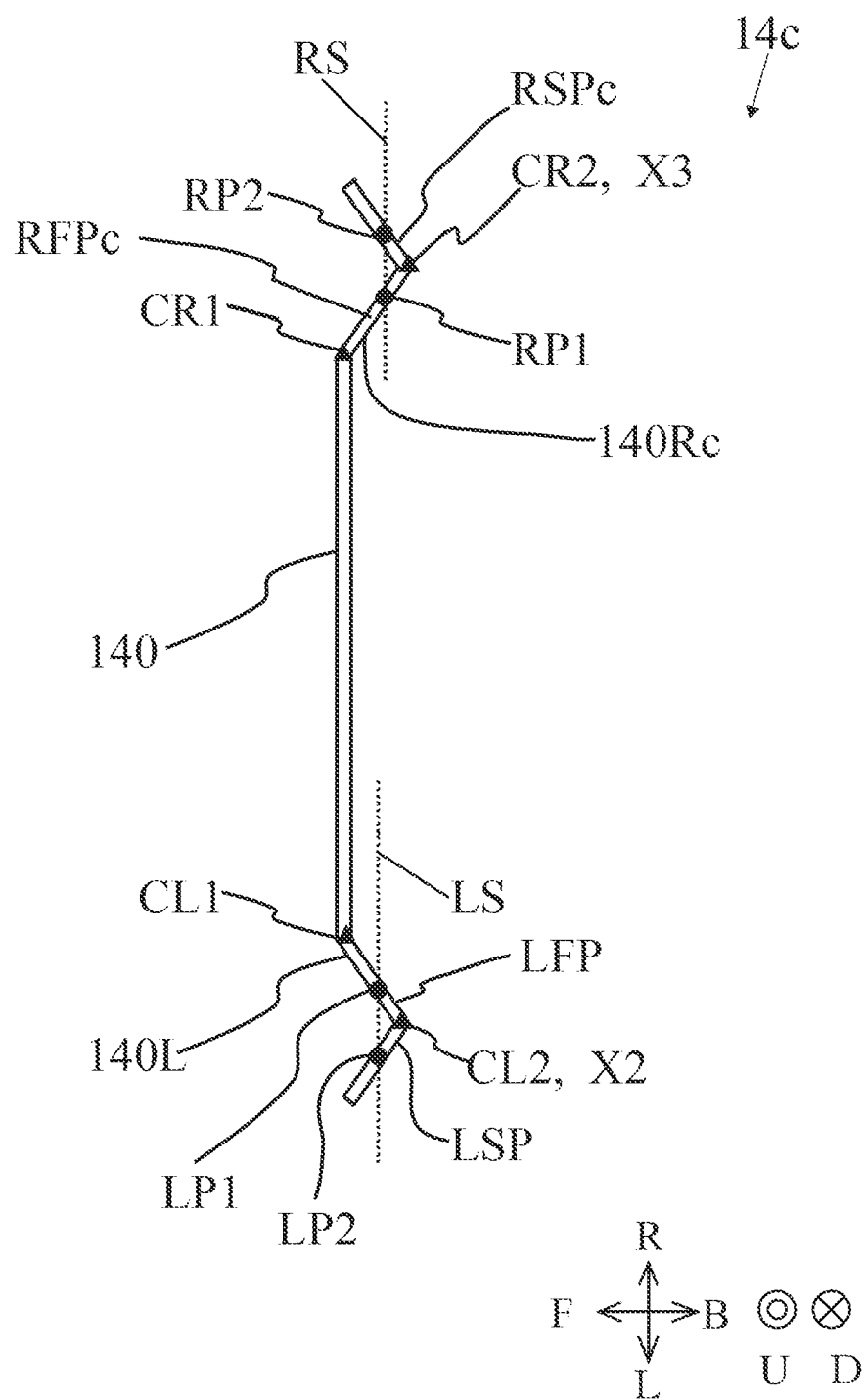
FIG. 17 is a top view of a metal member 14c according to an embodiment of Example 4.

Hereinafter, a metal member 14c according to an embodiment of Example 4 will be described with reference to the drawings. FIG. 16 is a perspective view of the metal member 14c according to an embodiment of Example 4. FIG. 17 is a top view of the metal member 14c according to the embodiment of Example 4. The same components as those of the metal member 14 are denoted by the same reference numerals, and description thereof is omitted.

As illustrated in FIGS. 16 and 17, the metal member 14c is different from the metal member 14 in including a right support portion 140Rc having a different shape from the right support portion 140R.

Specifically, as illustrated in FIG. 17, a first portion RFPc of the right support portion 140Rc bends in the backward direction from the right boundary CR1. Further, the right support portion 140Rc bends in the forward direction and in the right direction at the right end CR2 of the first portion RFPc when viewed in the up-down direction.

At this time, the metal member 14c is in the following state. The right support portion 140Rc has a right support rearmost portion X3. As illustrated in FIG. 17, the right support rearmost portion X3 is located at a foremost of the right support portion 140Rc. As illustrated in FIG. 17, the right support rearmost portion X3 is located behind the plate-shaped portion 140.

Further, the metal member 14c has the following state. The left support portion 140L has the left support rearmost portion X2. As illustrated in FIG. 17, the left support rearmost portion X2 is located in front of the left end of the left support portion 140L and the right end of the left support portion 140L. The left support rearmost portion X2 is located at a foremost of the left support portion 140L.

In other words, in the metal member 14c, both the right support portion 140Rc and the left support portion 140L have a shape in which the vicinity of the center in the left-right direction protrudes in the backward direction.

In the metal member 14c, both the right support portion 140Rc and the left support portion 140L may have a shape in which the vicinity of the center in the left-right direction protrudes in the forward direction.

Effects of Embodiment of Example 4

According to the metal member 14c, self-standing ability of the metal member 14c is enhanced. More specifically, in the case of the metal member 14c, the two support portions (the right support portion 140Rc and the left support portion 140L) are located in front of the plate-shaped portion 140. As a result, the possibility that the metal member 14c falls so as to rotate in the backward direction around the upper side LU is reduced. Accordingly, self-standing ability of the metal member 14c is enhanced.

Embodiment of Example 5

Figure 18:
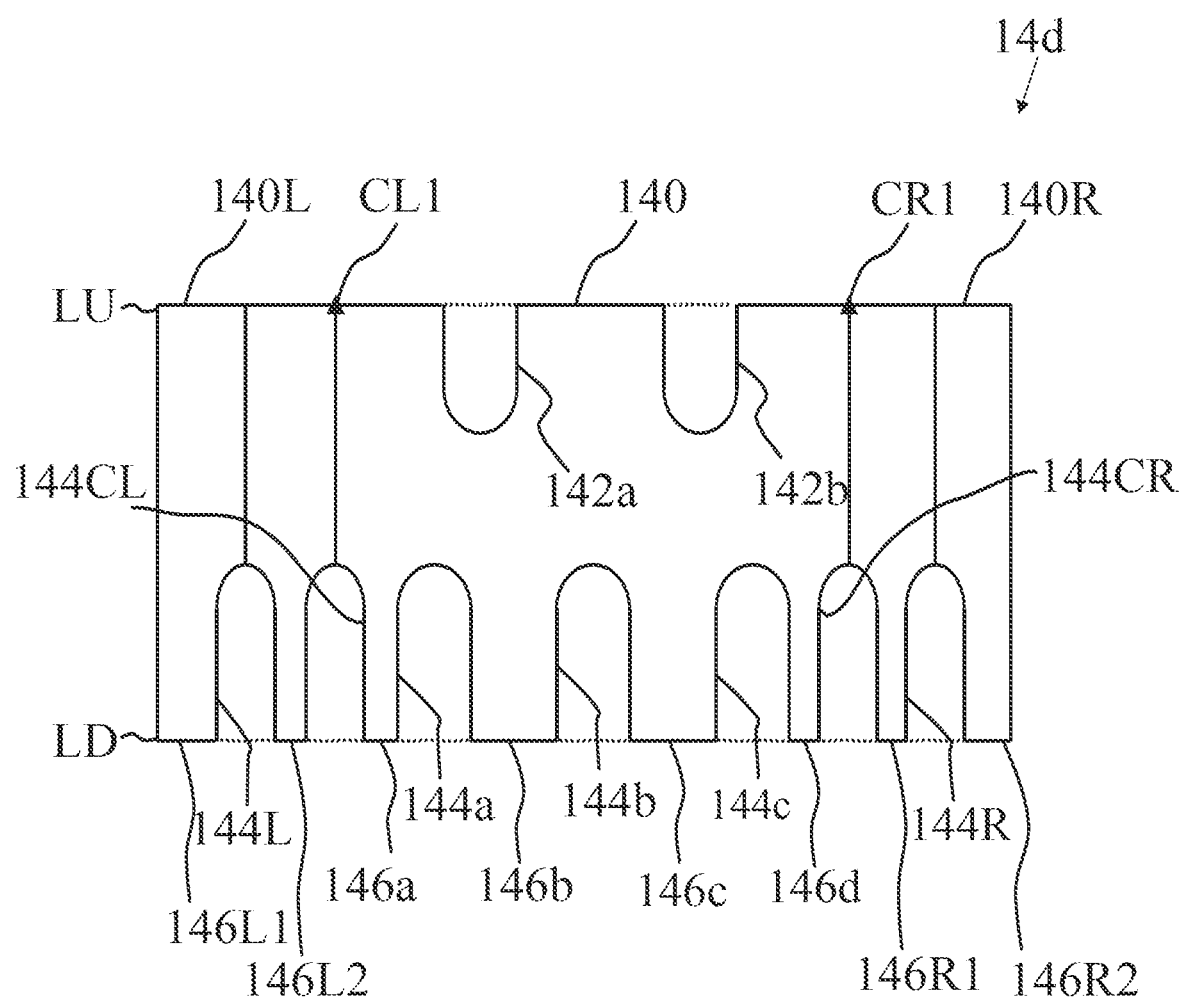
FIG. 18 is a view of a metal member 14d according to the embodiment of Example 5 when viewed in the forward direction.

Hereinafter, a metal member 14d according to an embodiment of Example 5 will be described with reference to the drawings. FIG. 18 is a view of a metal member 14d according to the embodiment of Example 5 when viewed in the forward direction.

The metal member 14d is different from the metal member 14a in that lower notches 144CR and 144CL (second lower notches) are provided. As illustrated in FIG. 18, the lower notch 144CR is provided at a position overlapping the right boundary CR1 when viewed in the up-down direction. Similarly, as illustrated in FIG. 18, the lower notch 144CL is provided at a position overlapping the left boundary CL1 when viewed in the up-down direction.

The shapes of the lower notches 144CR and 144CL viewed in the front-back direction substantially coincide with the shapes of the lower notches 144R and 144L viewed in the front-back direction.

Effects of Embodiment of Example 5

According to the metal member 14d, self-standing ability of the metal member 14d is improved. More specifically, the metal member 14d is provided with the lower notch 144CR at a position overlapping the right boundary CR1 (left end of the right support portion 140R) when viewed in the up-down direction. The metal member 14d is provided with the lower notch 144CL at a position overlapping the left boundary CL1 (right end of the left support portion 140L) when viewed in the up-down direction. In other words, in the metal member 14, a lower notch is provided at a bent portion. Thus, the module 10 can be manufactured without impairing the fluidity of the molten resin at the time of forming the sealing resin layer 18.

In the case of the above configuration, the right support portion 140R is provided with the lower notch 144R and the lower notch 144CR. The lower notch 144R is provided in a right support foremost portion X1 (a portion protruding in the forward direction in the metal member 14) of the right support portion 140R. In this case, when the sealing resin layer 18 is formed, the molten resin flowing from the backward direction to the forward direction gathers in the vicinity of the right support foremost portion X1. At this time, pressure in the forward direction is likely to be applied by the molten resin to the vicinity of the right support foremost portion X1 in the metal member 14. On the other hand, the lower notch 144CR is provided at the right boundary CR1 which is a corner in the backward direction in the metal member 14. In this case, when the sealing resin layer 18 is formed, the molten resin flowing from the forward direction to the backward direction gathers in the vicinity of the right boundary CR1. At this time, pressure in the backward direction is likely to be applied to the vicinity of the right boundary CR1 of the metal member 14 by the molten resin. In the above case, the pressure in the forward direction in the vicinity of the right support foremost portion X1 and the pressure in the backward direction in the vicinity of the right boundary CR1 are easily offset. As a result, the metal member 14d is suppressed from falling so as to rotate about the upper side LU. As a result, self-standing ability of the metal member 14d is improved.

(Modification 1 of Mounting Pattern of Mounting Electrode 122 and Solders Sd1 to Sd6)

Figure 19:
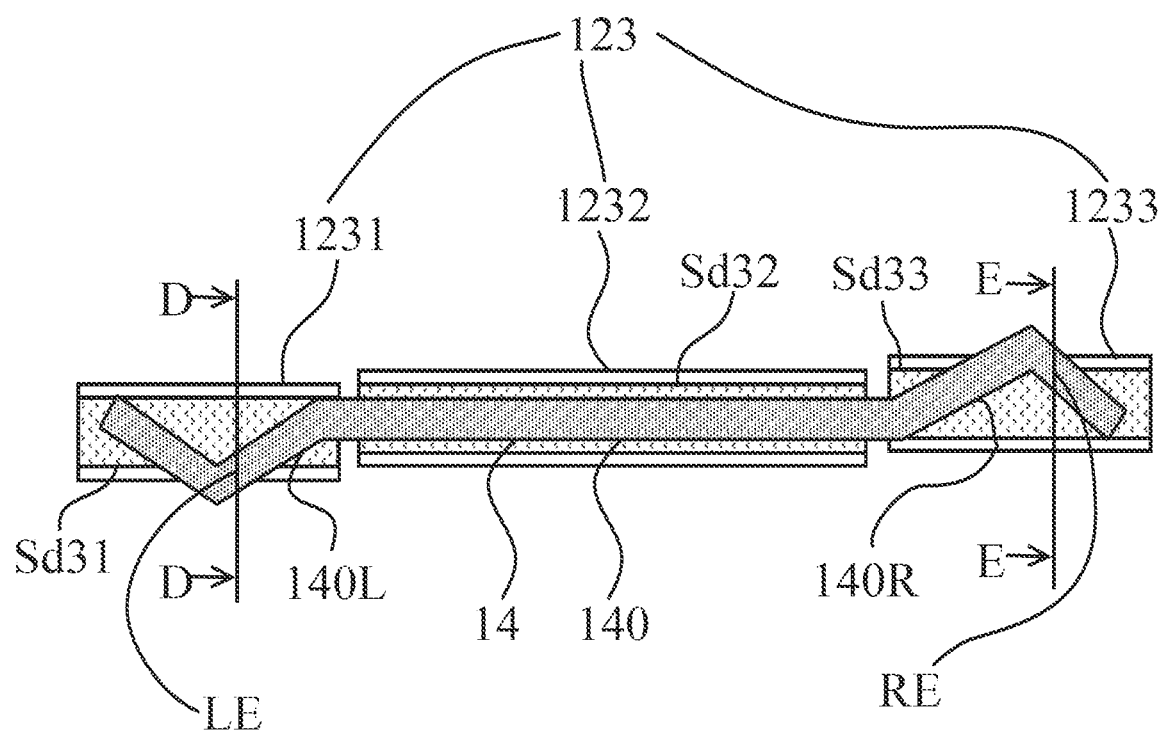
FIG. 19 is a top view of the mounting electrode 123 and the solders Sd31 to Sd33 according to Modification 1 of a mounting pattern of the mounting electrode 122 and the solders Sd1 to Sd6.
Figure 20:
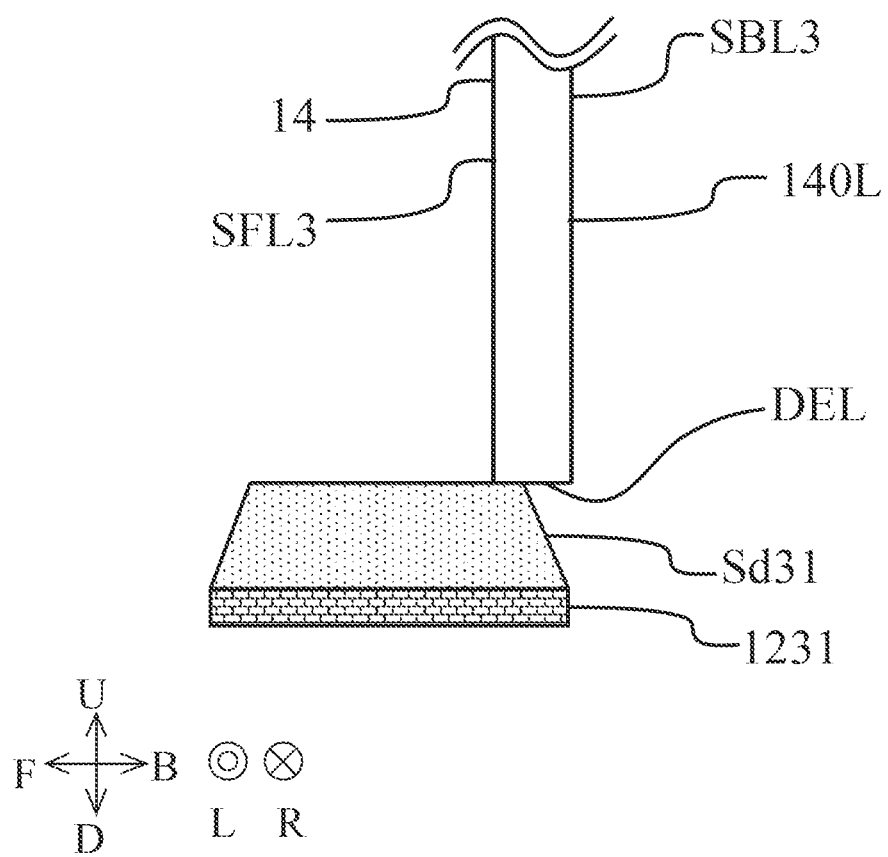
FIG. 20 is a cross-sectional view of the mounting electrode 1231, the solder Sd31, and the left support portion 140L taken along line D-D.
Figure 21:
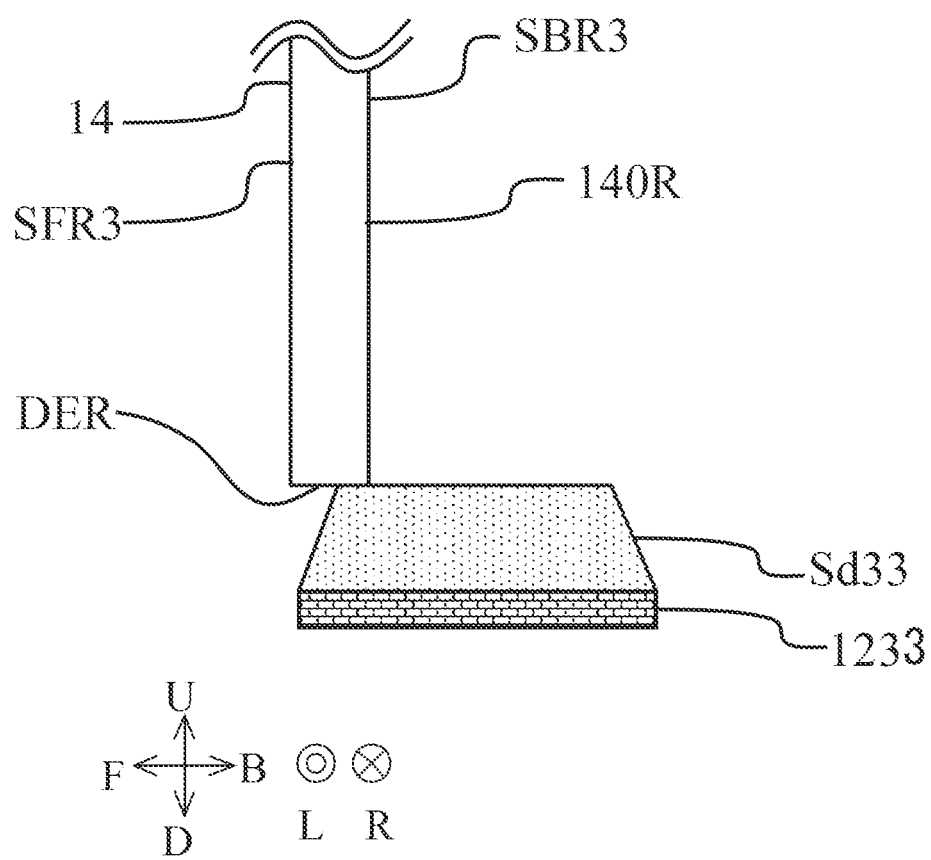
FIG. 21 is a cross-sectional view of the mounting electrode 1233, the solder Sd33, and the right support portion 140R taken along line E-E.

Hereinafter, Modification 1 of the mounting pattern of the mounting electrode 122 will be described with reference to the drawings. FIG. 19 is a top view of a mounting electrode 123 and solders Sd31 to Sd33 according to Modification 1 of a mounting pattern of the mounting electrode 122 and the solders Sd1 to Sd6. FIG. 20 is a cross-sectional view of a mounting electrode 1231, the solder Sd31, and the left support portion 140L taken along line D-D. As illustrated in FIG. 20, the D-D cross section overlaps the right end LE of the lower notch 144L. FIG. 21 is a cross-sectional view of a mounting electrode 1233, the solder Sd33, and the right support portion 140R taken along line E-E. As illustrated in FIG. 20, the E-E cross section overlaps the right end RE of the lower notch 144R.

As illustrated in FIG. 19, a plurality of adjacent foot portions may be fixed to one mounting electrode. For example, as illustrated in FIG. 19, the adjacent foot portions 146L1 and 146L2 are collectively fixed to the mounting electrode 1231. Similarly, the adjacent foot portions 146a to 146d are collectively fixed to a mounting electrode 1232. Similarly, the adjacent foot portions 146R1 and 146R2 are collectively fixed to the mounting electrode 1233. As a result, the ground potential can be further stabilized.

As illustrated in FIG. 20, the entire lower end DEL of the left support portion 140L and the solder Sd31 are not in contact with each other in the D-D cross section. More specifically, the front half of the lower end DEL of the left support portion 140L is in contact with the solder Sd31. Similarly, as illustrated in FIG. 21, the entire lower end DER of the right support portion 140R and the solder Sd33 are not in contact with each other in the E-E cross section. More specifically, the rear half of the lower end DER of the right support portion 140R is in contact with the solder Sd33.

When the vicinity of the center in the left-right direction of the left support portion 140L has a shape protruding in the forward direction, the rear half of the lower end of the left support portion 140L comes into contact with the solder Sd31. Similarly, when the vicinity of the center in the left-right direction of the right support portion 140R has a shape protruding in the backward direction, the front half of the lower end of the right support portion 140R comes into contact with the solder Sd33.

Note that the set of foot portions to be collectively fixed is not limited to the example illustrated in FIG. 19. For example, a set of the foot portions 146a and 146b may be collectively fixed to one mounting electrode.

(Modification of Mounting Pattern of Solder Sd31 and Solder Sd33)

Figure 22:
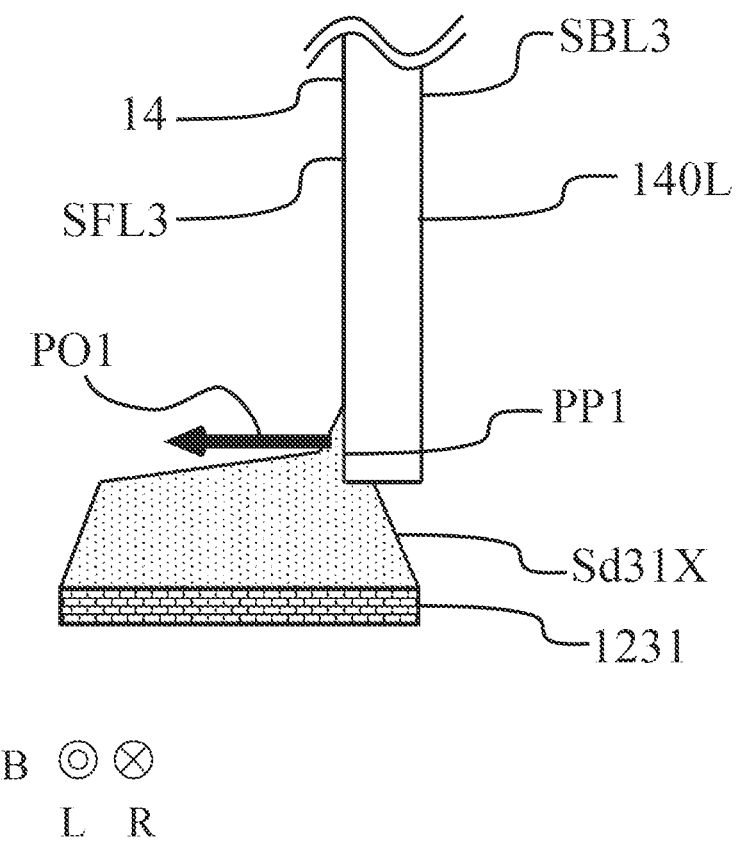
FIG. 22 is a cross-sectional view of the solder Sd31X according to a modification of the mounting pattern of the solder Sd31 taken along line D-D.

Hereinafter, modifications of the mounting patterns of the solder Sd31 and the solder Sd33 will be described with reference to the drawings. FIG. 22 is a cross-sectional view of a solder Sd31X according to a modification of the mounting pattern of the solder Sd31 taken along line D-D.

Figure 23:
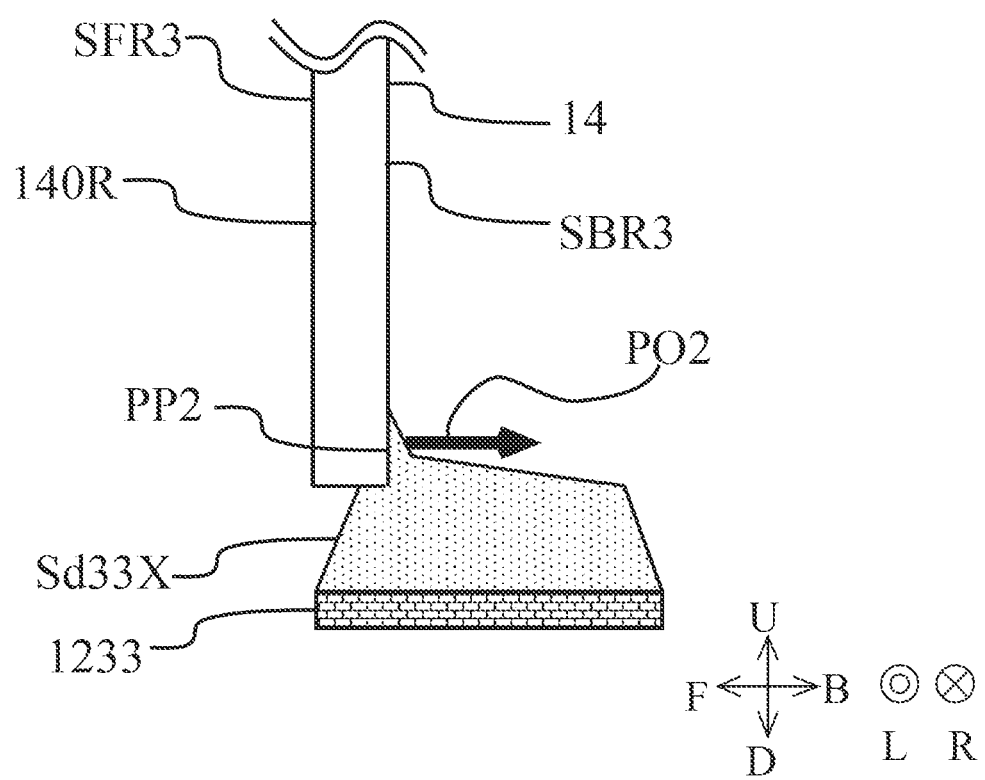
FIG. 23 is a cross-sectional view of the solder Sd33X according to a modification of the mounting pattern of the solder Sd33 taken along line E-E.

FIG. 23 is a cross-sectional view of a solder Sd33X according to a modification of the mounting pattern of the solder Sd33 taken along line E-E.

The mounting pattern of the solder Sd31X is different from the mounting pattern of the solder Sd31. More specifically, as illustrated in FIG. 22, a part of the solder Sd31X is in contact with a front main surface SFL3 of the left support portion 140L. That is, as illustrated in FIG. 22, when the vicinity of the center in the left-right direction of the left support portion 140L protrudes in the backward direction (when the left support portion 140L has the left support rearmost portion X2), the area of a portion PP1 with which the solder Sd31X is in contact with the front main surface SFL3 of the left support portion 140L is larger than the area of the portion with which the solder Sd31X is in contact with a back main surface SBL3 of the left support portion 140L. In the example of FIG. 22, the solder Sd31X is not in contact with the back main surface SBL3 of the left support portion 140L. However, the solder Sd31X may be in contact with the back main surface SBL3 of the left support portion 140L. However, also in this case, the area of the portion PP1 in contact with the solder Sd31X on the front main surface SFL3 of the left support portion 140L is larger than the area of the portion in contact with the solder Sd31X on the back main surface SBL3 of the left support portion 140L.

When the vicinity of the center in the left-right direction of the left support portion 140L protrudes in the forward direction (when the left support portion 140L has the left support foremost portion), the area of the portion where the solder Sd31X is in contact with the back main surface SBL3 of the left support portion 140L is larger than the area of the portion where the solder Sd31X is in contact with a front main surface SFR3 of the left support portion 140L.

The mounting pattern of the solder Sd33X is different from the mounting pattern of the solder Sd33. More specifically, as illustrated in FIG. 23, a part of the solder Sd33X is in contact with a back main surface SBR3 of the right support portion 140R. That is, when the vicinity of the center in the left-right direction of the right support portion 140R protrudes in the forward direction (when the right support portion 140R has the right support foremost portion X1), the area of a portion PP2 in contact with the solder Sd33X on the back main surface SBR3 of the right support portion 140R is larger than the area of the portion in contact with the solder Sd33X on the front main surface SFR3 of the right support portion 140R. In the example illustrated in FIG. 23, the solder Sd33X is not in contact with the front main surface SFR3 of the right support portion 140R. However, the solder Sd33X may be in contact with the front main surface SFR3 of the right support portion 140R. However, also in this case, the area of the portion PP2 in contact with the solder Sd33X on the back main surface SBR3 of the right support portion 140R is larger than the area of the portion in contact with the solder Sd33X on the front main surface SFR3 of the right support portion 140R.

When the vicinity of the center in the left-right direction of the right support portion 140R protrudes in the backward direction (when the right support portion 140R has the right support rearmost portion), the area of the portion in contact with the solder Sd33X on the front main surface SFR3 of the right support portion 140R is larger than the area of the portion in contact with the solder Sd33X on the back main surface SBR3 of the right support portion 140R.

(Effects of Solder Sd31X and Solder Sd33X)

According to the solder Sd31X, self-standing ability of the metal member 14 is enhanced. More specifically, when the left support portion 140L has the left support rearmost portion X2, the area of the portion PP1 in contact with the solder Sd31X on the front main surface SFL3 of the left support portion 140L is larger than the area of the portion in contact with the solder Sd31X on the back main surface SBL3 of the left support portion 140L. As a result, as illustrated in FIG. 22, a force PO1 that pulls the left support portion 140L in the forward direction is generated by the solder Sd31X. In this case, the force PO1 is generated toward the direction in which the center of gravity of the metal member 14 is located. Therefore, the metal member 14 is less likely to rotate in the backward direction around the upper side LU. As a result, self-standing ability of the metal member 14 is enhanced. For the same reason, when the left support portion 140L has the left support foremost portion, the area of the portion in contact with the solder Sd31X on the back main surface SBL3 of the left support portion 140L is made larger than the area of the portion in contact with the solder Sd33X on the front main surface SFL3 of the left support portion 140L, so that the self-standing ability of the metal member 14 is enhanced.

According to the solder Sd33X, self-standing ability of the metal member 14 is enhanced. More specifically, when the right support portion 140R has the right support foremost portion X1, the area of the portion PP2 in contact with the solder Sd33X on the back main surface SBR3 of the right support portion 140R is larger than the area of the portion in contact with the solder Sd33X on the front main surface SFR3 of the right support portion 140R. As a result, as illustrated in FIG. 23, a force PO2 that pulls the right support portion 140R in the backward direction is generated by the solder Sd33X. In this case, the force PO2 is generated toward the direction in which the center of gravity of the metal member 14 is located. Therefore, the metal member 14 is less likely to rotate in the forward direction around the upper side LU. As a result, self-standing ability of the metal member 14 is enhanced. For the same reason, when the right support portion 140R has the right support rearmost portion, the area of the portion in contact with the solder Sd33X on the front main surface SFR3 of the right support portion 140R is made larger than the area of the portion in contact with the solder Sd33X on the back main surface SBR3 of the right support portion 140R, so that the self-standing ability of the metal member 14 is enhanced.

Further, by disposing both the solder Sd31X and the solder Sd33X, self-standing ability of the metal member 14 is improved. More specifically, the solder Sd31X generates the force PO1 that pulls the left support portion 140L in the forward direction. In addition, the solder Sd33X generates the force PO2 that pulls the right support portion 140R in the backward direction. In this case, the force PO1 in the forward direction applied to the metal member 14 and the force PO2 in the forward direction are easily offset. Accordingly, self-standing ability of the metal member 14 is enhanced.

(Modification 2 of Mounting Pattern of Mounting Electrode 122 and Solders Sd1 to Sd6)

Figure 24:
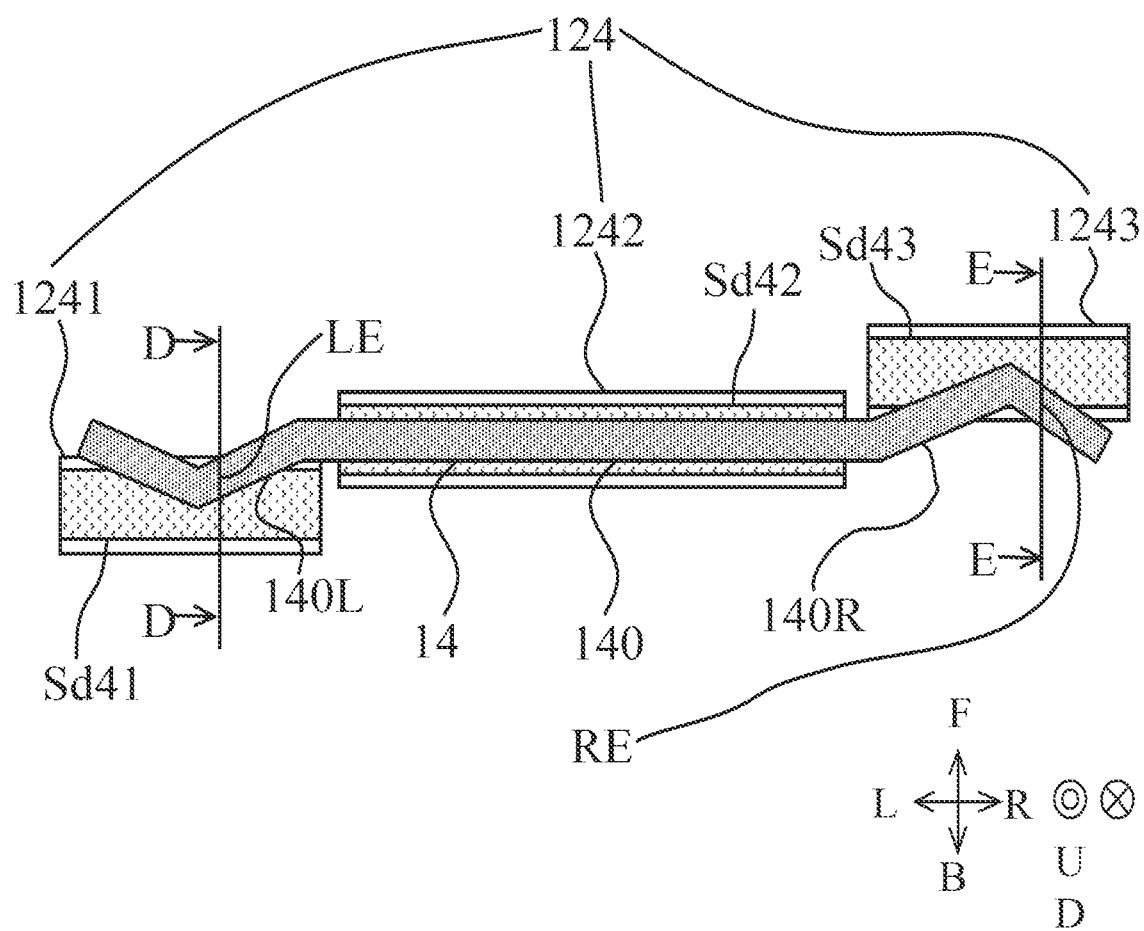
FIG. 24 is a top view of the mounting electrode 124 and the solders Sd41 to Sd43 according to Modification 2 of the mounting pattern of the mounting electrode 122 and the solders Sd1 to Sd6.
Figure 25:
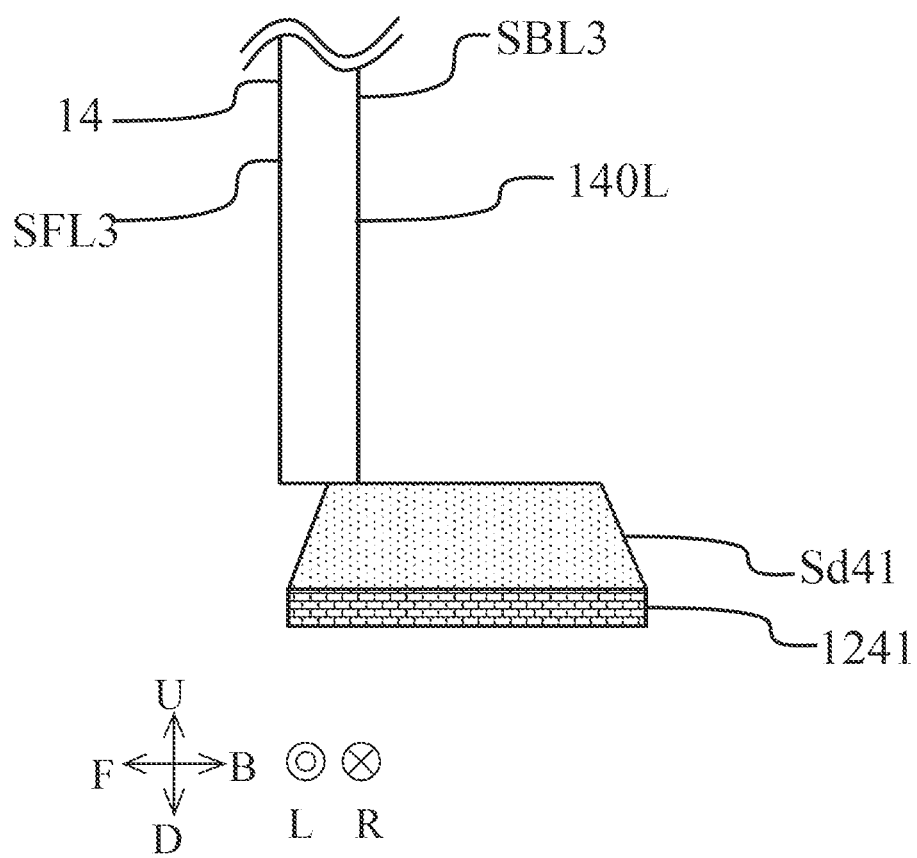
FIG. 25 is a cross-sectional view of the mounting electrode 1241, the solder Sd41, and the left support portion 140L taken along line D-D.
Figure 26:
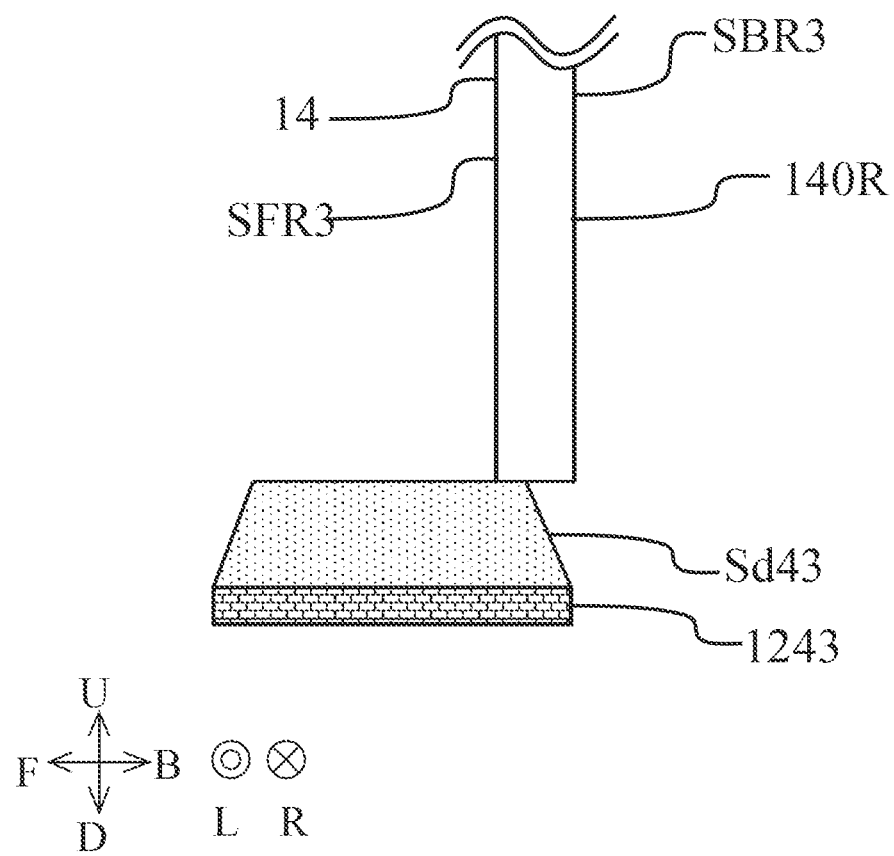
FIG. 26 is a cross-sectional view of the mounting electrode 1243, the solder Sd43, and the right support portion 140R taken along line E-E.

Hereinafter, Modification 2 of the mounting pattern of the mounting electrode 122 and the solders Sd1 to Sd6 will be described with reference to the drawings. FIG. 24 is a top view of a mounting electrode 124 and solders Sd41 to Sd43 according to Modification 2 of the mounting pattern of the mounting electrode 122 and the solders Sd1 to Sd6. FIG. 25 is a cross-sectional view of a mounting electrode 1241, the solder Sd41, and the left support portion 140L taken along line D-D. As illustrated in FIG. 25, the D-D cross section overlaps the right end of the lower notch 144L. FIG. 26 is a cross-sectional view of a mounting electrode 1243, the solder Sd43, and the right support portion 140R taken along line E-E. As illustrated in FIG. 26, the E-E cross section overlaps the right end of the lower notch 144L.

As illustrated in FIG. 24, the mounting electrode 124 is different from the mounting electrode 122 in that the mounting electrodes 1241, 1242, 1245, and 1246 different from the arrangement of the mounting electrode 122 are included. More specifically, the mounting electrodes 1241 and 1242 (left mounting electrode) are disposed behind the left support portion 140L in the front-back direction. In addition, the mounting electrodes 1245 and 1246 (right mounting electrodes) are arranged to be biased in front of the right support portion 140R in the front-back direction.

At this time, as illustrated in FIG. 25, the entire lower end DEL of the left support portion 140L in the D-D cross section is not in contact with the solder Sd41. More specifically, the rear half of the lower end DEL of the left support portion 140L is in contact with the solder Sd41. Similarly, as illustrated in FIG. 26, the entire lower end DER of the right support portion 140R in the E-E cross section is not in contact with the solder Sd43. More specifically, the front half of the lower end DER of the right support portion 140R is in contact with the solder Sd43.

(Modification of Mounting Pattern of Solder Sd41 and Solder Sd43)

Figure 27:
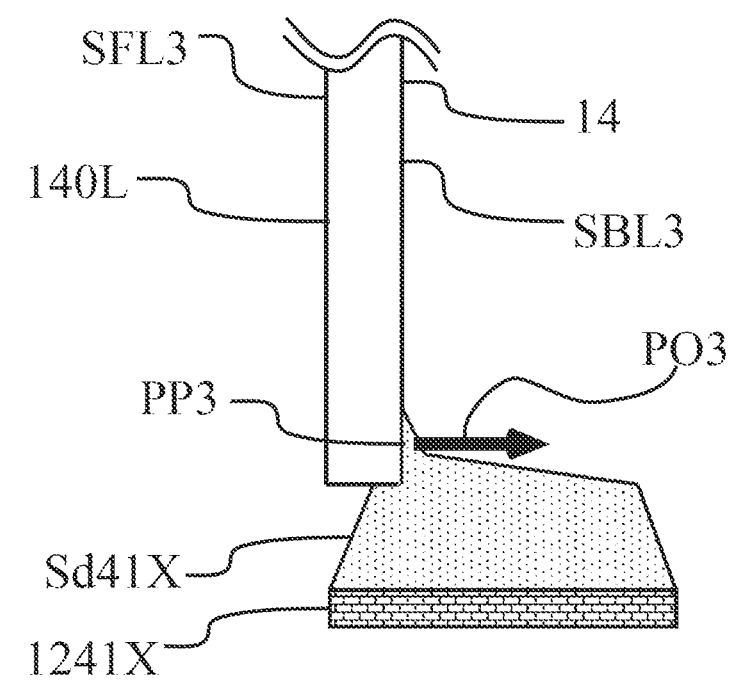
FIG. 27 is a view illustrating a solder Sd41X according to a modification of the mounting pattern of the solder Sd41.
Figure 27:
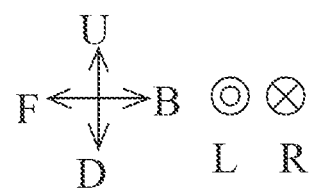
Figure 28:
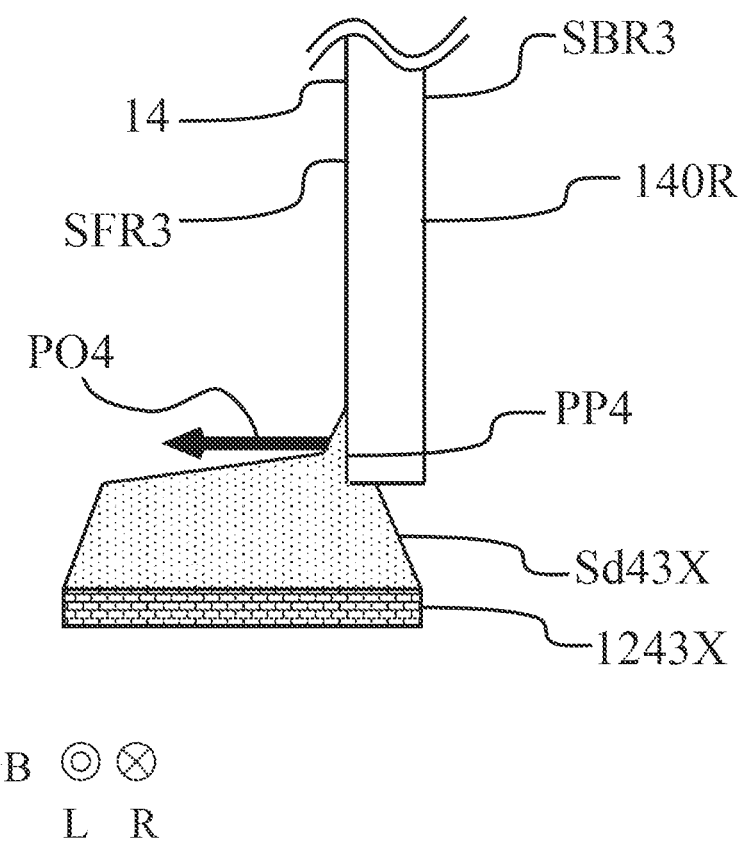
FIG. 28 is a view illustrating a solder Sd43X according to a modification of the mounting pattern of the solder Sd43.

Hereinafter, a modification of the mounting pattern of the solder Sd41 and the solder Sd43 will be described with reference to the drawings. FIG. 27 is a cross-sectional view of the solder Sd41X according to the modification of the mounting pattern of the solder Sd41 taken along line D-D. FIG. 28 is a cross-sectional view of the solder Sd43X according to a modification of the mounting pattern of the solder Sd43 taken along line E-E.

The mounting pattern of the solder Sd41X is different from the mounting pattern of the solder Sd41. More specifically, as illustrated in FIG. 27, a part of the solder Sd41X is in contact with the back main surface SBL3 of the left support portion 140L. That is, in the present modification, when the vicinity of the center in the left-right direction of the left support portion 140L protrudes in the backward direction (when the left support portion 140L has the left support rearmost portion X2), the area of a portion PP3 in contact with the solder Sd41X on the back main surface SBL3 of the left support portion 140L is larger than the area of the portion in contact with the solder Sd41X on the front main surface SFL3 of the left support portion 140L. In the example illustrated in FIG. 27, the solder Sd41X is not in contact with the front main surface SFL3 of the left support portion 140L. However, the solder Sd41X may be in contact with the front main surface SFL3 of the left support portion 140L. However, also in this case, the area of the portion PP3 in contact with the solder Sd41X on the back main surface SBL3 of the left support portion 140L is larger than the area of the portion in contact with the solder Sd41X on the front main surface SFL3 of the left support portion 140L.

When the vicinity of the center in the left-right direction of the left support portion 140L protrudes in the forward direction (when the left support portion 140L has the left support foremost portion), the area of the portion in contact with the solder Sd41X on the front main surface SFL3 of the left support portion 140L is larger than the area of the portion in contact with the solder Sd41X on the back main surface SBR3 of the left support portion 140L.

The mounting pattern of the solder Sd43X is different from the mounting pattern of the solder Sd43. More specifically, as illustrated in FIG. 28, a part of the solder Sd43X is in contact with the front main surface SFR3 of the right support portion 140R. That is, in the present modification, when the vicinity of the center in the left-right direction of the right support portion 140R protrudes in the forward direction (when the right support portion 140R has the right support foremost portion X1), the area of a portion PP4 in contact with the solder Sd43X on the front main surface SFR3 of the right support portion 140R is larger than the area of the portion with which the solder Sd43X is in contact in the back main surface SBR3 of the right support portion 140R. In the example of FIG. 28, the solder Sd43X is not in contact with the back main surface SBR3 of the right support portion 140R. However, the solder Sd43X may be in contact with the back main surface SBR3 of the right support portion 140R. However, also in this case, the area of the portion PP4 in contact with the solder Sd43X on the front main surface SFR3 of the right support portion 140R is larger than the area of the portion in contact with the solder Sd43X on the back main surface SBR3 of the right support portion 140R.

When the vicinity of the center in the left-right direction of the right support portion 140R protrudes in the backward direction (when the right support portion 140R has the right support rearmost portion), the area of the portion in contact with the solder Sd43X on the back main surface SBR3 of the right support portion 140R is larger than the area of the portion in contact with the solder Sd43X on the front main surface SFR3 of the right support portion 140R.

(Effects of Solder Sd41X and Solder Sd43X)

According to the solder Sd41X, self-standing ability of the metal member 14 is enhanced. More specifically, when the left support portion 140L has the left support rearmost portion X2, the area of the portion PP3 in contact with the solder Sd41X on the back main surface SBL3 of the left support portion 140L is larger than the area of the portion in contact with the solder Sd41X on the front main surface SFL3 of the left support portion 140L. As a result, as illustrated in FIG. 27, a force PO3 that pulls the left support portion 140L in the backward direction is generated by the solder Sd41X. As a result, the metal member 14 is less likely to fall in the forward direction. As a result, self-standing ability of the metal member 14 is enhanced. For the same reason, when the left support portion 140L has the left support foremost portion, the area of the portion in contact with the solder Sd41X on the front main surface SFL3 of the left support portion 140L is made larger than the area of the portion in contact with the solder Sd43X on the back main surface SBL3 of the left support portion 140L, so that the self-standing ability of the metal member 14 is enhanced.

According to the solder Sd43X, self-standing ability of the metal member 14 is enhanced. More specifically, when the right support portion 140R has the right support foremost portion X1, the area of the portion PP4 in contact with the solder Sd43X on the front main surface SFR3 of the right support portion 140R is larger than the area of the portion in contact with the solder Sd43X on the back main surface SBR3 of the right support portion 140R. As a result, as illustrated in FIG. 28, a force PO4 that pulls the right support portion 140R in the forward direction is generated by the solder Sd43X. As a result, the metal member 14 is less likely to fall in the backward direction. As a result, self-standing ability of the metal member 14 is enhanced. For the same reason, when the right support portion 140R has the right support rearmost portion, the area of the portion in contact with the solder Sd43X on the back main surface SBR3 of the right support portion 140R is made larger than the area of the portion in contact with the solder Sd43X on the front main surface SFR3 of the right support portion 140R, so that the self-standing ability of the metal member 14 is enhanced.

Further, by disposing both the solder Sd41X and the solder Sd43X, self-standing ability of the metal member 14 is improved. More specifically, the solder Sd41X generates the force PO3 that pulls the left support portion 140L in the backward direction. In addition, the solder Sd43X generates the force PO4 that pulls the right support portion 140R in the forward direction. In this case, the force PO3 in the backward direction applied to the metal member 14 and the force PO4 in the forward direction are easily offset. Accordingly, self-standing ability of the metal member 14 is enhanced.

(Modification 3 of Mounting Pattern of Mounting Electrode 122 and Solders Sd1 to Sd6)

Figure 29:
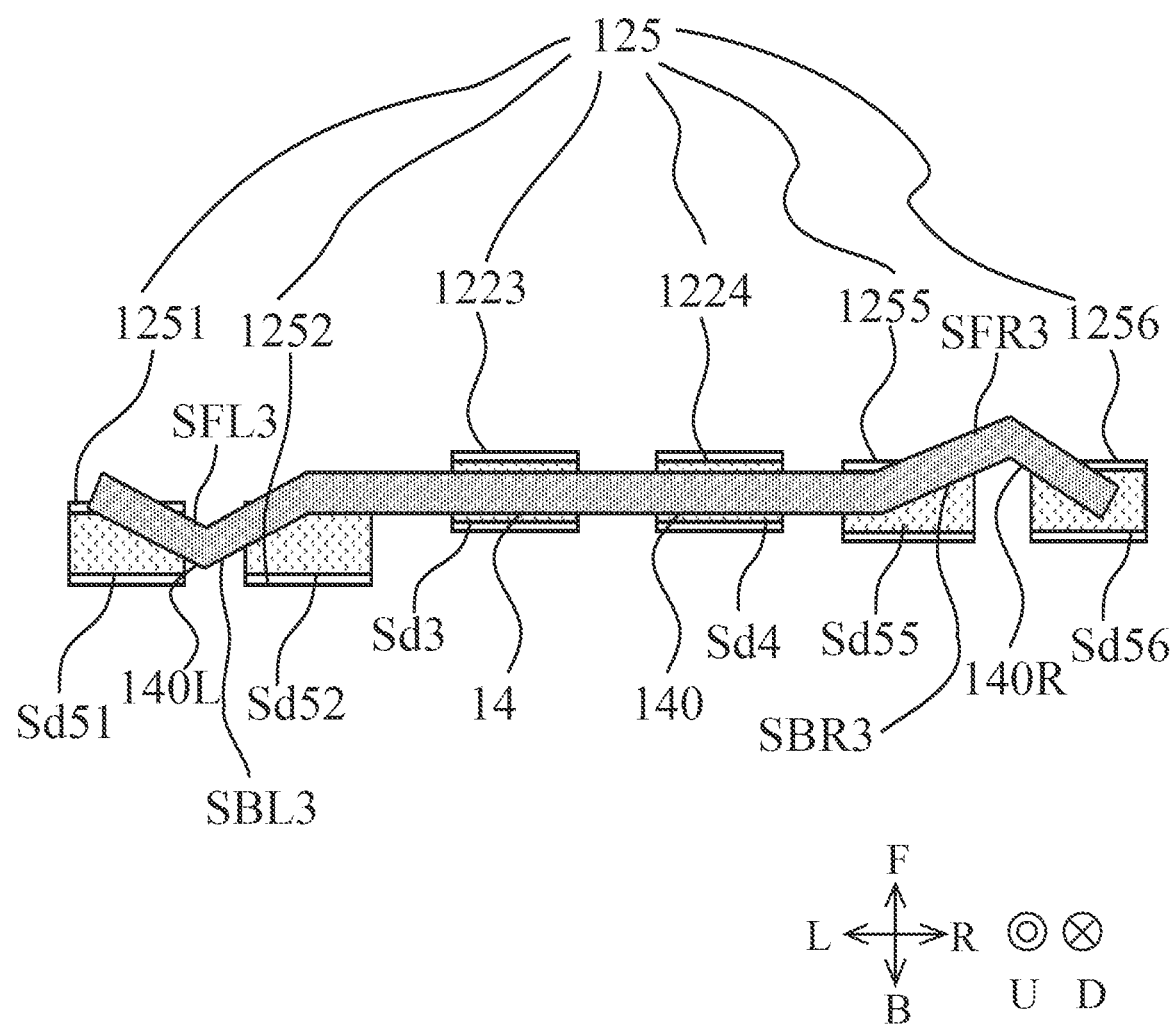
FIG. 29 is a top view of a mounting electrode 125 and solders Sd51, Sd52, Sd3, Sd4, Sd55, and Sd56 according to Modification 3 of the mounting pattern of the mounting electrode 122 and the solders Sd1 to Sd6.
Figure 30:
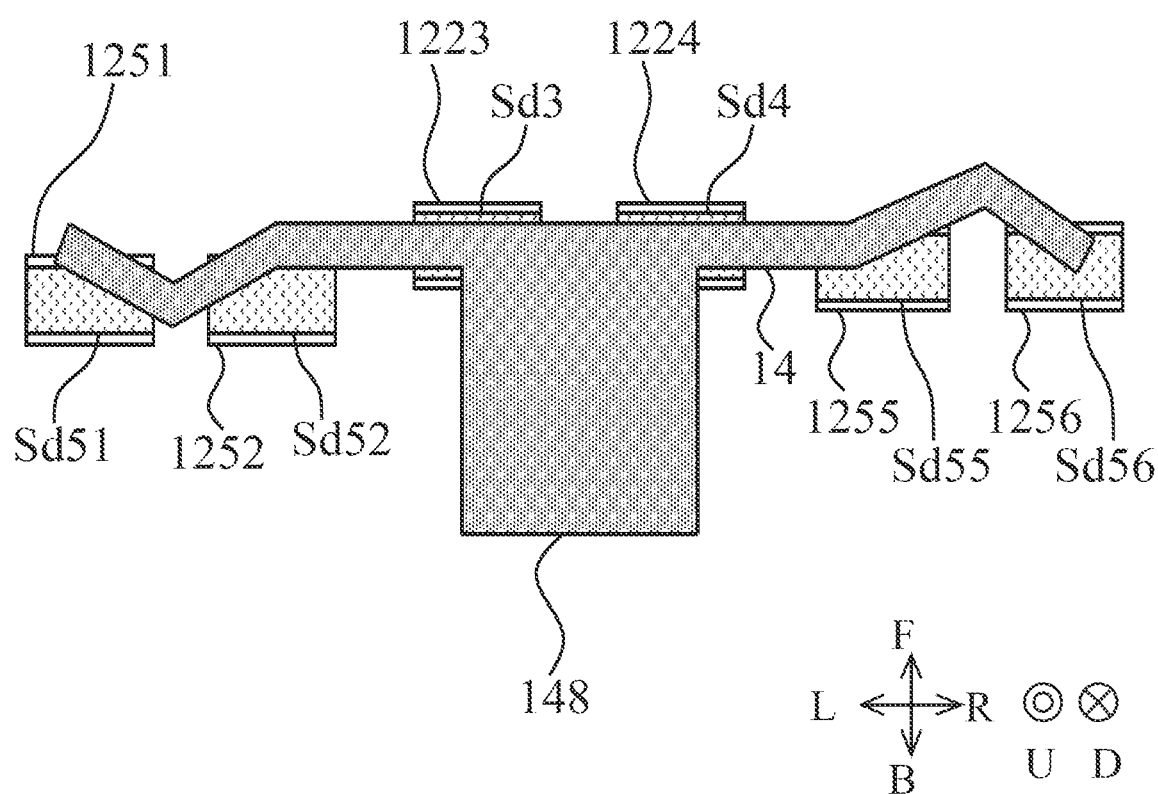
FIG. 30 is a top view of the mounting electrode 125, the solders Sd51, Sd52, Sd3, Sd4, Sd55, and Sd56, and the metal member 14 at the time of manufacturing.

Hereinafter, Modification 3 of the mounting pattern of the mounting electrode 122 and the solders Sd1 to Sd6 will be described with reference to the drawings. FIG. 29 is a top view of a mounting electrode 125 and solders Sd51, Sd52, Sd3, Sd4, Sd55, and Sd56 according to Modification 3 of the mounting pattern of the mounting electrode 122 and the solders Sd1 to Sd6. FIG. 30 is a top view of the mounting electrode 125, the solders Sd51, Sd52, Sd3, Sd4, Sd55, and Sd56, and the metal member 14 at the time of manufacturing.

As illustrated in FIG. 29, the mounting electrode 125 is different from the mounting electrode 122 in that mounting electrodes 1251, 1252, 1255, and 1256 different from the arrangement of the mounting electrode 122 are included. More specifically, each of the mounting electrodes 1251, 1252, 1255, and 1256 fixed to the two support portions (the right support portion 140R and the left support portion 140L) is disposed behind the metal member 14.

As illustrated in FIG. 29, the arrangement of each of the solders Sd51, Sd52, Sd55, and Sd56 is different from the arrangement of the solders Sd1, Sd2, Sd5, and Sd6. More specifically, each of the solders Sd51, Sd52, Sd55, and Sd56 is disposed behind the metal member 14 in a biased manner.

At this time, the area of a portion in contact with the solders Sd55 and Sd56 on the back main surface SBR3 of the right support portion 140R is larger than the area of a portion in contact with the solders Sd55 and Sd56 on the front main surface SFR3 of the right support portion 140R. The area of the portion in contact with the solders Sd51 and Sd52 on the back main surface SBL3 of the left support portion 140L is larger than the area of a portion in contact with the solders Sd51 and Sd52 on the front main surface SFL3 of the left support portion 140L.

(Effect of Modification 3)

According to the mounting electrode 125 and the solders Sd51, Sd52, Sd55, and Sd56, self-standing ability of the metal member 14 is improved. Hereinafter, a case where the metal member 14 is mounted on the substrate 12 (a case where the top surface portion 148 is formed) will be described as an example. As illustrated in FIG. 30, in a case where the top surface portion 148 extends in the backward direction from the upper side LU, a force in the backward direction acts on the metal member 14 by the top surface portion 148. The metal member 14 can be pushed into the solder applied to the mounting electrodes 1255 and 1256 by disposing the back main surface SBR3 of the right support portion 140R such that the area of the portion in contact with the solders Sd55 and Sd56 is larger than the area of the portion in contact with the solders Sd55 and Sd56 on the front main surface SFR3 of the right support portion 140R. This increases the adhesive force of the solder to the metal member 14. As a result, self-standing ability of the metal member 14 is improved. For the same reason, by making the area of the portion in contact with the solders Sd51 and Sd52 on the back main surface SBL3 of the left support portion 140L larger than the area of the portion in contact with the solders Sd51 and Sd52 on the front main surface SFL3 of the left support portion 140L, the metal member 14 can be pushed into the solder applied to the mounting electrodes 1251 and 1252.

When the top surface portion 148 extends in the forward direction from the upper side LU of the metal member 14, the same effect can be obtained by making the area of the portion in contact with the solders Sd55 and Sd56 on the front main surface SFR3 of the right support portion 140R larger than the area of the portion in contact with the solders Sd55 and Sd56 on the back main surface SBR3 of the right support portion 140R. Further, by making the area of the portion in contact with the solders Sd51 and Sd52 on the front main surface SFL3 of the left support portion 140L larger than the area of the portion in contact with the solders Sd51 and Sd52 on the back main surface SBL3 of the left support portion 140L, a similar effect can be obtained.

Other Embodiments

Figure 31:
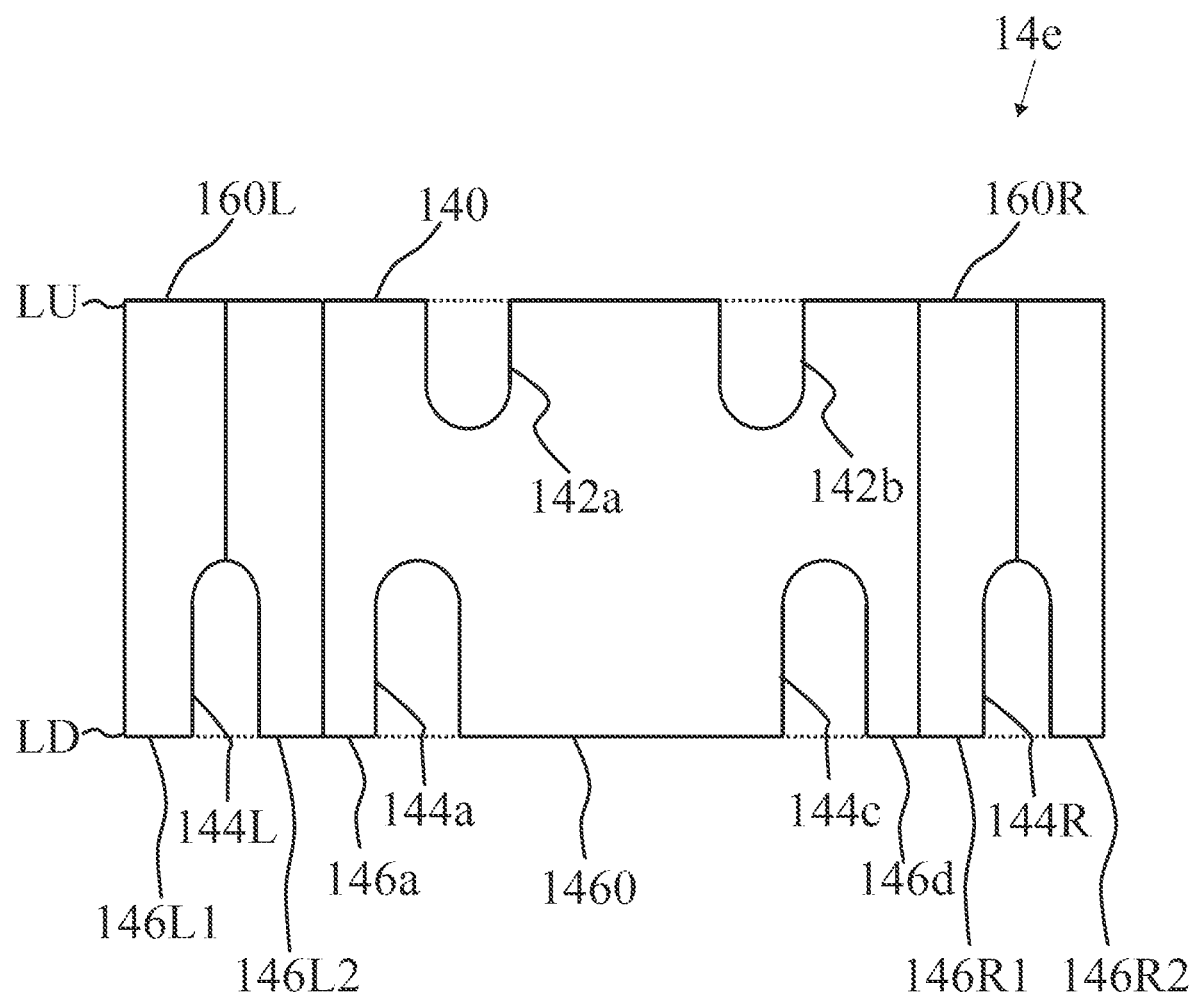
FIG. 31 is a view of a metal member 14e according to another embodiment when viewed in the forward direction.
Figure 32:
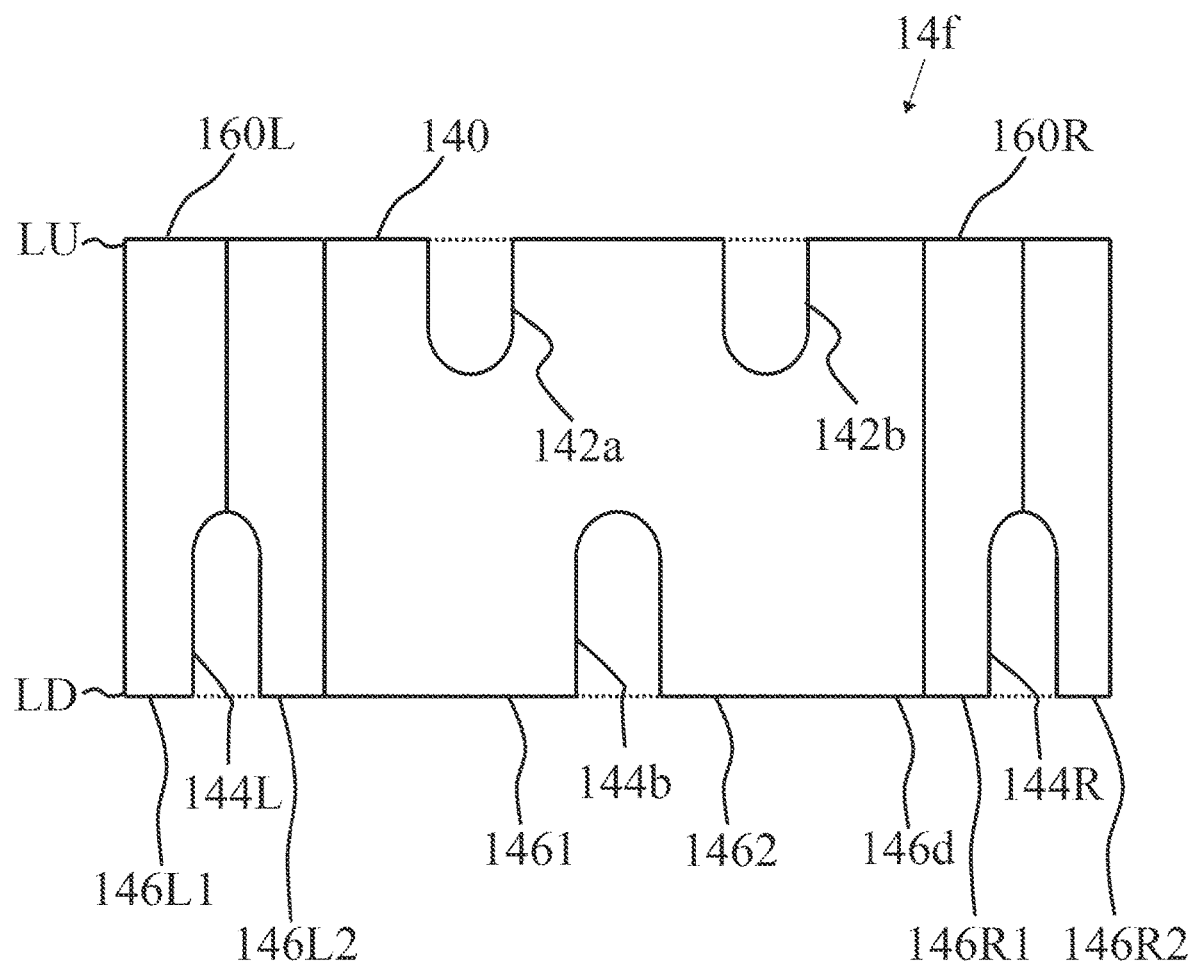
FIG. 32 is a view of a metal member 14f according to another embodiment when viewed in the forward direction.
Figure 33:
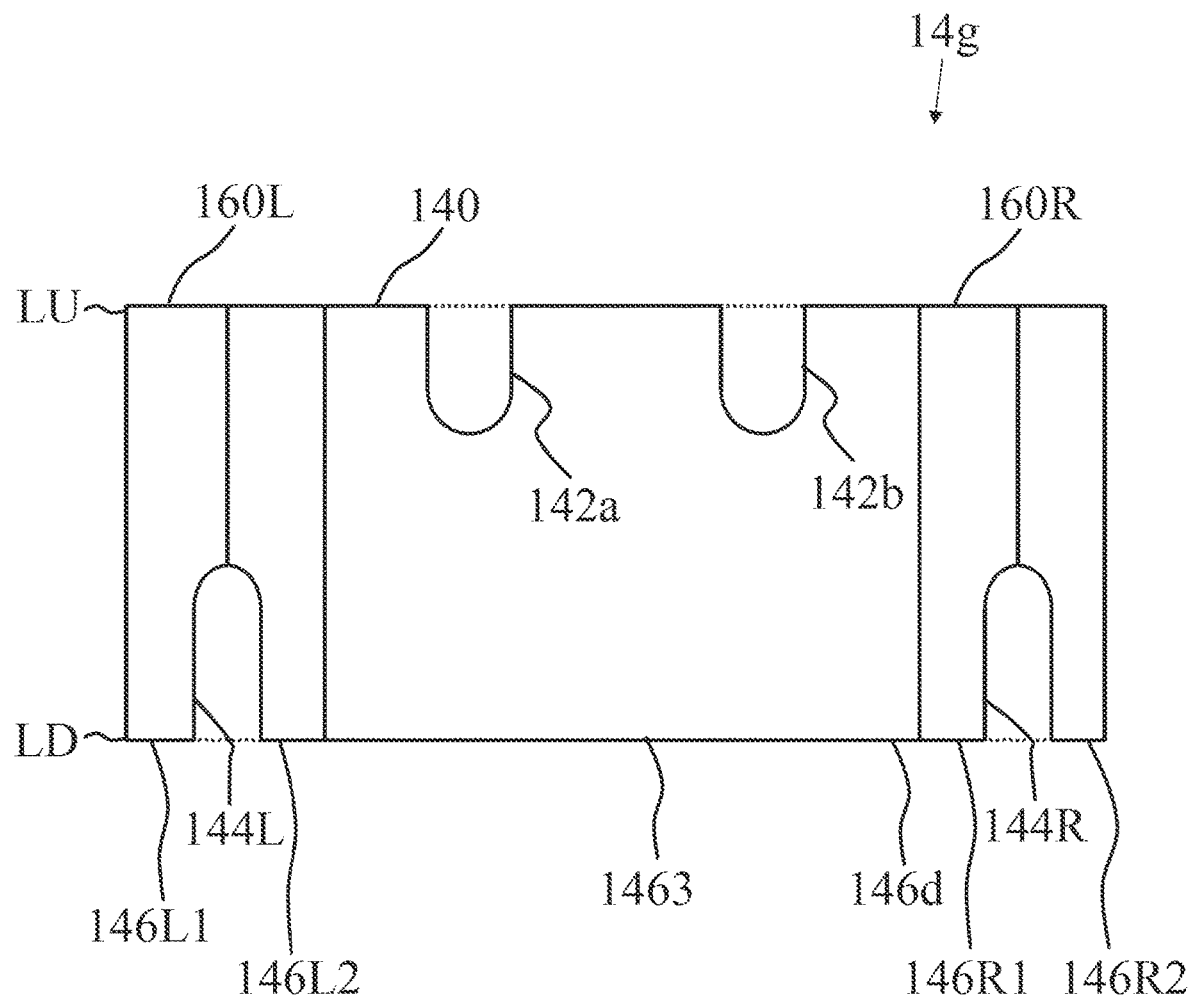
FIG. 33 is a view of a metal member 14g according to another embodiment when viewed in the forward direction.
Figure 34:
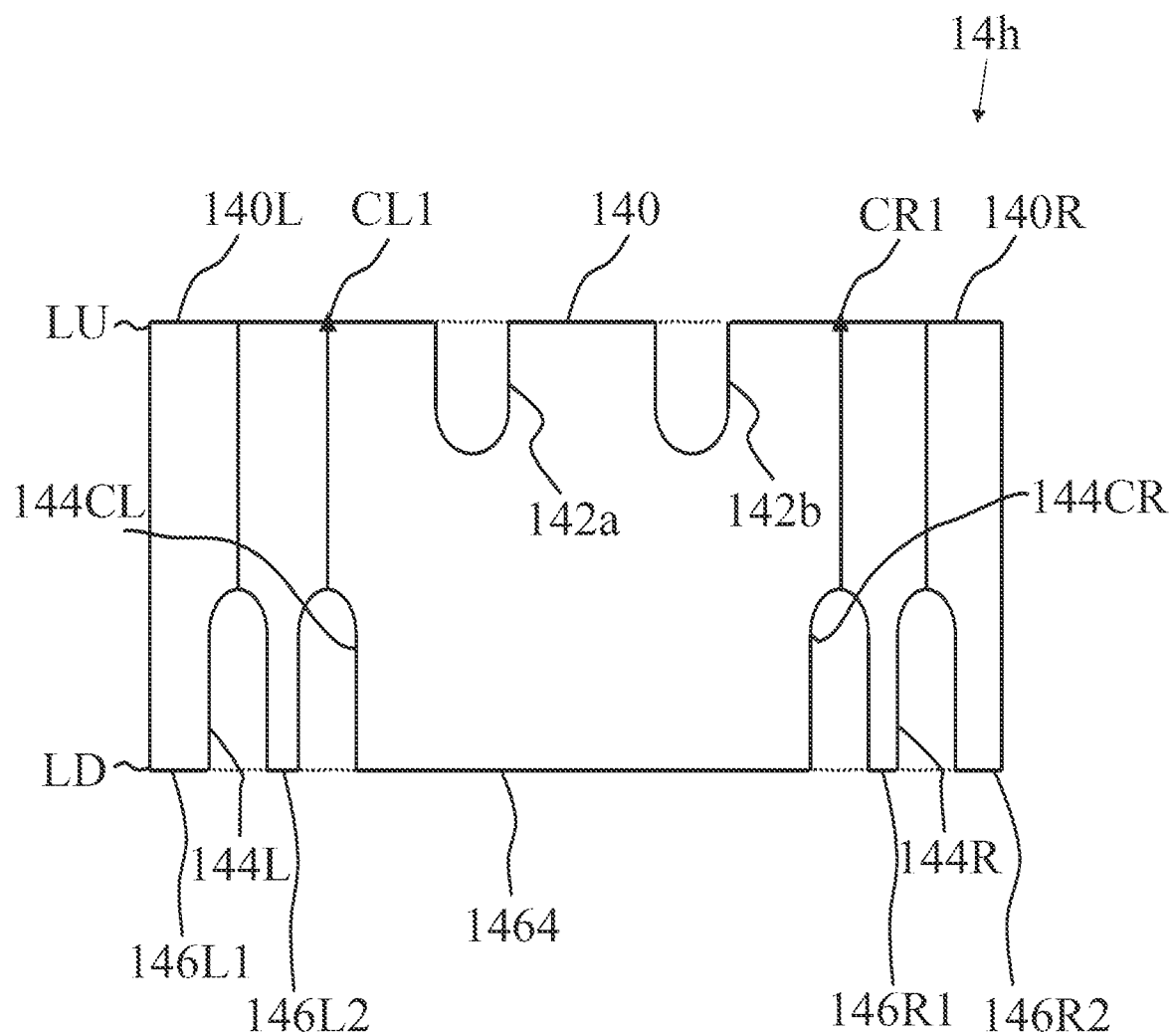
FIG. 34 is a view of a metal member 14h according to another embodiment when viewed in the forward direction.

Hereinafter, modules according to other embodiments will be described with reference to the drawings. FIG. 31 is a view of a metal member 14e according to another embodiment when viewed in the forward direction. FIG. 32 is a view of a metal member 14f according to another embodiment when viewed in the forward direction. FIG. 33 is a view of a metal member 14g according to another embodiment when viewed in the forward direction. FIG. 34 is a view of a metal member 14h according to another embodiment when viewed in the forward direction.

For example, as in the metal member 14e illustrated in FIG. 31, two lower notches may be provided in the plate-shaped portion 140. In this case, one foot portion 1460 is provided between the lower notch 144a and the lower notch 144c.

For example, as in the metal member 14f illustrated in FIG. 32, one lower notch may be provided in the plate-shaped portion 140. In this case, one foot portion 1461 is provided on the left of the lower notch 144b. One foot portion 1462 is provided on the right of the lower notch 144b.

For example, as in the metal member 14g illustrated in FIG. 33, the lower notch may not be provided in the plate-shaped portion 140. In this case, the plate-shaped portion 140 is provided with one foot portion 1463.

For example, as in the metal member 14h illustrated in FIG. 34, the plate-shaped portion 140 may be provided with only a part of the lower notch 144CR overlapping the right boundary CR1 and a part of the lower notch 144CL overlapping the left end (right boundary CR1) of the plate-shaped portion 140 when viewed in the up-down direction. In this case, one foot portion 1464 is provided between the lower notch 144CR and the lower notch 144CL.

The module according to the present disclosure is not limited to the module 10 according to the above embodiment, and can be changed within the scope of the gist of the present disclosure.

The number of lower notches provided in the plate-shaped portion 140 is not limited to 3.

The structures of the metal members 14 and 14a to 14h and the structures of the mounting electrodes 122 to the mounting electrode 125 may be arbitrarily combined with the module 10.

The substrate 12 may have a shape other than a rectangular shape when viewed in the up-down direction.

The number of electronic components is not limited to 5 (electronic components 16a to 16e).

Note that one or more upper notches may be provided in the plate-shaped portion 140.

The foot portion may not be adjacent to the lower notch in the left-right direction. Therefore, the foot portion and the lower notch may be separated in the left-right direction.

The plurality of foot portions extend in the backward direction from the lower side LD of the plate-shaped portion 140. However, the plurality of foot portions may extend in the forward direction from the lower side of the plate-shaped portion 140. A part of the plurality of foot portions may extend in the backward direction from the lower side of the plate-shaped portion 140, and the rest of the plurality of foot portions may extend in the forward direction from the lower side of the plate-shaped portion 140.

The shortest distance between the upper notch and the lower notch may be shorter than 1.5 times the plate thickness of the plate-shaped portion 140.

The left end of the plate-shaped portion 140 may not be located on the left surface SL1 of the sealing resin layer 18. The right end of the plate-shaped portion 140 may not be located on the right surface SR1 of the sealing resin layer 18. The upper end of the plate-shaped portion 140 may not be located on the upper surface SU1 of the sealing resin layer 18. In addition, since the upper end of the plate-shaped portion 140 is located on the upper surface SU1 of the sealing resin layer 18, the upper end of the plate-shaped portion 140 may be electrically connected to the shield 20, the left end of the plate-shaped portion 140 may not be located on the left surface SL1 of the sealing resin layer 18, and the right end of the plate-shaped portion 140 may not be located on the right surface SR1 of the sealing resin layer 18.

The module 10 may not include the shield 20.

The shield 20 may cover at least the upper surface SU1 of the sealing resin layer 18. Therefore, the shield 20 may not cover a part or all of the left surface SL1, the right surface SR1, the front surface SF1, and the back surface SB1 of the sealing resin layer 18, for example.

Incidentally, the outer edge of the substrate 12 may not overlap so as to coincide with the outer edge of the sealing resin layer 18 when viewed in the up-down direction. That is, the front surface SF1 of the sealing resin layer 18 may be located in front of the front surface SF2 of the substrate 12. The back surface SB1 of the sealing resin layer 18 may be located behind the back surface SB2 of the substrate 12. The left surface SL1 of the sealing resin layer 18 may be located to the left of the left surface SL2 of the substrate 12. The right surface SR1 of the sealing resin layer 18 may be located to the right of the right surface SR2 of the substrate 12.

The electronic components 16a to 16e do not protrude in the left direction or in the right direction from the metal member 14 when viewed in the front-back direction. However, a part of the electronic components 16a to 16e may protrude in the left direction or in the right direction from the metal member 14 when viewed in the front-back direction.

The area of the top surface portion 148 may be larger than the area of each of the foot portions 146L1, 146L2, 146a to 146d, 146R1, and 146R2. Thus, the metal member 14 can be easily adsorbed by the mounting machine.

For example, when viewed in the up-down direction, the top surface portion 148 does not overlap with the electronic component 16e having the highest height in the up-down direction among the electronic components 16a to 16e.

The top surface portion 148 is formed by bending a part of the metal member 14 in the backward direction.

The metal members 14, and 14a to 14d may include one or more foot portions.

Solder is used to fix the foot portions 146L1, 146L2, 146a to 146d, 146R1, and 146R2 to the mounting electrode 122, 123, 124, and 125. However, instead of the solder, for example, a resin adhesive containing a metal filler such as Cu or Ag may be used. That is, a conductive member such as solder or a resin adhesive may be used to fix the foot portions 146L1, 146L2, 146a to 146d, 146R1, and 146R2 to the mounting electrodes 122, 123, 124, and 125.

10 module
12 substrate
14, 14a to 14d metal member
16a to 16e electronic component
18 sealing resin layer
140 plate-shaped portion
140R, 140Ra, 140Rb, 140Rc right support portion
140L, 140La, 140Lb left support portion
142a, 142b upper notch
144a to 144c, 144L, 144R lower notch
SU2 upper main surface of substrate 12
SD2 lower main surface of substrate 12
SF3 front main surface of metal member 14
SB3 back main surface of metal member 14
LD lower side
LU upper side
RS1, LS1 first straight line
CR2 right end of first portion RFP
CL2 left end of first portion LFP
X1 right support foremost portion
X2 left support rearmost portion

The invention claimed is:

1. A module comprising:
a substrate having an upper main surface and a lower main surface arranged in an up-down direction;
a metal member including a plate-shaped portion provided on the upper main surface of the substrate, the plate-shaped portion having a front main surface and a back main surface arranged in a front-back direction when viewed in the up-down direction;
a first electronic component mounted on the upper main surface of the substrate and disposed in front of the metal member;
a second electronic component mounted on the upper main surface of the substrate and disposed behind the metal member; and
a sealing resin layer provided on the upper main surface of the substrate and covering the first electronic component, the second electronic component, and the metal member,
wherein
the metal member includes a right support portion,
a boundary between the plate-shaped portion and the right support portion is defined as a right boundary,
the right boundary is located at a right part of the metal member,
the right support portion includes a right support foremost portion located at a foremost of the right support portion and located in front of the plate-shaped portion, or a right support rearmost portion located at a rearmost of the right support portion and located behind the plate-shaped portion,
when the right support portion includes the right support foremost portion, the right support portion bends in a forward direction from the right boundary,
when the right support portion includes the right support foremost portion, the right support portion bends in a backward direction and a right direction from the right support foremost portion,
when the right support portion includes the right support rearmost portion, the right support portion bends in a backward direction from the right boundary,
when the right support portion includes the right support rearmost portion, the right support portion bends in a forward direction and a right direction from the right support rearmost portion,
when viewed in the up-down direction, a line connecting a lower end of the right support portion in a left-right direction is defined as a right lower side, and
the right support portion is provided with a first right lower notch extending in an upward direction from the right lower side, the first right lower notch overlapping the right support foremost portion or the right support rearmost portion when viewed in the up-down direction.

2. The module according to claim 1, wherein
a first straight line parallel to a left-right direction is defined, and
the first straight line overlaps at least two places of the right support portion.

3. The module according to claim 1, wherein the right support portion includes a right support front portion located in front of the plate-shaped portion in the front-back direction and a right support rear portion located behind the plate-shaped portion in the front-back direction.

4. The module according to claim 1, wherein
when the right support portion includes the right support foremost portion, the right support portion includes a first portion located between the right boundary and the right support foremost portion in the right support portion, and a second portion located between the right support foremost portion and a right end of the right support portion in the right support portion,
when the right support portion includes the right support rearmost portion, the right support portion includes a first portion located between the right boundary and the right support rearmost portion in the right support portion and a second portion located between the right support rearmost portion and a right end of the right support portion in the right support portion,
a straight line extending in the left-right direction is defined as a first straight line,
the first portion is parallel to a second straight line when viewed in the up-down direction,
the second portion is parallel to a third straight line when viewed in the up-down direction, and
an angle at a corner formed by the second straight line and the third straight line is larger than an angle at a corner formed by the first straight line and the second straight line.

5. The module according to claim 1, wherein
when the right support portion includes the right support foremost portion, the right support portion includes a first portion located between the right boundary and the right support foremost portion in the right support portion, and a second portion located between the right support foremost portion and a right end of the right support portion in the right support portion,
when the right support portion includes the right support rearmost portion, the right support portion includes a first portion located between the right boundary and the right support rearmost portion in the right support portion and a second portion located between the right support rearmost portion and a right end of the right support portion in the right support portion, the first portion draws a first arc around a first point when viewed in the up-down direction, the second portion draws a second arc around a second point when viewed in the up-down direction, and a curvature radius of the second arc is smaller than a curvature radius of the first arc.

6. The module according to claim 1, wherein the metal member is provided with a second lower notch in the right support portion, the second lower notch extending in the upward direction from the right lower side and overlapping the right boundary when viewed in the up-down direction.

7. The module according to claim 1, wherein when viewed in the front-back direction, a line connecting upper ends of the plate-shaped portion in the left-right direction is defined as an upper side, and the plate-shaped portion is provided with an upper notch extending in a downward direction from the upper side.

8. The module according to claim 1, wherein the substrate includes a mounting electrode and a conductive member, the mounting electrode and the conductive member being parts of the upper main surface of the substrate, the conductive member includes a right conductive member in contact with the right support portion, and the mounting electrode includes a right mounting electrode fixed to the right support portion by the right conductive member.

9. The module according to claim 8, wherein when the right support portion includes the right support foremost portion, an area of a portion where the right conductive member is in contact with a back main surface of the right support portion is larger than an area of a portion where the right conductive member is in contact with a front main surface of the right support portion, and when the right support portion includes the right support rearmost portion, an area of a portion where the right conductive member is in contact with the front main surface of the right support portion is larger than an area of a portion where the right conductive member is in contact with the back main surface of the right support portion.

10. The module according to claim 8, wherein when the right support portion includes the right support foremost portion, an area of a portion where the right conductive member is in contact with a front main surface of the right support portion is larger than an area of a portion where the right conductive member is in contact with the back main surface of the right support portion, and when the right support portion includes the right support rearmost portion, an area of a portion where the right conductive member is in contact with the back main surface of the right support portion is larger than an area of a portion where the right conductive member is in contact with the front main surface of the right support portion.

11. The module according to claim 1, wherein the metal member further includes a left support portion, a boundary between the plate-shaped portion and the left support portion is defined as a left boundary, the left boundary is located on a left part of the metal member, the left support portion includes a left support foremost portion located at a foremost of the left support portion and located in front of the plate-shaped portion, or a left support rearmost portion located at a rearmost of the left support portion and located behind the plate-shaped portion, when the left support portion includes the left support foremost portion, the left support portion bends in a forward direction from the left boundary, when the left support portion includes the left support foremost portion, the left support portion bends in a backward direction and a left direction from the left support foremost portion, when the left support portion includes the left support rearmost portion, the left support portion bends in a backward direction from the left boundary, when the left support portion includes the left support rearmost portion, the left support portion bends in a forward direction and a left direction from the left support rearmost portion, when viewed in the up-down direction, a line connecting a lower end of the left support portion in the left-right direction is defined as a left lower side, and the left support portion is provided with a first left lower notch extending in an upward direction from the left lower side, the first left lower notch overlapping the left support foremost portion or the left support rearmost portion when viewed in the up-down direction.

* * * * *